(12) United States Patent
Hsu et al.

(10) Patent No.: US 11,848,554 B2
(45) Date of Patent: Dec. 19, 2023

(54) ELECTROSTATIC DISCHARGE CIRCUIT AND METHOD OF OPERATING SAME

(71) Applicant: TAIWAN SEMICONDUCTOR MANUFACTURING COMPANY, LTD., Hsinchu (TW)

(72) Inventors: Chia-Lin Hsu, Hsinchu (TW); Ming-Fu Tsai, Hsinchu (TW); Yu-Ti Su, Hsinchu (TW); Kuo-Ji Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/452,281

(22) Filed: Oct. 26, 2021

(65) Prior Publication Data

US 2022/0344929 A1 Oct. 27, 2022

Related U.S. Application Data

(60) Provisional application No. 63/177,629, filed on Apr. 21, 2021.

(51) Int. Cl.
*H02H 9/04* (2006.01)
*H01L 27/02* (2006.01)
*H02H 1/00* (2006.01)

(52) U.S. Cl.
CPC ........ *H02H 9/046* (2013.01); *H01L 27/0255* (2013.01); *H01L 27/0259* (2013.01);
(Continued)

(58) Field of Classification Search
CPC ............... H02H 9/046; H02H 1/0007; H01L 27/0255; H01L 27/0259; H01L 27/0266; H01L 27/0288; H01L 27/0285
(Continued)

(56) References Cited

U.S. PATENT DOCUMENTS

| 5,838,146 | A | * | 11/1998 | Singer | ............... | H02H 9/046 |
| | | | | | | 323/270 |
| 6,690,561 | B2 | * | 2/2004 | Hung | ............... | H02H 9/046 |
| | | | | | | 361/111 |
| 9,036,312 | B2 | * | 5/2015 | Kato | ............... | H02H 3/08 |
| | | | | | | 361/111 |

(Continued)

FOREIGN PATENT DOCUMENTS

| CN | 103001206 | 3/2013 |
| CN | 105098743 | 11/2015 |

(Continued)

*Primary Examiner* — Dharti H Patel
(74) *Attorney, Agent, or Firm* — Hauptman Ham, LLP

(57) ABSTRACT

An electrostatic discharge (ESD) circuit includes an ESD detection circuit, a clamp circuit and an ESD assist circuit. The ESD detection circuit is coupled between a first and a second node. The first node has a first voltage. The second node has a second voltage. The clamp circuit includes a first transistor having a first gate, a first drain, a first source and a first body terminal. The first gate is coupled to at least the ESD detection circuit by a third node. The first drain is coupled to the second node. The first source and the first body terminal are coupled together at the first node. The ESD assist circuit is coupled between the first node and the third node, and is configured to clamp a third voltage of the third node at the first voltage during an ESD event at the first node or the second node.

20 Claims, 29 Drawing Sheets

(52) U.S. Cl.
CPC ....... *H01L 27/0266* (2013.01); *H02H 1/0007* (2013.01); *H01L 27/0288* (2013.01)

(58) Field of Classification Search
USPC .......................................... 361/56
See application file for complete search history.

(56) References Cited

U.S. PATENT DOCUMENTS

| | | | | |
|---|---|---|---|---|
| 10,033,177 B2* | 7/2018 | Kato | ....................... | H02H 9/041 |
| 11,557,895 B2* | 1/2023 | Fan | ....................... | H02H 9/046 |
| 2009/0021872 A1* | 1/2009 | Ker | ....................... | H01L 27/0266 |
| | | | | 361/56 |
| 2009/0086392 A1* | 4/2009 | Ker | ....................... | H02H 9/046 |
| | | | | 361/56 |
| 2010/0232078 A1* | 9/2010 | Bhattacharya | ...... | H01L 27/0266 |
| | | | | 361/56 |
| 2013/0235498 A1* | 9/2013 | Lai | ....................... | H01L 27/0292 |
| | | | | 361/56 |
| 2014/0268448 A1* | 9/2014 | Tseng | .................. | H01L 25/0657 |
| | | | | 438/109 |
| 2015/0085406 A1* | 3/2015 | Chen | ..................... | H02H 9/046 |
| | | | | 361/55 |
| 2015/0318275 A1* | 11/2015 | Chen | ................... | H01L 27/0285 |
| | | | | 361/56 |
| 2016/0204598 A1* | 7/2016 | Wang | .................. | H01L 27/0255 |
| | | | | 361/56 |
| 2018/0287378 A1 | 10/2018 | Sithanandam | | |
| 2021/0013714 A1* | 1/2021 | Huang | .................. | H02H 9/046 |
| 2021/0305809 A1* | 9/2021 | Hung | .................. | H01L 27/0285 |
| 2022/0352710 A1* | 11/2022 | Syu | ................... | H01L 27/027 |
| 2022/0384421 A1* | 12/2022 | Hung | .................... | H01L 23/60 |

FOREIGN PATENT DOCUMENTS

| | | |
|---|---|---|
| CN | 106876380 | 6/2017 |
| CN | 111697549 | 9/2020 |
| JP | 2011045157 | 3/2011 |
| TW | 201347337 | 11/2013 |

* cited by examiner

ELECTROSTATIC DISCHARGE CIRCUIT AND METHOD OF OPERATING SAME

PRIORITY CLAIM AND CROSS-REFERENCE

This application claims the benefit of U.S. Provisional Application No. 63/177,629, filed Apr. 21, 2021, which is herein incorporated by reference in its entirety.

BACKGROUND

The recent trend in miniaturizing integrated circuits (ICs) has resulted in smaller devices which consume less power, yet provide more functionality at higher speeds than before. The miniaturization process has also increased the devices' susceptibility to electrostatic discharge (ESD) events due to various factors, such as thinner dielectric thicknesses and associated lowered dielectric breakdown voltages. ESD is one of the causes of electronic circuit damage and is also one of the considerations in semiconductor advanced technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
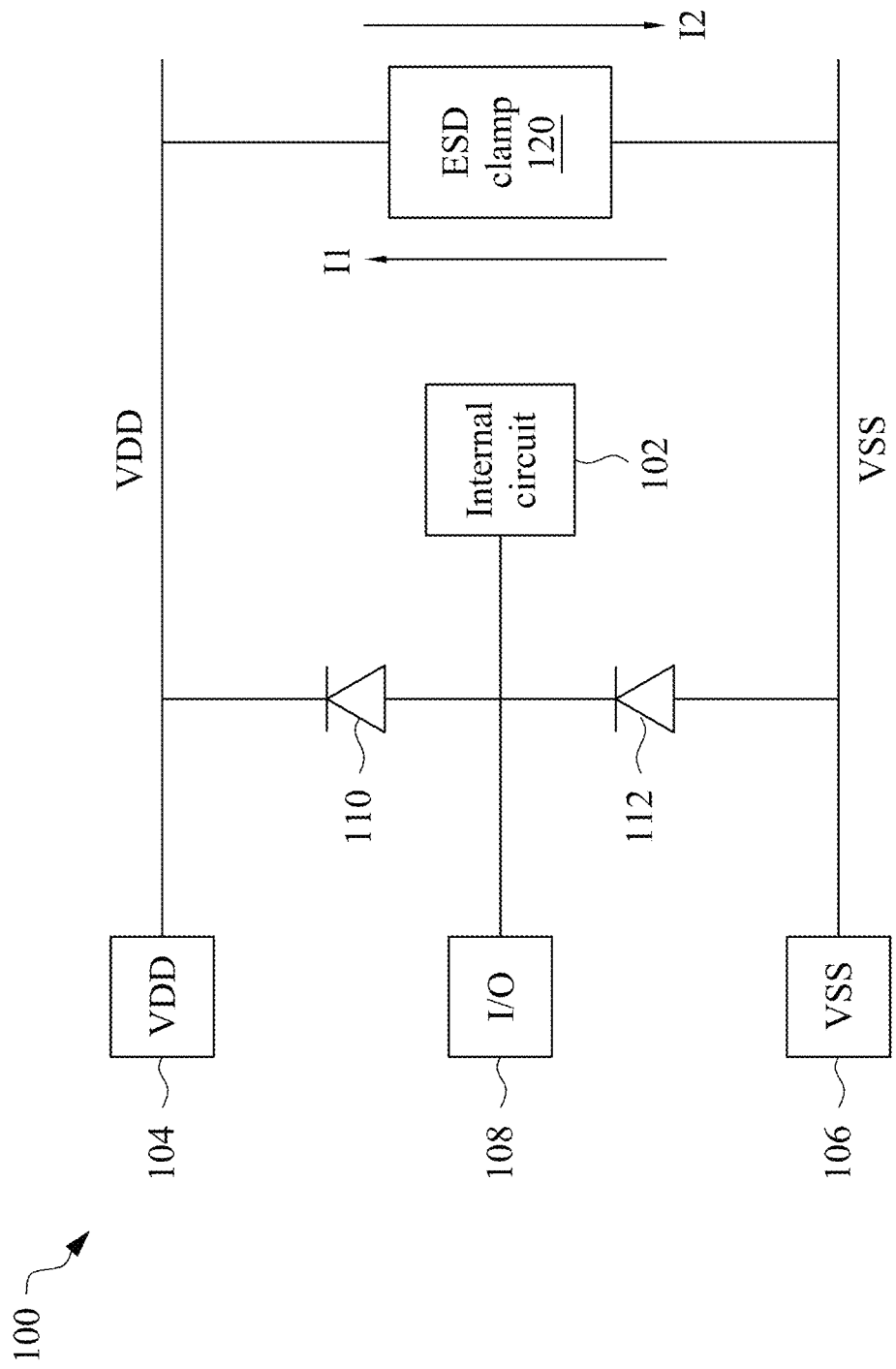
FIG. 1 is a schematic block diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an electrostatic discharge (ESD) circuit includes an ESD detection circuit coupled between a first node and a second node. In some embodiments, the first node has a first voltage, and the second node has a second voltage.

In some embodiments, the ESD circuit further includes a clamp circuit that includes a first transistor of a first type. The first transistor has a first gate, a first drain, a first source and a first body terminal. The first gate is coupled to at least the ESD detection circuit by a third node. The first drain is coupled to the second node. The first source and the first body terminal are coupled together at the first node.

The ESD circuit further includes an ESD assist circuit that is coupled between the first node and the third node. During an ESD event at the first node or the second node of the present disclosure, the ESD assist circuit is configured to clamp a third voltage of the third node at the first voltage thereby controlling a gate potential of the first transistor and causing the first transistor to turn-on. In response to turning on, the first transistor is configured to discharge an ESD current of the ESD event in a forward ESD direction from the second node to the first node, in accordance with some embodiments.

In some embodiments, by including the ESD assist circuit in the integrated circuit of the present disclosure, the ESD assist circuit is configured to reduce capacitive coupling effects between the first node and the second node and effectively lowers the turn-on resistance of the first transistor. In some embodiments, by lowering the turn-on resistance of the first transistor causing the first transistor to turn-on faster and stronger than other approaches results in improved ESD performance and improved ESD robustness compared to other approaches.

FIG. 1 is a schematic block diagram of an integrated circuit 100, in accordance with some embodiments.

Integrated circuit 100 comprises an internal circuit 102, a voltage supply node 104, a reference voltage supply node 106, an input/output (IO) pad 108, a diode 110, a diode 112 and an ESD clamp 120. In some embodiments, at least integrated circuit 100, 200A-200E (FIGS. 2A-2E), 300A-300E (FIGS. 3A-3E), 400A-400E (FIGS. 4A-4E), 500A-500E (FIGS. 5A-5E), 600A-600B (FIGS. 6A-6B), 700A-700B (FIGS. 7A-7B) or 800A-800B (FIGS. 8A-8B) is incorporated on a single integrated circuit (IC), or on a single semiconductor substrate. In some embodiments, at least integrated circuit 100, 200A-200E (FIGS. 2A-2E), 300A-300E (FIGS. 3A-3E), 400A-400E (FIGS. 4A-4E), 500A-500E (FIGS. 5A-5E), 600A-600B (FIGS. 6A-6B), 700A-700B (FIGS. 7A-7B) or 800A-800B (FIGS. 8A-8B) includes one or more ICs incorporated on one or more single semiconductor substrate.

Internal circuit 102 is coupled to the IO pad 108, diode 110 and diode 112. Internal circuit 102 is configured to receive an IO signal from IO pad 108. In some embodiments, internal circuit 102 is coupled to voltage supply node 104 (e.g., VDD) and reference voltage supply node 106 (e.g., VSS). In some embodiments, internal circuit 102 is configured to receive a supply voltage VDD from voltage supply node 104 (e.g., VDD), and a reference voltage VSS from reference voltage supply node 106 (e.g., VSS).

Internal circuit 102 includes circuitry configured to generate or process the IO signal received by or output to IO pad 108. In some embodiments, internal circuit 102 comprises core circuitry configured to operate at a voltage lower than supply voltage VDD of voltage supply node 104. In some embodiments, internal circuit 102 includes at least one n-type or p-type transistor device. In some embodiments, internal circuit 102 includes at least a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, internal circuit 102 includes at least a memory cell. In some embodiments, the memory cell includes a static random access memory (SRAM), a dynamic RAM (DRAM), a resistive RAM (RRAM), a magnetoresistive RAM (MRAM) or read only memory (ROM). In some embodiments, internal circuit 102 includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like), FinFETs, and planar MOS transistors with raised source/drain. Examples of passive elements include, but are not limited to, capacitors, inductors, fuses, and resistors.

Voltage supply node 104 is coupled to diode 110 and ESD clamp 120. Reference voltage supply node 106 is coupled to diode 112 and ESD clamp 120. Voltage supply node 104 is configured to receive supply voltage VDD for normal operation of internal circuit 102. Similarly, reference voltage supply node 106 is configured to receive reference supply voltage VSS for normal operation of internal circuit 102. In some embodiments, at least voltage supply node 104 is a voltage supply pad. In some embodiments, at least reference voltage supply node 106 is a reference voltage supply pad. In some embodiments, a pad is at least a conductive surface, a pin, a node or a bus. Voltage supply node 104 or reference voltage supply node 106 is also referred to as a power supply voltage bus or rail. In the example configuration in FIG. 1, 2A-2E, 3A-3E, 4A-4E, 5A-5E, 6A-6B, 7A-7B or 8A-8B supply voltage VDD is a positive supply voltage, voltage supply node 104 is a positive power supply voltage, reference supply voltage VSS is a ground supply voltage, and reference voltage supply node 106 is a ground voltage terminal. Other power supply arrangements are within the scope of the present disclosure.

IO pad 108 is coupled to internal circuit 102. IO pad 108 is configured to receive IO signal from internal circuit 102 or configured to output IO signal to internal circuit 102. IO pad 108 is at least a pin that is coupled to internal circuit 102. In some embodiments, IO pad 108 is a node, a bus or a conductive surface that is coupled to internal circuit 102.

Diode 110 is coupled between voltage supply node 104 and IO pad 108. An anode of diode 110 is coupled to internal circuit 102, IO pad 108 and a cathode of diode 112. A cathode of diode 110 is coupled to voltage supply node 104 and ESD clamp 120. In some embodiments, diode 110 is a pull-up diode or referred to as a p+ diode. For example, in these embodiments, the p+-diode is formed between a p-well region (not shown) and an n-well region (not shown), and the n-well region is connected to VDD.

Diode 112 is coupled between reference voltage supply node 106 and IO pad 108. An anode of diode 112 is coupled to reference voltage supply node 106 and ESD clamp 120. A cathode of diode 112 is coupled to internal circuit 102, IO pad 108 and the anode of diode 110. In some embodiments, diode 112 is a pull-down diode or referred to as an n+ diode. For example, in these embodiments, the n+-diode is formed between an n+ junction (not shown) and a p-substrate (not shown), and the P-substrate is connected to ground or VSS.

Diodes 110 and 112 are configured to have a minimal impact on the normal behavior (e.g., no ESD conditions or events) of internal circuit 102 or integrated circuit 100. In some embodiments, an ESD event occurs when an ESD voltage or current higher than a level of voltage or current expected during the normal operation of internal circuit 102 is applied to at least voltage supply node 104, reference voltage supply node 106 or IO pad 108.

When no ESD events occur, diodes 110 and 112 do not affect the operation of integrated circuit 100. During an ESD event, diode 110 is configured to transfer voltage or current between voltage supply node 104 and IO pad 108 dependent upon whether diode 110 is forward biased or reverse biased, and the voltage levels of the voltage supply node 104 and IO pad 108.

For example, during a Positive-to-VDD (PD) mode of ESD stress or event, diode 110 is forward biased and is configured to transfer voltage or current from IO pad 108 to voltage supply node 104. In PD-mode, a positive ESD stress or ESD voltage (at least greater than supply voltage VDD) is applied to IO pad 108, while voltage supply node 104 (e.g., VDD) is ground and reference voltage supply node 106 (e.g., VSS) is floating.

For example, during a Negative-to-VDD (ND) mode of ESD stress or event, diode 110 is reverse biased and is configured to transfer voltage or current from voltage supply node 104 to IO pad 108. In ND-mode, a negative ESD stress is received by IO pad 108, while the voltage supply node 104 (e.g., VDD) is ground and reference voltage supply node 106 (e.g., VSS) is floating.

During an ESD event, diode 112 is configured to transfer voltage or current between reference voltage supply node 106 and IO pad 108 dependent upon whether diode 112 is forward biased or reverse biased, and the voltage levels of the reference voltage supply node 106 and IO pad 108.

For example, during a Positive-to-VSS (PS) mode of ESD stress or event, diode 112 is reverse biased and is configured to transfer voltage or current from IO pad 108 to reference voltage supply node 106. In PS-mode, a positive ESD stress or ESD voltage (at least greater than reference supply voltage VSS) is applied to IO pad 108, while voltage supply node 104 (e.g., VDD) is floating and reference voltage supply node 106 (e.g., VSS) is ground.

For example, during a Negative-to-VSS (NS) mode of ESD stress or event, diode 112 is forward biased and is configured to transfer voltage or current from reference voltage supply node 106 to IO pad 108. In NS-mode, a negative ESD stress is received by IO pad 108, while the voltage supply node 104 (e.g., VDD) is floating and reference voltage supply node 106 (e.g., VSS) is ground.

Other types of diodes, configurations and arrangements of at least diode 110 or 112 are within the scope of the present disclosure.

ESD clamp 120 is coupled between voltage supply node 104 (e.g., supply voltage VDD) and reference voltage supply node 106 (e.g., VSS). When no ESD event occurs, ESD clamp 120 is turned off. For example, when no ESD event occurs, ESD clamp 120 is turned off, and is therefore a nonconductive device or circuit during the normal operation of internal circuit 102. In other words, ESD clamp 120 is turned off or is non-conductive in the absence of an ESD event.

If an ESD event occurs, ESD clamp 120 is configured to sense the ESD event, and is configured to turn on and provide a current shunt path between voltage supply node 104 (e.g., supply voltage VDD) and reference voltage supply node 106 (e.g., VSS) to thereby discharge the ESD current. For example, when an ESD event occurs, the voltage difference across the ESD clamp 120 is equal to or greater than a threshold voltage of ESD clamp 120, and ESD clamp 120 is turned ON thereby conducting current between voltage supply node 104 (e.g., VDD) and reference voltage supply node 106 (e.g., VSS).

During an ESD event, ESD clamp 120 is configured to turn on and discharge an ESD current (I1 or I2) in a forward ESD direction (e.g., current I1) or a reverse ESD direction (e.g., current I2). The forward ESD direction (e.g., current I1) is from the reference voltage supply node 106 (e.g., VSS) to the voltage supply node 104 (e.g., VDD). The reverse ESD direction (e.g., current I2) is from voltage supply node 104 (e.g., VDD) to reference voltage supply node 106 (e.g., VSS).

During a positive ESD surge on reference voltage supply node 106, ESD clamp 120 is configured to turn on and discharge the ESD current I1 in a forward ESD direction from the reference voltage supply node 106 (e.g., VSS) to the voltage supply node 104 (e.g., VDD). In some embodiments, ESD clamp 120 is configured to turn on, after a PS mode (described above) of ESD, and discharge the ESD current I1 in the forward ESD direction from the reference voltage supply node 106 (e.g., VSS) to the voltage supply node 104 (e.g., VDD).

During a positive ESD surge on voltage supply node 104, ESD clamp 120 is configured to turn on and discharge the ESD current I2 in a reverse ESD direction from voltage supply node 104 (e.g., VDD) to reference voltage supply node 106 (e.g., VSS). In some embodiments, ESD clamp 120 is configured to turn on, after a PD mode (described above) of ESD, and discharge the ESD current I2 in the reverse ESD direction from voltage supply node 104 (e.g., VDD) to reference voltage supply node 106 (e.g., VSS).

In some embodiments, ESD clamp 120 is a transient clamp. For example, in some embodiments, ESD clamp 120 is configured to handle transient or rapid ESD events, e.g., rapid changes in voltage and/or current from the ESD event. During the transient or rapid ESD, the ESD clamp 120 is configured to turn on very quickly to provide a shunt path between voltage supply node 104 (e.g., supply voltage VDD) and reference voltage supply node 106 (e.g., VSS) before the ESD event can cause damage to one or more elements within integrated circuit 100. In some embodiments, ESD clamp 120 is configured to turn off slower than it turns on.

In some embodiments, ESD clamp 120 is a static clamp. In some embodiments, static clamps are configured to provide a static or steady-state voltage and current response. For example, static clamps are turned-on by a fixed voltage level.

In some embodiments, ESD clamp 120 includes a large NMOS transistor or PMOS transistor configured to carry the ESD current without entering the avalanche breakdown region of the ESD clamp 120. In some embodiments, ESD clamp 120 is implemented without having avalanching junctions inside ESD clamp 120, and is also known as a "non-snapback protection scheme."

Other types of clamp circuits, configurations and arrangements of ESD clamp 120 are within the scope of the present disclosure.

Other configurations or quantities of circuits in integrated circuit 100 are within the scope of the present disclosure.

In some embodiments, during an ESD event at the first node or the second node, the ESD clamp 120 is configured to discharge an ESD current of the ESD event in the forward ESD direction from the second node to the first node, in accordance with some embodiments. In comparison with other approaches in the forward ESD direction, integrated circuit 100 has better ESD discharging capability and performance while occupying less area.

Figure 2A:
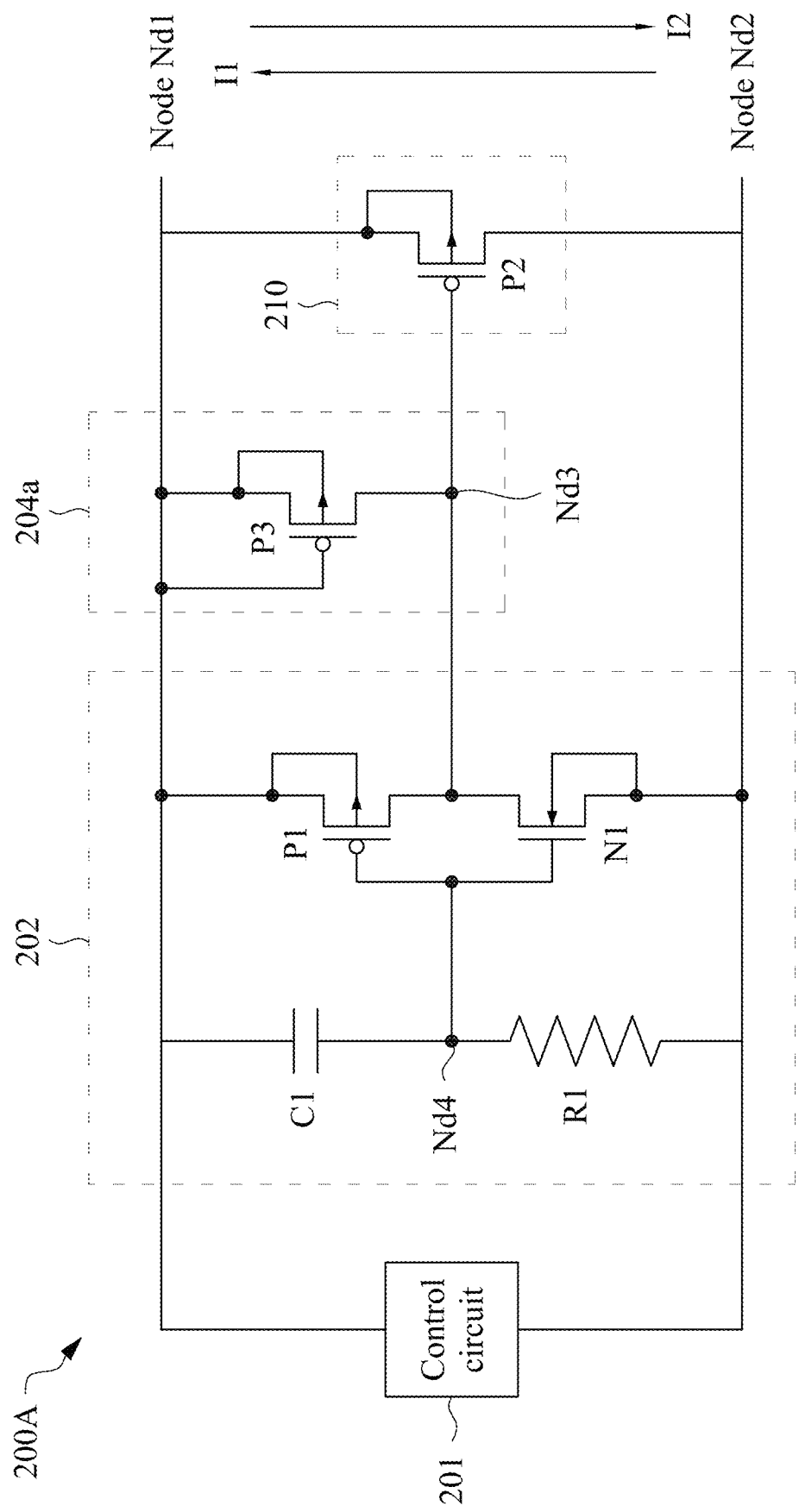
FIGS. 2A-2E are corresponding circuit diagrams of corresponding integrated circuits, in accordance with some embodiments.

FIG. 2A is a circuit diagram of an integrated circuit 200A, in accordance with some embodiments.

Integrated circuit 200A is an embodiment of ESD clamp 120, and similar detailed description is therefore omitted.

Components that are the same or similar to those in one or more of FIGS. 1, 2A-2E, 3A-3E, 4A-4E, 5A-5E, 6A-6B, 7A-7B and 8A-8B (shown below) are given the same reference numbers, and detailed description thereof is thus omitted.

Node Nd1 in FIGS. 2A-2E, 3A-3E, 4A-4E, 5A-5E, 6A-6B, 7A-7B and 8A-8B corresponds to voltage supply node 104 of FIG. 1. Node Nd2 of FIGS. 2A-2E, 3A-3E, 4A-4E, 5A-5E, 6A-6B, 7A-7B and 8A-8B corresponds to reference voltage supply node 106 of FIG. 1.

Integrated circuit 200A includes a control circuit 201, an ESD detection circuit 202, an ESD assist circuit 204a and a discharging circuit 210.

Control circuit 201 is coupled to ESD detection circuit 202, ESD assist circuit 204a, and discharging circuit 210 by nodes Nd1 and Nd2. Control circuit 201 is further coupled between node Nd1 and node Nd2. Control circuit 201 is configured to control at least ESD detection circuit 202.

ESD detection circuit 202 is coupled to control circuit 201, ESD assist circuit 204a, discharging circuit 210 and a node Nd3. ESD detection circuit 202 is further coupled between node Nd1 and node Nd2. ESD detection circuit 202 is configured to detect an ESD event at node Nd2 (e.g., ESD current I1 in the forward ESD direction), and to charge node Nd3 in response to the ESD event, thereby turning on discharging circuit 210. In some embodiments, in response to being turned on, discharging circuit 210 couples node Nd1 and Nd2 thereby providing an ESD discharge path between node Nd1 and Nd2. In some embodiments, ESD detection circuit 202 is configured to detect an ESD event at node Nd1 (e.g., ESD current I2 in the reverse ESD direction).

ESD assist circuit 204a is coupled to node Nd1, node Nd3, ESD detection circuit 202 and discharging circuit 210. In response to an ESD event at node Nd2 (e.g., an ESD current I1 in the forward ESD direction), ESD assist circuit 204a is configured to turn-on and clamp a voltage at node Nd3 to be equal to a voltage of node Nd1 (e.g., VDD) thereby assisting the detection circuit 204 in causing the discharging circuit 210 to turn-on. In some embodiments, in response to being turned on, discharging circuit 210 couples node Nd2 and Nd1 thereby providing a forward ESD discharge path between node Nd2 and Nd1.

Discharging circuit 210 is coupled between node Nd1 and node Nd2. Discharging circuit 210 is further coupled to node Nd3, ESD detection circuit 202 and ESD assist circuit 204a. Discharging circuit 210 is configured to couple node Nd1 and Nd2 during an ESD event at node Nd1 or node Nd2, thereby providing an ESD discharge path between node Nd1 and Nd2.

ESD detection circuit 202 includes a resistor R1, a capacitor C1, an N-type Metal Oxide Semiconductor (NMOS) transistor N1 and a P-type Metal Oxide Semiconductor (PMOS) transistor P1.

Discharging circuit 210 includes a PMOS transistor P2. PMOS transistor P2 includes a gate, a drain and a source (not labelled).

ESD assist circuit 204a includes a PMOS transistor P3. In some embodiments, PMOS transistor P3 is a grounded gate PMOS (ggPMOS) transistor. PMOS transistor P3 includes a gate, a drain and a source (not labelled).

Each of a first end of resistor R1, node Nd2, a source of NMOS transistor N1, a body of NMOS transistor N1 and a drain of PMOS transistor P2 are coupled together.

Each of a second end of resistor R1, node Nd4, a first end of capacitor C1, a gate of PMOS transistor P1, and a gate of NMOS transistor N2 are coupled together.

Each of a second end of capacitor C1, node Nd1, a source of PMOS transistor P1, a body of PMOS transistor P1, a source of PMOS transistor P2, a body of PMOS transistor P2, a source of PMOS transistor P3, a gate of PMOS transistor P3, and a body of PMOS transistor P3 are coupled together.

Each of a node Nd3, a drain of NMOS transistor N1, a drain of PMOS transistor P1, a source of PMOS transistor P3 and a gate of PMOS transistor P2 are coupled together.

In some embodiments, capacitor C1 is a transistor-coupled capacitor. For example in some embodiments, capacitor C1 is a transistor having a drain and source coupled together thereby forming a transistor-coupled capacitor.

Resistor R1 and capacitor C1 are configured as an RC network. Depending upon a location of an output of the RC network, the RC network is configured as either a low pass filter or a high pass filter.

NMOS transistor N1 and PMOS transistor P1 are configured as an inverter (not labelled). Thus, a slowly rising voltage at node Nd4 will be inverted by NMOS transistor N1 and PMOS transistor P1 (e.g., an inverter) thereby causing node Nd3 to rapidly rise. Furthermore, a rapidly rising voltage at node Nd4 will be inverted by NMOS transistor N1 and PMOS transistor P1 (e.g., an inverter) thereby causing node Nd3 to rise slowly. In some embodiments, NMOS transistor N1 and PMOS transistor P1 are configured to generate an inverted input signal (not shown) in response to an input signal (not shown).

When an ESD event at node Nd2 occurs (e.g., ESD current I1 in the forward ESD direction), the ESD current or voltage at node Nd2 rises rapidly causing the voltage of node Nd4 (e.g., across resistor R1) to rise rapidly since the voltage at node Nd4 corresponds to an output voltage of a high pass filter (e.g., a voltage across resistor R1 with respect to node Nd2). In other words, resistor R1 is configured as a high pass filter, and the rapidly changing voltage or current from the ESD event is not filtered or is passed by resistor R1. In response to the rapidly rising voltage at node Nd4, PMOS transistor P1 and NMOS transistor N1 are configured as an inverter thereby inverting the voltage of node Nd4 to the voltage of node Nd3, and the voltage of Nd3 is rapidly falling. Stated differently, the voltage of node Nd3 is inverted from the voltage of node Nd4. In some embodiments, in response to the voltage at node Nd4, PMOS transistor P3 turns on, and is configured to clamp a voltage at node Nd3 to be equal to a voltage of node Nd1 (e.g., VDD) thereby assisting the ESD detection circuit 202 in causing the PMOS transistor P2 to turn-on. In response to being turned on, PMOS transistor P2 couples node Nd2 to node Nd1 and NMOS transistor N2 discharges the ESD current I1 in the forward ESD direction from node Nd2 to Nd1.

In some embodiments, by including ESD assist circuit 204a in integrated circuit 200A, the PMOS transistor P3 of ESD assist circuit 204a is configured to control the gate potential of PMOS transistor P2 by clamping the voltage of node Nd3 to be equal to the voltage of node Nd1 (e.g., VDD) during an ESD event at node Nd2 thereby reducing capacitive coupling effects between node Nd2 and Nd3 and effectively lowering the turn-on resistance of PMOS transistor P2, and thus causing the PMOS transistor P2 to turn-on faster and stronger than other approaches resulting in improved ESD performance and improved ESD robustness compared to other approaches.

In some embodiments, in response to an ESD event at node Nd2 (e.g., an ESD current I1 in the forward ESD direction), a body diode of the PMOS transistor P3 is configured to provide ESD protection of integrated circuit 200A by clamping the voltage of node Nd3. In some embodiments, a body diode of the PMOS transistor P2 is configured to provide ESD protection of integrated circuit 200A by passing the ESD current I1 in the forward ESD direction from node Nd2 to node Nd1.

In some embodiments, ESD assist circuit 204a has a minimal effect on an ESD event at node Nd1. For example, in some embodiments, when an ESD event at node Nd1 occurs, PMOS transistor P3 is turned off.

Other types of circuits, configurations and arrangements of at least ESD detection circuit 202, ESD assist circuit 204a or discharging circuit 210 are within the scope of the present disclosure.

Other configurations or quantities of circuits in integrated circuit 200A are within the scope of the present disclosure.

Figure 2B:
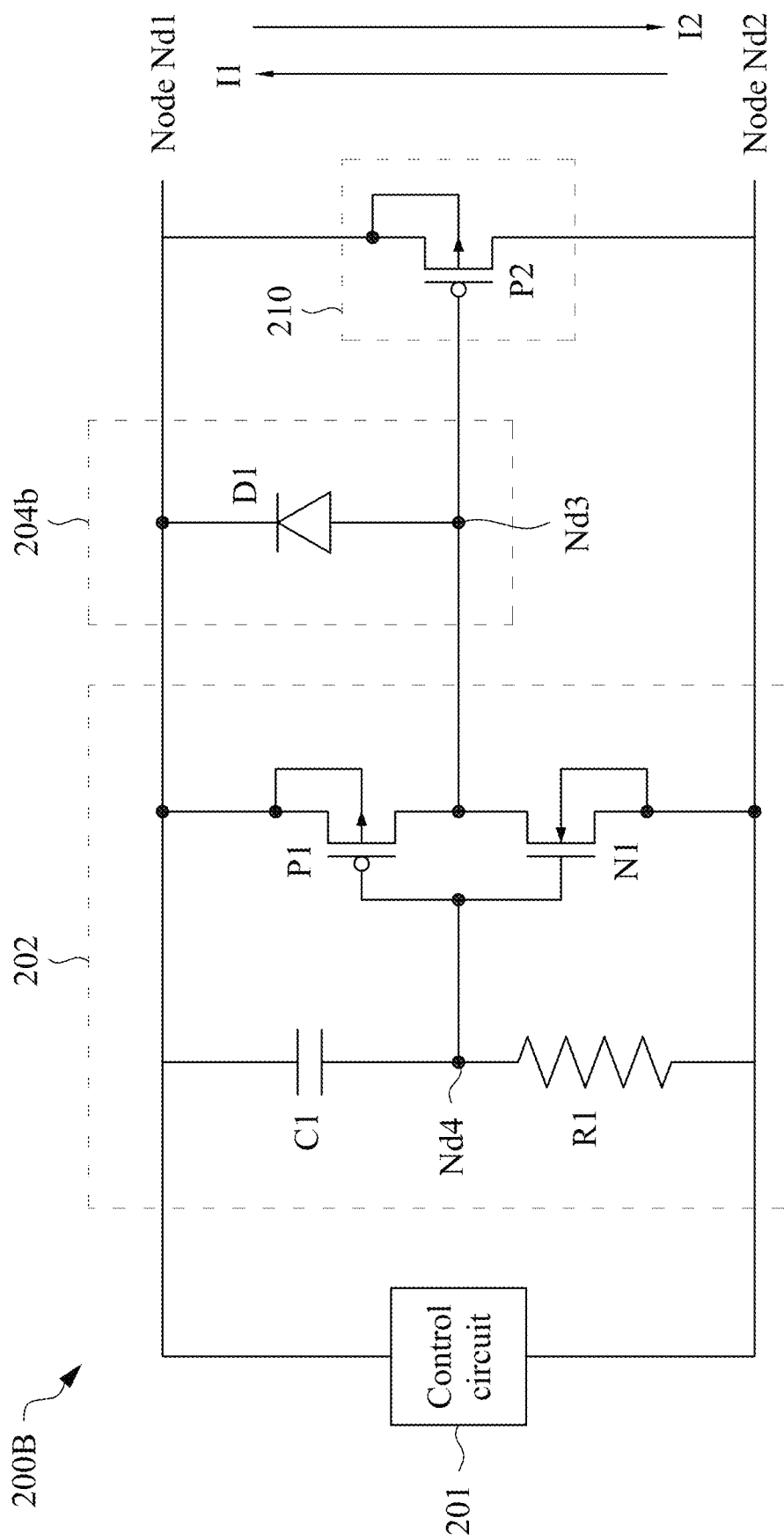

FIG. 2B is a circuit diagram of an integrated circuit 200B, in accordance with some embodiments.

Integrated circuit 200B is an embodiment of at least ESD clamp 120, and similar detailed description is therefore omitted.

Integrated circuit 200B is a variation of integrated circuit 200A of FIG. 2A, and similar detailed description is therefore omitted. In comparison with integrated circuit 200A, ESD assist circuit 204b of integrated circuit 200B replaces ESD assist circuit 204a of integrated circuit 200A, and similar detailed description is therefore omitted.

Integrated circuit 200B includes control circuit 201, ESD detection circuit 202, ESD assist circuit 204b and discharging circuit 210.

ESD assist circuit 204b is a variation of ESD assist circuit 204a of FIG. 2A, and similar detailed description is therefore omitted. In comparison with ESD assist circuit 204a, a diode D1 of ESD assist circuit 204b replaces PMOS transistor P3 of ESD assist circuit 204a, and similar detailed description is therefore omitted.

ESD assist circuit 204b includes diode D1. Diode D1 includes an anode and a cathode (not labelled).

In comparison with ESD assist circuit 204a of FIG. 2A, each of the anode of diode D1, node Nd3, a drain of NMOS transistor N1, a drain of PMOS transistor P1 and a gate of PMOS transistor P2 are coupled together.

In comparison with ESD assist circuit 204a of FIG. 2A, each of the cathode of diode D1, the second end of capacitor C1, node Nd1, the source of PMOS transistor P1, the body of PMOS transistor P1, the source of PMOS transistor P2 and the body of PMOS transistor P2 are coupled together.

The description for when an ESD event occurs at node Nd2 (e.g., ESD current I1 in the forward ESD direction) with ESD assist circuit 204b for FIG. 2B is similar to the description of when an ESD event occurs at node Nd2 for ESD assist circuit 204a of FIG. 2A, and similar detailed description is therefore omitted for brevity. In some embodiments, in response to an ESD event at node Nd2 (e.g., an ESD current I1 in the forward ESD direction), diode D1 is configured to be forward-biased and thereby clamps the voltage at node Nd3 to be equal to a voltage of node Nd1 (e.g., VDD) thereby assisting the ESD detection circuit 202 in causing the PMOS transistor P2 to turn-on. In response to being turned on, PMOS transistor P2 couples node Nd2 to node Nd1 and PMOS transistor P2 discharges the ESD current I1 in the forward ESD direction from node Nd2 to Nd1.

In some embodiments, by including ESD assist circuit 204b in integrated circuit 200B, integrated circuit 200B achieves one or more of the benefits discussed above in at least FIG. 1 or FIG. 2A.

Other types of circuits, configurations and arrangements of at least ESD detection circuit 202, ESD assist circuit 204b or discharging circuit 210 are within the scope of the present disclosure.

Other configurations or quantities of circuits in integrated circuit 200B are within the scope of the present disclosure.

Figure 2C:
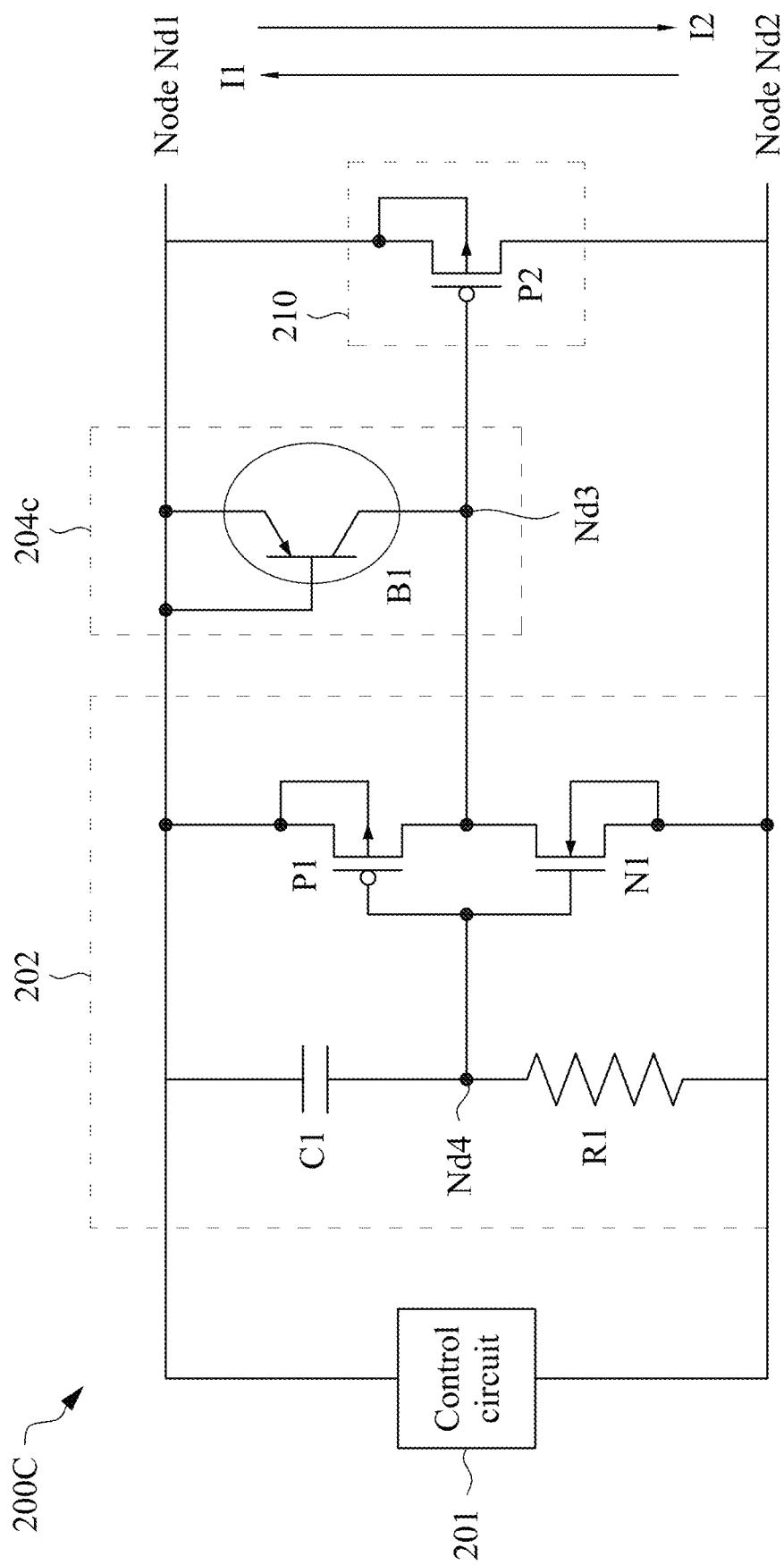

FIG. 2C is a circuit diagram of an integrated circuit 200C, in accordance with some embodiments.

Integrated circuit 200C is an embodiment of at least ESD clamp 120, and similar detailed description is therefore omitted.

Integrated circuit 200C is a variation of integrated circuit 200A of FIG. 2A, and similar detailed description is therefore omitted. In comparison with integrated circuit 200A, ESD assist circuit 204c of integrated circuit 200C replaces ESD assist circuit 204a of integrated circuit 200A, and similar detailed description is therefore omitted.

Integrated circuit 200C includes control circuit 201, ESD detection circuit 202, ESD assist circuit 204c and discharging circuit 210.

ESD assist circuit 204c is a variation of ESD assist circuit 204a of FIG. 2A, and similar detailed description is therefore omitted. In comparison with ESD assist circuit 204a, a transistor B1 of ESD assist circuit 204c replaces PMOS transistor P3 of ESD assist circuit 204a, and similar detailed description is therefore omitted. Transistor B1 is a PNP bipolar junction transistor (BJT).

ESD assist circuit 204c includes transistor B1. Transistor B1 includes a base, a collector and an emitter (not labelled).

In comparison with ESD assist circuit 204a of FIG. 2A, each of the collector of transistor B1, node Nd3, a drain of NMOS transistor N1, a drain of PMOS transistor P1 and a gate of PMOS transistor P2 are coupled together.

In comparison with ESD assist circuit 204a of FIG. 2A, each of the emitter of transistor B1, the base of transistor B1, the second end of capacitor C1, node Nd1, the source of PMOS transistor P1, the body of PMOS transistor P1, the source of PMOS transistor P2 and the body of PMOS transistor P2 are coupled together.

The description for when an ESD event occurs at node Nd2 (e.g., ESD current I1 in the forward ESD direction) with ESD assist circuit 204c for FIG. 2C is similar to the description of when an ESD event occurs at node Nd2 for ESD assist circuit 204a of FIG. 2A, and similar detailed description is therefore omitted for brevity. In some embodiments, in response to an ESD event at node Nd2 (e.g., an ESD current I1 in the forward ESD direction), transistor B1 turns on, and is configured to clamp a voltage at node Nd3 to be equal to a voltage of node Nd1 (e.g., VDD) thereby assisting the ESD detection circuit 202 in causing the PMOS transistor P2 to turn-on. In response to being turned on, PMOS transistor P2 couples node Nd2 to node Nd1, and PMOS transistor P2 discharges the ESD current I1 in the forward ESD direction from node Nd2 to Nd1.

In some embodiments, in response to an ESD event at node Nd2 (e.g., an ESD current I1 in the forward ESD direction), a body diode of transistor B1 is configured to provide ESD protection of integrated circuit 200C by clamping the voltage of node Nd3. In some embodiments, a body diode of PMOS transistor P2 is configured to provide ESD protection of integrated circuit 200C by passing the ESD current I1 in the forward ESD direction from node Nd2 to node Nd1.

In some embodiments, by including ESD assist circuit 204c in integrated circuit 200C, integrated circuit 200C achieves one or more of the benefits discussed above in at least FIG. 1 or FIG. 2A.

Other types of circuits, configurations and arrangements of at least ESD detection circuit 202, ESD assist circuit 204c or discharging circuit 210 are within the scope of the present disclosure.

Other configurations or quantities of circuits in integrated circuit 200C are within the scope of the present disclosure.

Figure 2D:
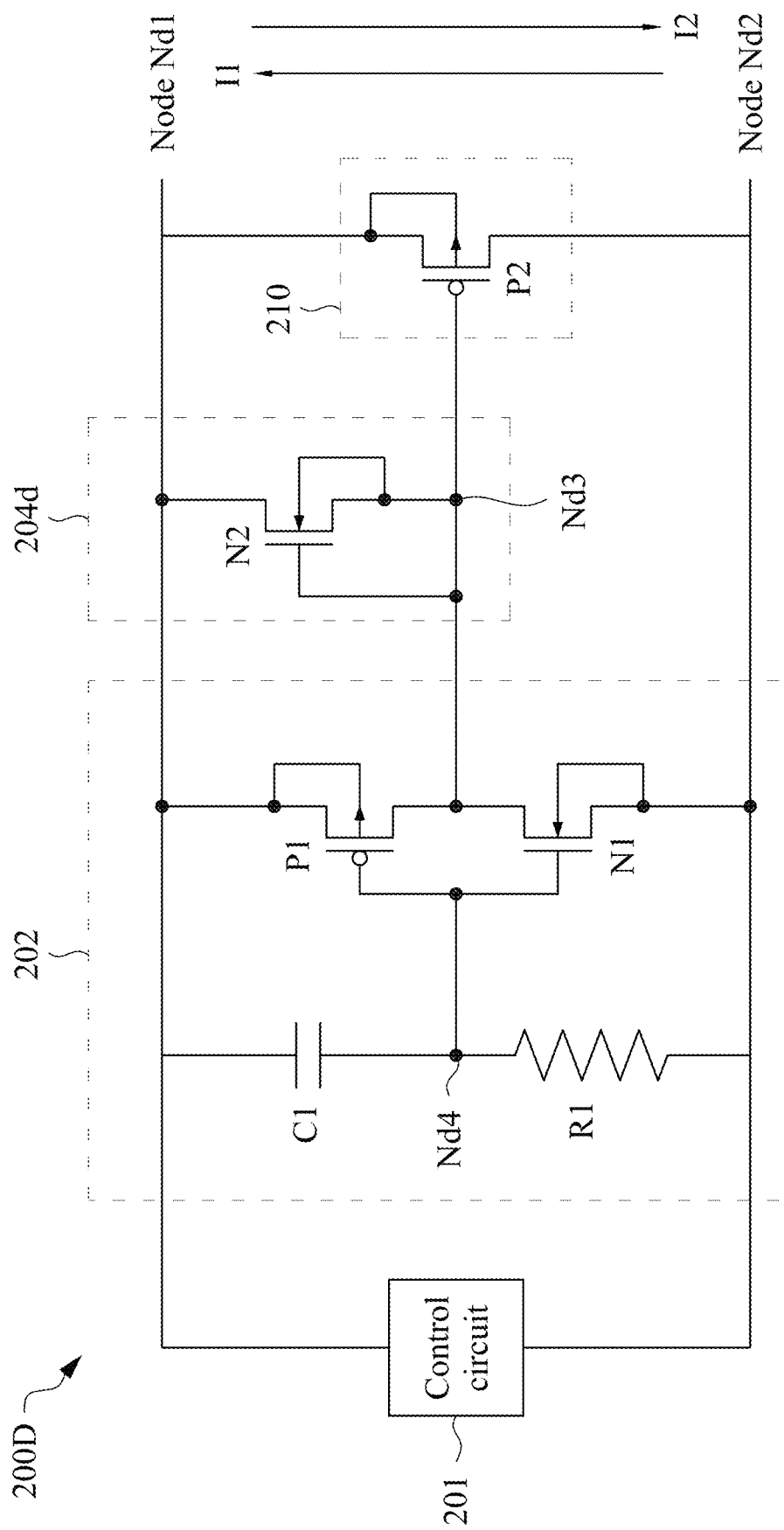

FIG. 2D is a circuit diagram of an integrated circuit 200D, in accordance with some embodiments.

Integrated circuit 200D is an embodiment of at least ESD clamp 120, and similar detailed description is therefore omitted.

Integrated circuit 200D is a variation of integrated circuit 200A of FIG. 2A, and similar detailed description is therefore omitted. In comparison with integrated circuit 200A, ESD assist circuit 204d of integrated circuit 200D replaces ESD assist circuit 204a of integrated circuit 200A, and similar detailed description is therefore omitted.

Integrated circuit 200D includes control circuit 201, ESD detection circuit 202, ESD assist circuit 204d and discharging circuit 210.

ESD assist circuit 204d is a variation of ESD assist circuit 204a of FIG. 2A, and similar detailed description is therefore omitted. In comparison with ESD assist circuit 204a, an NMOS transistor N2 of ESD assist circuit 204d replaces PMOS transistor P3 of ESD assist circuit 204a, and similar detailed description is therefore omitted.

ESD assist circuit 204d includes NMOS transistor N2. NMOS transistor N2 includes a gate, a drain, a source and a body (not labelled).

In comparison with ESD assist circuit 204a of FIG. 2A, each of the gate of NMOS transistor N2, the source of NMOS transistor N2, the body of NMOS transistor N2, node Nd3, a drain of NMOS transistor N1, a drain of PMOS transistor P1 and a gate of PMOS transistor P2 are coupled together.

In comparison with ESD assist circuit 204a of FIG. 2A, each of the drain of NMOS transistor N2, the second end of capacitor C1, node Nd1, the source of PMOS transistor P1, the body of PMOS transistor P1, the source of PMOS transistor P2 and the body of PMOS transistor P2 are coupled together.

The description for when an ESD event occurs at node Nd2 (e.g., ESD current I1 in the forward ESD direction) with ESD assist circuit 204d for FIG. 2D is similar to the description of when an ESD event occurs at node Nd2 for ESD assist circuit 204a of FIG. 2A, and similar detailed description is therefore omitted for brevity. In some embodiments, in response to an ESD event at node Nd2 (e.g., an ESD current I1 in the forward ESD direction), NMOS transistor N2 turns on, and is configured to clamp a voltage at node Nd3 to be equal to a voltage of node Nd1 (e.g., VDD) thereby assisting the ESD detection circuit 202 in causing the PMOS transistor P2 to turn-on. In response to being turned on, PMOS transistor P2 couples node Nd2 to node Nd1, and PMOS transistor P2 discharges the ESD current I1 in the forward ESD direction from node Nd2 to Nd1.

In some embodiments, in response to an ESD event at node Nd2 (e.g., an ESD current I1 in the forward ESD direction), a body diode of NMOS transistor N2 is configured to provide ESD protection of integrated circuit 200D by clamping the voltage of node Nd3. In some embodiments, a body diode of PMOS transistor P2 is configured to provide ESD protection of integrated circuit 200D by passing the ESD current I1 in the forward ESD direction from node Nd2 to node Nd1.

In some embodiments, by including ESD assist circuit 204d in integrated circuit 200D, integrated circuit 200D achieves one or more of the benefits discussed above in at least FIG. 1 or FIG. 2A.

Other types of circuits, configurations and arrangements of at least ESD detection circuit 202, ESD assist circuit 204d or discharging circuit 210 are within the scope of the present disclosure.

Other configurations or quantities of circuits in integrated circuit 200D are within the scope of the present disclosure.

Figure 2E:
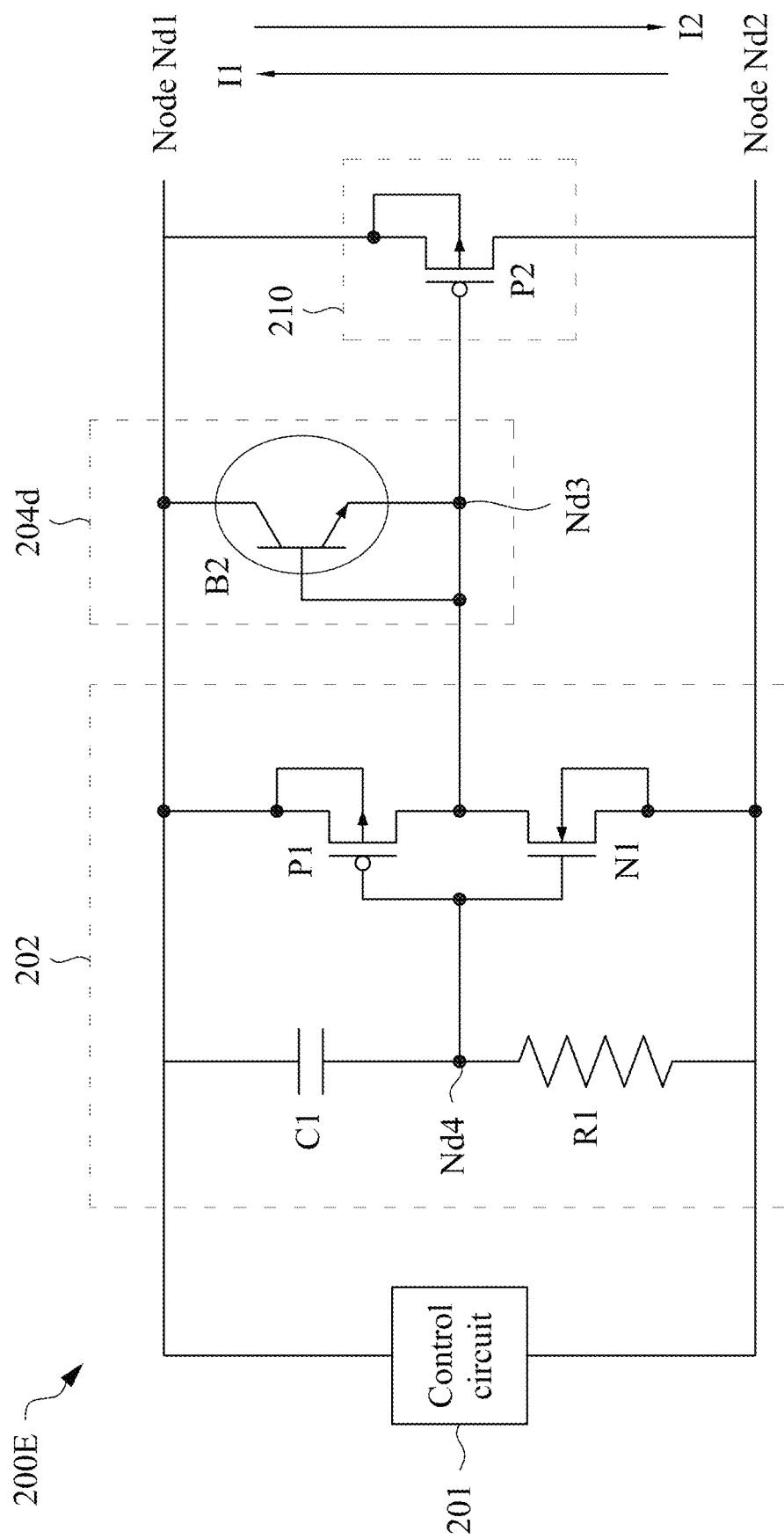

FIG. 2E is a circuit diagram of an integrated circuit 200E, in accordance with some embodiments.

Integrated circuit 200E is an embodiment of at least ESD clamp 120, and similar detailed description is therefore omitted.

Integrated circuit 200E is a variation of integrated circuit 200A of FIG. 2A, and similar detailed description is therefore omitted. In comparison with integrated circuit 200A, ESD assist circuit 204e of integrated circuit 200E replaces ESD assist circuit 204a of integrated circuit 200A, and similar detailed description is therefore omitted.

Integrated circuit 200E includes control circuit 201, ESD detection circuit 202, ESD assist circuit 204e and discharging circuit 210.

ESD assist circuit 204e is a variation of ESD assist circuit 204a of FIG. 2A, and similar detailed description is therefore omitted. In comparison with ESD assist circuit 204a, a transistor B2 of ESD assist circuit 204e replaces PMOS transistor P3 of ESD assist circuit 204a, and similar detailed description is therefore omitted. Transistor B2 is a NPN BJT.

ESD assist circuit 204e includes transistor B2. Transistor B2 includes a base, a collector and an emitter (not labelled).

In comparison with ESD assist circuit 204a of FIG. 2A, each of the emitter of transistor B2, the base of transistor B2, node Nd3, a drain of NMOS transistor N1, a drain of PMOS transistor P1 and a gate of PMOS transistor P2 are coupled together.

In comparison with ESD assist circuit 204a of FIG. 2A, each of the collector of transistor B2, the second end of capacitor C1, node Nd1, the source of PMOS transistor P1, the body of PMOS transistor P1, the source of PMOS transistor P2 and the body of PMOS transistor P2 are coupled together.

The description for when an ESD event occurs at node Nd2 (e.g., ESD current I1 in the forward ESD direction) with ESD assist circuit 204e for FIG. 2E is similar to the description of when an ESD event occurs at node Nd2 for ESD assist circuits 204a and 204c of corresponding FIGS. 2A and 2C, and similar detailed description is therefore omitted for brevity. In some embodiments, in response to an ESD event at node Nd2 (e.g., an ESD current I1 in the forward ESD direction), transistor B2 turns on, and is configured to clamp a voltage at node Nd3 to be equal to a voltage of node Nd1 (e.g., VDD) thereby assisting the ESD detection circuit 202 in causing the PMOS transistor P2 to turn-on. In response to being turned on, PMOS transistor P2 couples node Nd2 to node Nd1, and PMOS transistor P2 discharges the ESD current I1 in the forward ESD direction from node Nd2 to Nd1.

In some embodiments, in response to an ESD event at node Nd2 (e.g., an ESD current I1 in the forward ESD direction), a body diode of transistor B2 is configured to provide ESD protection of integrated circuit 200E by clamping the voltage of node Nd3. In some embodiments, a body diode of PMOS transistor P2 is configured to provide ESD protection of integrated circuit 200E by passing the ESD current I1 in the forward ESD direction from node Nd2 to node Nd1.

In some embodiments, by including ESD assist circuit 204e in integrated circuit 200E, integrated circuit 200E achieves one or more of the benefits discussed above in at least FIG. 1 or FIG. 2A.

Other types of circuits, configurations and arrangements of at least ESD detection circuit 202, ESD assist circuit 204e or discharging circuit 210 are within the scope of the present disclosure.

Other configurations or quantities of circuits in integrated circuit 200E are within the scope of the present disclosure.

Figure 3A:
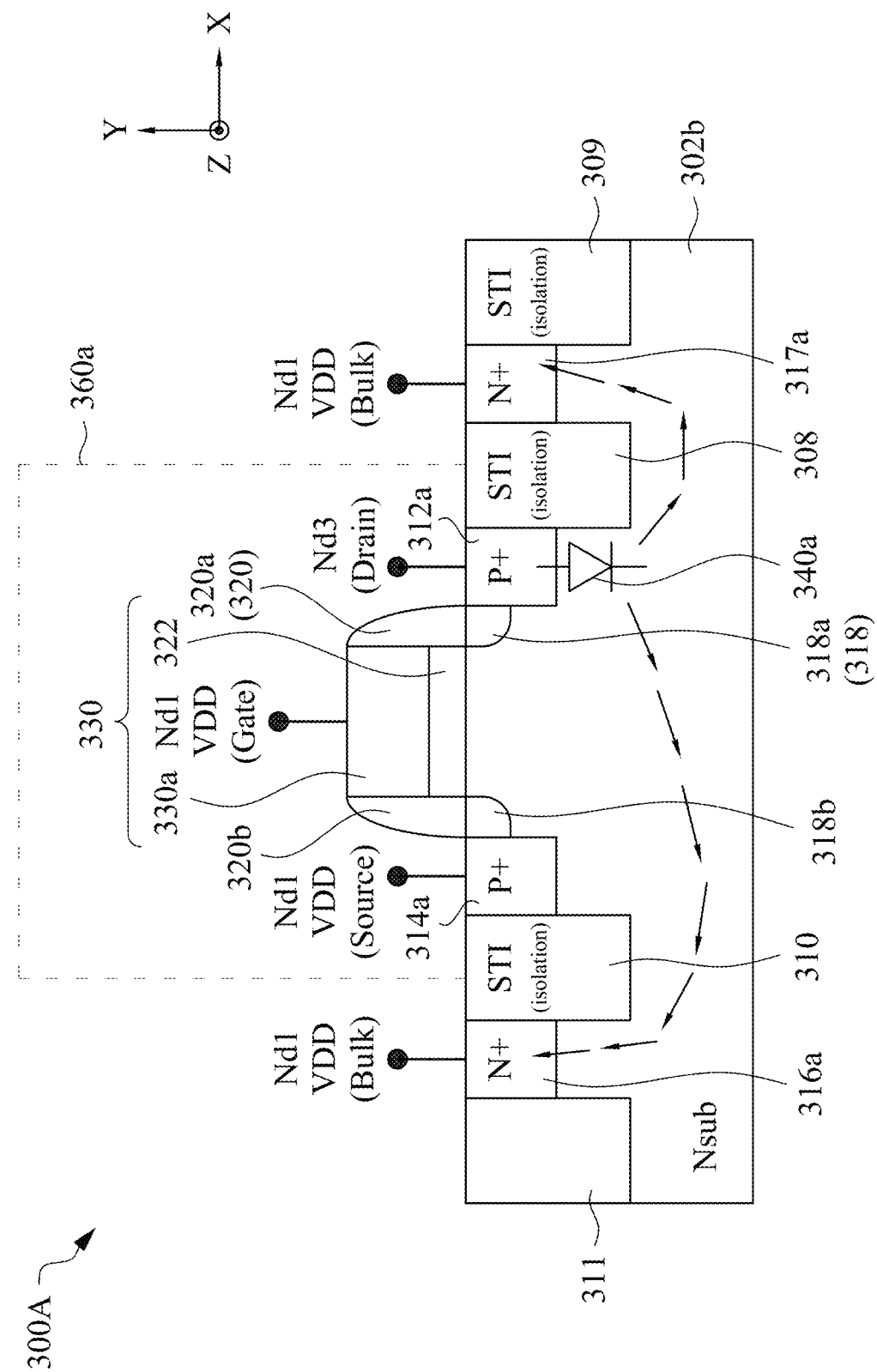
FIGS. 3A-3E are corresponding cross-sectional views of corresponding integrated circuits, in accordance with some embodiments.

FIG. 3A is a cross-sectional view of an integrated circuit 300A, in accordance with some embodiments.

Integrated circuit 300A is an embodiment of PMOS transistor P3 of ESD assist circuit 204a of FIG. 2A, and similar detailed description is therefore omitted.

Integrated circuit 300A includes a substrate 302b.

Substrate 302b is an n-type substrate. In some embodiments, substrate 302b is a p-type substrate. In some embodiments, substrate 302b includes an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 302b is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

In some embodiments, substrate 302b is replaced with an N-well that is formed inside a p-type substrate. In some embodiments, the N-well has N-type dopants, and the p-type substrate has p-type dopants.

Integrated circuit 300A further includes a gate structure 330 that is over substrate 302b. The gate structure 330 includes a gate dielectric 322 and a gate electrode 330a. Integrated circuit 300A further includes sidewalls 320a and 320b on opposite sides of gate structure 330.

Integrated circuit 300A further includes a drain region 312a and a source region 314a. The source region 314a is a P+ active region having P-type dopants implanted in the well (not shown) or substrate 302b. The drain region 312a is a P+ active region having P-type dopants implanted in well (not shown) or substrate 302b. In some embodiments, at least source region 314a or drain region 312a extends above substrate 302b.

In some embodiments, the drain region 312a and source region 314a of transistor 360a of FIG. 3A or active regions of other devices of FIGS. 2B-2E and 4A-4E are referred to as an oxide definition (OD) region which defines active regions of integrated circuits 300A-300E and 400A-400E (described below).

In some embodiments, integrated circuit 300A further includes lightly doped drain (LDD) regions 318 adjacent to source region 314a and drain region 312a, and below sidewalls 320. In some embodiments, a first element and a second element are adjacent to each other includes scenarios where the first element and the second element are directly next to each other. In some embodiments, a first element and a second element are adjacent to each other includes scenarios where intermediary elements are positioned between the first element and the second element. In some embodiments, LDD region 360 helps transistor 360a maintain a low leakage current.

In some embodiments, drain region 312a, source region 314a, LDD regions 318, sidewalls 320 and gate structure 330 together form a transistor 360a. Transistor 360a is a PMOS transistor.

Drain region 312a corresponds to the drain of PMOS transistor P3 of FIG. 2A, source region 314a corresponds to the source of PMOS transistor P3 of FIG. 2A, gate structure 330 corresponds to the gate of PMOS transistor P3 of FIG. 2A, and tap regions 316a and 317a correspond to the body of PMOS transistor P3 of FIG. 2A, and similar detailed description is therefore omitted.

The drain region 312a is coupled to node Nd3 (shown in FIG. 2A). The gate structure 330, the source region 314a and the tap regions 316a and 316b are coupled to the supply voltage (e.g., voltage VDD) by node Nd1. In some embodiments, each of the gate structure 330, source region 314a and tap regions 316a and 316b are coupled together at node Nd1, and are further coupled to the supply voltage (e.g., voltage VDD).

In some embodiments, drain region 312a and source region 314a comprise fins in accordance with fin field-effect transistor (FinFET) complementary metal-oxide-semiconductor (CMOS) technologies. In some embodiments, drain region 312a and source region 314a comprise nanosheets of nanosheet transistors. In some embodiments, drain region 312a and source region 314a comprise nanowire of nanowire transistors. In some embodiments, drain region 312a and source region 314a are free of fins in accordance with planar CMOS technologies. Other types of transistors are within the scope of the present disclosure.

In some embodiments, drain region 312a is an extended drain region and has a greater size than source region 314a. In at least one embodiment, a silicide layer (not shown) covers a portion, but not the entirety, of drain region 312a. Such a partially silicided configuration of drain region 312a improves self-protection of transistor 360a from ESD events. In at least one embodiment, drain region 312a is fully silicided.

Gate structure 330 is arranged between drain region 312a and source region 314a. In some embodiments, gate electrode 330a comprises a conductive material such as metal or polysilicon (also referred to herein as "POLY"). In some embodiments, gate structure 330 is coupled to a supply voltage terminal (e.g., voltage VDD), or a reference supply voltage terminal (e.g., voltage VSS).

Integrated circuit 300A further includes tap regions 316a and 317a and shallow trench isolation (STI) regions 308, 309, 310 and 311.

STI region 308 is configured to isolate at least drain region 312a and tap region 317a from each other. In some embodiments, STI region 308 is configured to isolate drain region 312a or tap region 317a from other portions of integrated circuit 300A (not shown).

STI region 309 is configured to isolate tap region 317a from other portions of integrated circuit 300A.

STI region 310 is configured to isolate at least source region 314a and tap region 316a from each other. In some embodiments, STI region 310 is configured to isolate source region 314a or tap region 316a from other portions of integrated circuit 300A (not shown).

STI region 311 is configured to isolate tap region 316a from other portions of integrated circuit 300A.

In some embodiments, tap regions 316a and 317a correspond to a well tap. In some embodiments, a well tap is electrically conductive materials that couple source/drain regions of integrated circuit 300A to a voltage supply node (e.g., supply voltage VDD).

Tap regions 316a and 317a are heavily doped n-regions in a well (not shown) or substrate 302b. In some embodiments, tap regions 316a and 317a are heavily doped n-regions in a n-type well (not shown) on a p-type substrate. In some embodiments, the heavily doped n-region is coupled through the well tap to the voltage supply node (e.g., supply voltage VDD) thereby setting the potential of the n-type well or substrate 302b to prevent leakage from adjacent source/drain regions into the n-well/p-substrate.

Integrated circuit 300A further includes a body diode 340a. Body diode 340a is a parasitic element formed by the PN junction between the drain region 312a and at least tap region 316a or 317a. In some embodiments, the body diode 340a is formed by the PN junction between the drain region 312a and the source region 314a. The body diode 340a is also referred to as a parasitic diode or an internal diode of integrated circuit 300A. In some embodiments, in response to ESD events at node Nd2 in the forward direction, body diode 340a of PMOS transistor P3 is configured to provide ESD protection of integrated circuit 300A by clamping the voltage of node Nd3, and integrated circuit 300A thereby achieves one or more of the benefits discussed above in at least FIG. 1 or FIG. 2A.

Figure 3B:
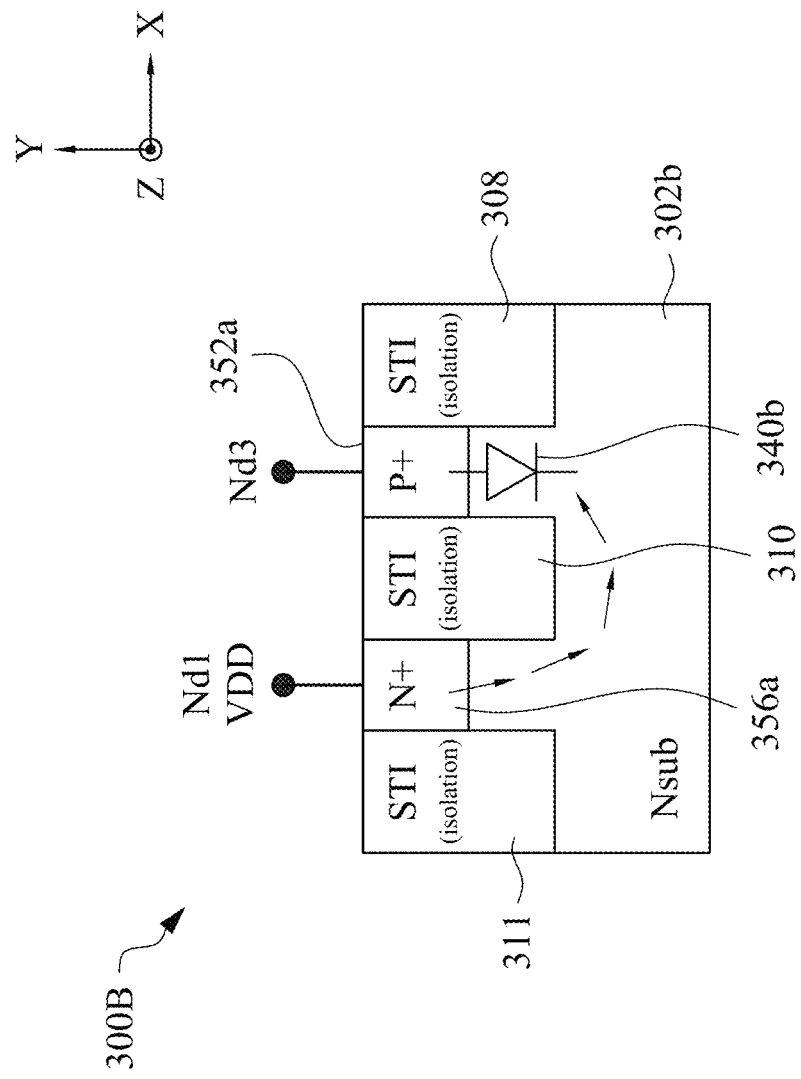

FIG. 3B is a cross-sectional view of an integrated circuit 300B, in accordance with some embodiments.

Integrated circuit 300B is an embodiment of diode D1 of ESD assist circuit 204b of FIG. 2B, and similar detailed description is therefore omitted. Integrated circuit 300B is a variation of integrated circuit 300A of FIG. 3A, and similar detailed description is therefore omitted.

Integrated circuit 300B includes a substrate 302b, a P-type region 352a, an N-type region 356a, and STI regions 308, 310 and 311.

P-type region 352a is similar to the drain region 312a in FIG. 3A, and similar detailed description is therefore omitted.

Substrate 302b is an n-type substrate having N-type dopants. The P-type region 352a is a P+ active region having P-type dopants implanted in the well (not shown) or substrate 302b. The N-type region 356a is an N+ active region having N-type dopants implanted in the well (not shown) or substrate 302b. STI region 310 is between P-type region 352a and N-type region 356a.

STI region 308 is configured to isolate at least P-type region 352a from other portions of integrated circuit 300B (not shown). STI region 311 is configured to isolate at least N-type region 356a from other portions of integrated circuit 300B (not shown).

STI region 310 is configured to isolate at least P-type region 352a and N-type region 356a from each other. In some embodiments, STI region 310 is configured to isolate P-type region 352a or N-type region 356a from other portions of integrated circuit 300B (not shown).

P-type region 352a corresponds to the anode of diode D1 of FIG. 2B, and N-type region 356a corresponds to the cathode of diode D1 of FIG. 2B, and similar detailed description is therefore omitted.

The P-type region 352a is coupled to node Nd3 (shown in FIG. 2A). The N-type region 356a is coupled to the supply voltage (e.g., voltage VDD) by node Nd1.

Integrated circuit 300B further includes a body diode 340b. Body diode 340b is a parasitic element formed by the PN junction between the P-type region 352a and N-type region 356a. In some embodiments, in response to ESD events at node Nd2 in the forward direction, body diode 340b is configured to provide ESD protection of integrated circuit 300B by clamping the voltage of node Nd3, and integrated circuit 300B thereby achieves one or more of the benefits discussed above in at least FIG. 1 or FIG. 2A.

Figure 3C:
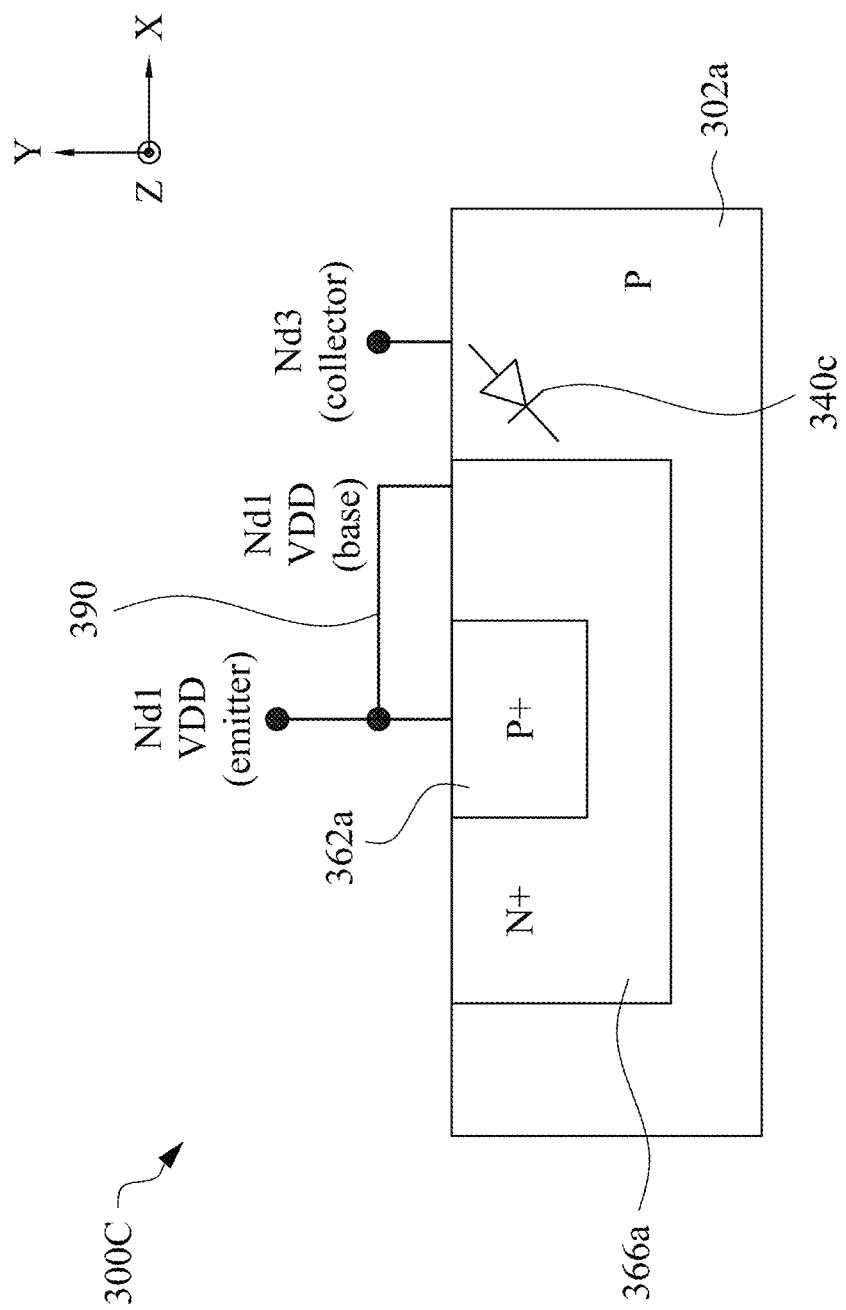

FIG. 3C is a cross-sectional view of an integrated circuit 300C, in accordance with some embodiments.

Integrated circuit 300C is an embodiment of transistor B1 of ESD assist circuit 204c of FIG. 2C, and similar detailed description is therefore omitted. Integrated circuit 300C is a variation of integrated circuit 300A of FIG. 3A, and similar detailed description is therefore omitted.

Integrated circuit 300C includes a substrate 302a, a P-type region 362a, and an N-type region 366a. Substrate 302a is similar to substrate 302b, P-type region 362a is similar to P-type region 352a in FIG. 3B, N-type region 366a is similar to N-type region 356a in FIG. 3B, and similar detailed description is therefore omitted.

In FIG. 3C, substrate 302a is a p-type substrate having P-type dopants. The N-type region 366a is an N+ active region having N-type dopants implanted in substrate 302a. The P-type region 362a is a P+ active region having P-type dopants implanted in the N-type region 366a.

P-type region 362a corresponds to the emitter of transistor B1 of FIG. 2C, N-type region 366a corresponds to the base of transistor B1 of FIG. 2C, substrate 302a corresponds to the collector of transistor B1 of FIG. 2C, and similar detailed description is therefore omitted.

Each of the P-type region 362a and the N-type region 366a are coupled together, and further coupled to the supply voltage (e.g., voltage VDD) by node Nd1. The substrate 302a is coupled to node Nd3.

Integrated circuit 300C further includes a body diode 340c. Body diode 340c is a parasitic element formed by the PN junction between the substrate 302a and the N-type region 366a. In some embodiments, in response to ESD events at node Nd2 in the forward direction, body diode 340c is configured to provide ESD protection of integrated circuit 300C by clamping the voltage of node Nd3, and integrated circuit 300C thereby achieves one or more of the benefits discussed above in at least FIG. 1 or FIG. 2A.

Figure 3D:
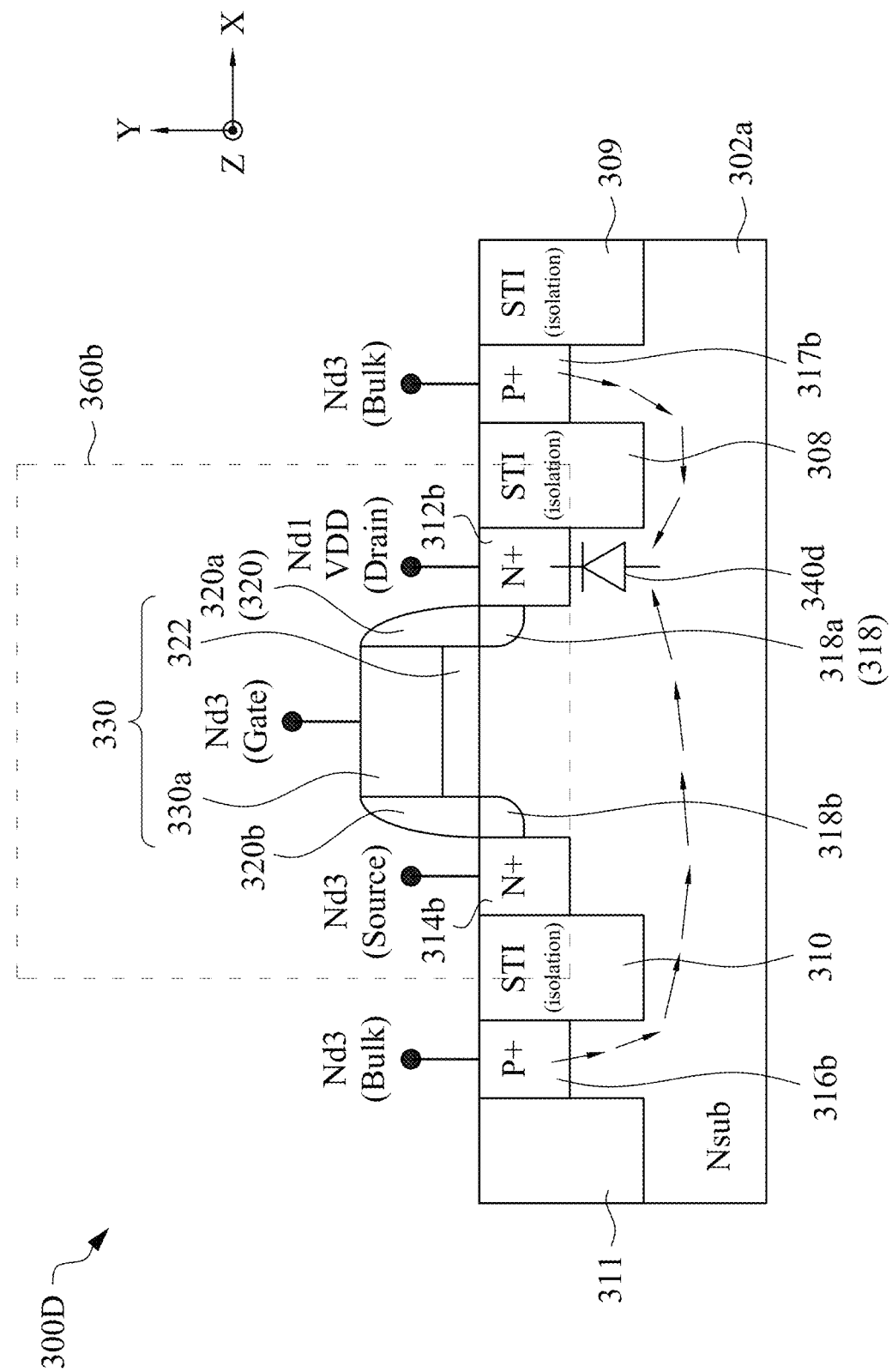

FIG. 3D is a cross-sectional view of an integrated circuit 300D, in accordance with some embodiments.

Integrated circuit 300D is an embodiment of NMOS transistor N2 of ESD assist circuit 204d of FIG. 2D, and similar detailed description is therefore omitted. Integrated circuit 300D is a variation of integrated circuit 300A of FIG. 3A, and similar detailed description is therefore omitted.

In comparison with integrated circuit 300A of FIG. 3A, a drain region 312b replaces drain region 312a of FIG. 3A, a source region 314b replaces source region 314a of FIG. 3A, tap regions 316b and 317b replace corresponding tap regions 316a and 317a of FIG. 3A, transistor 360b replaces transistor 360a, and similar detailed description is therefore omitted.

Integrated circuit 300D includes substrate 302a, gate structure 330, drain region 312b, source region 314b, LDD regions 318, sidewalls 320, tap regions 316b and 317b, and STI regions 308, 309, 310 and 311, and body diode 340d.

In FIG. 3D, substrate 302a is a p-type substrate having P-type dopants.

In some embodiments, drain region 312b, source region 314b, LDD regions 318, sidewalls 320 and gate structure 330 together form a transistor 360b. Transistor 360b is an NMOS transistor.

Drain region 312b corresponds to the drain of NMOS transistor N2 of FIG. 2D, source region 314b corresponds to the source of NMOS transistor N2 of FIG. 2D, gate structure 330 corresponds to the gate of NMOS transistor N2 of FIG. 2D, and tap regions 316b and 317b correspond to the body of NMOS transistor N2 of FIG. 2D, and similar detailed description is therefore omitted.

The drain region 312b is coupled to the supply voltage (e.g., voltage VDD) by node Nd1. The gate structure 330, the source region 314b and the tap region 316b are coupled to node Nd3.

STI region 308 is configured to isolate at least drain region 312b and tap region 317b from each other. In some embodiments, STI region 308 is configured to isolate drain region 312b or tap region 317b from other portions of integrated circuit 300D (not shown).

STI region 309 is configured to isolate tap region 317b from other portions of integrated circuit 300D.

STI region 310 is configured to isolate at least source region 314b and tap region 316b from each other. In some embodiments, STI region 310 is configured to isolate source region 314b or tap region 316b from other portions of integrated circuit 300D (not shown).

STI region 311 is configured to isolate tap region 316b from other portions of integrated circuit 300D.

In some embodiments, tap regions 316b and 317b correspond to a substrate tap. In some embodiments, a substrate tap is an electrically conductive material that couples tap regions 316b and 317b to a reference voltage supply node (e.g., supply voltage VSS). For example, in some embodiments, tap regions 316b and 317b of substrate 302a includes a heavily doped p-region which is formed in a p-type substrate. In some embodiments, the heavily doped p-region is coupled through the tap regions 316b and 317b to the reference voltage supply node (e.g., reference supply voltage VSS) thereby setting the potential of the substrate 302a to prevent leakage from adjacent source/drain regions.

Integrated circuit 300D further includes a body diode 340d. Body diode 340d is a parasitic element formed by the PN junction between at least tap region 316b or 317b and the drain region 312b. In some embodiments, the body diode 340d is formed by the PN junction between the source region 314b and the drain region 312b. In some embodiments, in response to ESD events at node Nd2 in the forward direction, body diode 340d of NMOS transistor N2 is configured to provide ESD protection of integrated circuit 300D by clamping the voltage of node Nd3, and integrated circuit 300D thereby achieves one or more of the benefits discussed above in at least FIG. 1 or FIG. 2A.

Figure 3E:
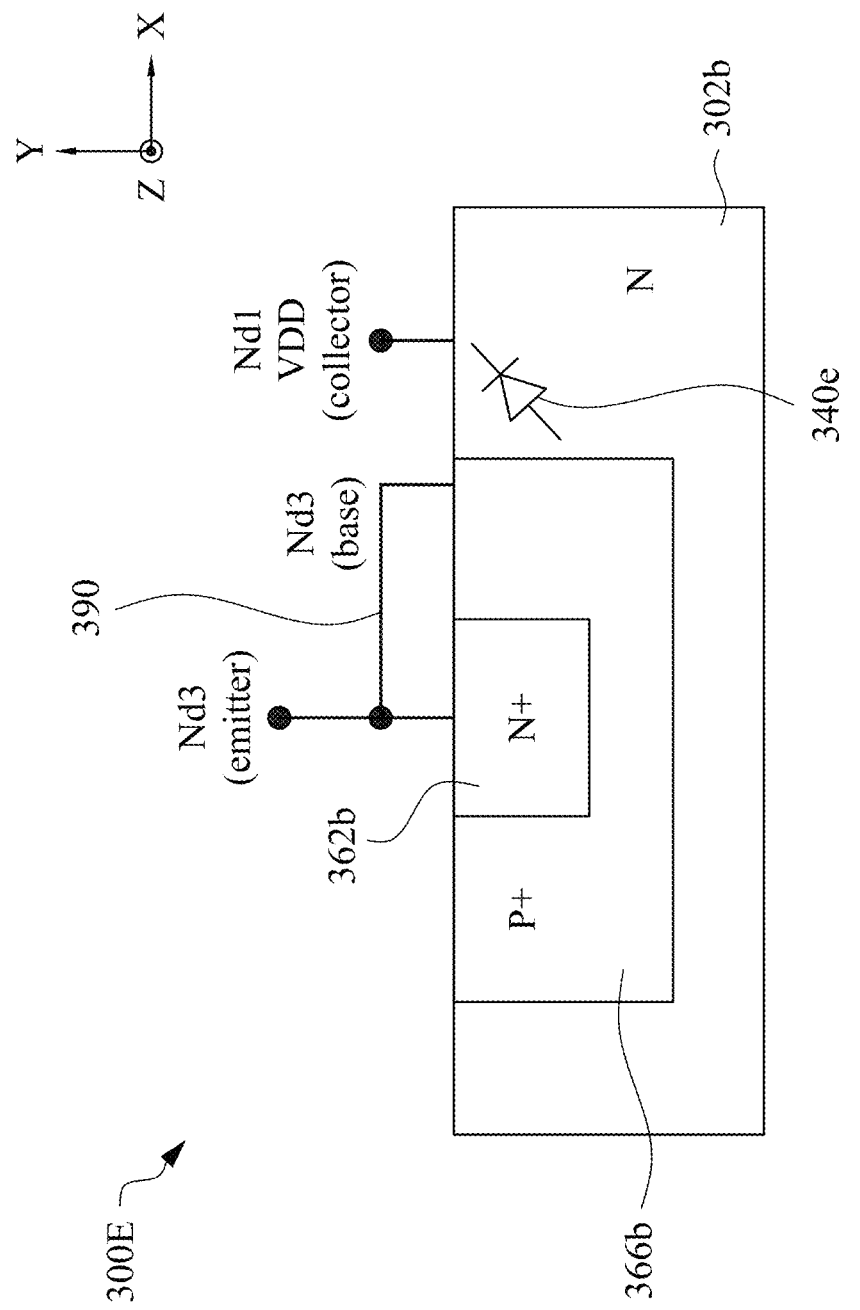

FIG. 3E is a cross-sectional view of an integrated circuit 300E, in accordance with some embodiments.

Integrated circuit 300E is an embodiment of transistor B2 of ESD assist circuit 204e of FIG. 2E, and similar detailed description is therefore omitted. Integrated circuit 300E is a variation of integrated circuit 300C of FIG. 3C, and similar detailed description is therefore omitted.

Integrated circuit 300E includes substrate 302b, an N-type region 362b, and a P-type region 366b. N-type region 362b is similar to N-type region 366a in FIG. 3B, P-type region 366b is similar to P-type region 362a in FIG. 3B, and similar detailed description is therefore omitted.

Substrate 302b is an n-type substrate having N-type dopants. The P-type region 366b is a P+ active region having P-type dopants implanted in substrate 302b. The N-type region 362b is an N+ active region having N-type dopants implanted in the P-type region 366b.

N-type region 362b corresponds to the emitter of transistor B2 of FIG. 2E, P-type region 366b corresponds to the base of transistor B2 of FIG. 2E, substrate 302b corresponds to the collector of transistor B2 of FIG. 2E, and similar detailed description is therefore omitted.

Each of the N-type region 362b and the P-type region 366b are coupled together, and further coupled to node Nd3. The substrate 302b is coupled to the supply voltage (e.g., voltage VDD) by node Nd1.

Integrated circuit 300E further includes a body diode 340e. Body diode 340e is a parasitic element formed by the PN junction between the P-type region 366b and the substrate 302b. In some embodiments, in response to ESD events at node Nd2 in the forward direction, body diode 340e is configured to provide ESD protection of integrated circuit 300E by clamping the voltage of node Nd3, and integrated circuit 300E thereby achieves one or more of the benefits discussed above in at least FIG. 1 or FIG. 2A.

Figure 4A:
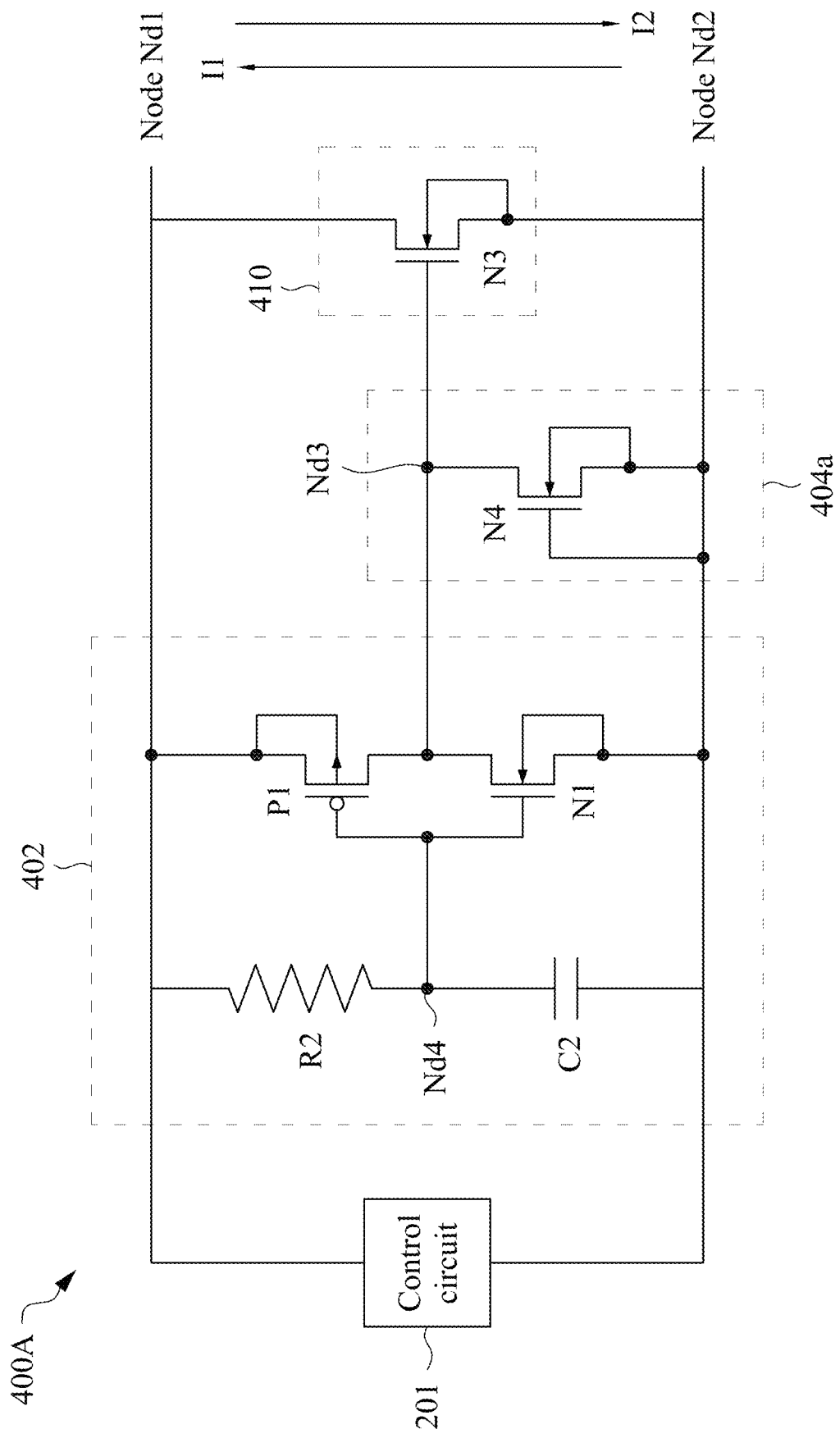
FIGS. 4A-4E are corresponding circuit diagrams of corresponding integrated circuits, in accordance with some embodiments.

FIG. 4A is a circuit diagram of an integrated circuit 400A, in accordance with some embodiments.

Integrated circuit 400A is an embodiment of at least ESD clamp 120, and similar detailed description is therefore omitted.

Integrated circuit 400A is a variation of integrated circuit 200A of FIG. 2A, and similar detailed description is therefore omitted. In comparison with integrated circuit 200A, ESD detection circuit 402 of integrated circuit 400A replaces ESD detection circuit 202 of integrated circuit 200A, ESD assist circuit 404a of integrated circuit 400A replaces ESD assist circuit 204a of integrated circuit 200A, discharging circuit 410 of integrated circuit 400A replaces discharging circuit 210 of integrated circuit 200A, and similar detailed description is therefore omitted.

Integrated circuit 400A includes control circuit 201, ESD detection circuit 402, ESD assist circuit 404a and discharging circuit 410.

ESD detection circuit 402 is a variation of ESD detection circuit 202 of FIG. 2A, and similar detailed description is therefore omitted. In comparison with ESD detection circuit 202, a resistor R2 of ESD detection circuit 402 replaces resistor R1 of ESD detection circuit 202, a capacitor C2 of ESD detection circuit 402 replaces capacitor C1 of ESD detection circuit 202, and similar detailed description is therefore omitted.

ESD discharge circuit 410 is a variation of ESD discharge circuit 210 of FIG. 2A, and similar detailed description is therefore omitted. In comparison with ESD discharge circuit 210, an NMOS transistor N3 of ESD discharge circuit 410 replaces PMOS transistor P2 of ESD discharge circuit 210, and similar detailed description is therefore omitted.

ESD assist circuit 404a is a variation of ESD assist circuit 204a of FIG. 2A, and similar detailed description is therefore omitted. In comparison with ESD assist circuit 204a, an NMOS transistor N4 of ESD assist circuit 404a replaces PMOS transistor P3 of ESD assist circuit 204a, and similar detailed description is therefore omitted.

ESD assist circuit 404a includes NMOS transistor N4. In some embodiments, NMOS transistor N4 is a grounded gate NMOS (ggNMOS) transistor. NMOS transistor N4 includes a gate, a drain, a source and a body (not labelled).

ESD discharge circuit 410 includes NMOS transistor N3. NMOS transistor N3 includes a gate, a drain, a source and a body (not labelled).

Each of a first end of capacitor C2, node Nd2, a source of NMOS transistor N1, a body of NMOS transistor N1, source of NMOS transistor N3, a body of NMOS transistor N3, a gate of NMOS transistor N4, a source of NMOS transistor N4, and a body of NMOS transistor N4 are coupled together.

Each of a first end of resistor R2, node Nd4, a second end of capacitor C2, the gate of PMOS transistor P1, and the gate of NMOS transistor N2 are coupled together.

Each of a second end of resistor R2, node Nd1, the source of PMOS transistor P1, the body of PMOS transistor P1, and a drain of NMOS transistor N3 are coupled together.

Each of a node Nd3, a drain of NMOS transistor N1, a drain of PMOS transistor P1, a drain of NMOS transistor N4 and a gate of NMOS transistor N3 are coupled together.

In some embodiments, capacitor C2 is a transistor-coupled capacitor. For example in some embodiments, capacitor C2 is a transistor having a drain and source coupled together thereby forming a transistor-coupled capacitor.

Resistor R2 and capacitor C2 are configured as an RC network. Dependent upon a location of an output of the RC network, the RC network is configured as either a low pass filter or a high pass filter.

When an ESD event at node Nd2 occurs (e.g., ESD current I1 in the forward ESD direction), the ESD current or voltage at node Nd2 rises rapidly causing the voltage of node Nd4 (e.g., across capacitor C2) to rise slowly since the voltage at node Nd4 corresponds to an output voltage of a low pass filter (e.g., a voltage across capacitor C2 with respect to node Nd2). In other words, capacitor C2 is configured as a low pass filter, and the rapidly changing voltage or current from the ESD event is filtered by capacitor C2. In some embodiments, ESD detection circuit 402 has a minimal effect on an ESD event at node Nd2.

When an ESD event at node Nd2 occurs (e.g., ESD current I1 flows in the forward ESD direction), the ESD current or voltage at node Nd2 rises rapidly, and ESD assist circuit 404a detects the rapidly rising current or voltage at node Nd2 of the ESD event, causing NMOS transistor N4 of the ESD assist circuit 404a to turn on. In response to turning on, NMOS transistor N4 couples node Nd2 to node Nd3 and thereby charges node Nd3 and the gate of NMOS transistor N3 of the discharging circuit 410 in response to the rising ESD voltage or current. Stated differently, NMOS transistor N4 clamps the voltage of node Nd3 at the voltage of node Nd2 (VSS). In response to being charged by NMOS transistor N4 of ESD assist circuit 404a, NMOS transistor N3 of discharging circuit 410 is turned on and couples node Nd2 to node Nd1. By being turned on and coupling node Nd2 to node Nd1, NMOS transistor N3 discharges the ESD current I1 in the forward ESD direction from node Nd2 to Nd1.

In some embodiments, in response to an ESD event at node Nd2 (e.g., an ESD current I1 in the forward ESD direction), a body diode of the NMOS transistor N4 is configured to provide ESD protection of integrated circuit 400A by clamping the voltage of node Nd3. In some embodiments, a body diode of the NMOS transistor N3 is configured to provide ESD protection of integrated circuit 400A by passing the ESD current I1 in the forward ESD direction from node Nd2 to node Nd1.

In some embodiments, by including ESD assist circuit 404a in integrated circuit 400A, the NMOS transistor N4 of ESD assist circuit 404a is configured to control the gate potential of NMOS transistor N3 by clamping the voltage of node Nd3 to be equal to the voltage of node Nd2 (e.g., VSS) during an ESD event at node Nd2 thereby reducing capacitive coupling effects between node Nd1 and Nd3 and effectively lowering the turn-on resistance of NMOS transistor N3, and thus causing the NMOS transistor N3 to turn-on faster and stronger than other approaches resulting in improved ESD performance and improved ESD robustness compared to other approaches.

Other types of circuits, configurations and arrangements of at least ESD detection circuit 402, ESD assist circuit 404a or discharging circuit 410 are within the scope of the present disclosure.

Other configurations or quantities of circuits in integrated circuit 400A are within the scope of the present disclosure.

Figure 4B:
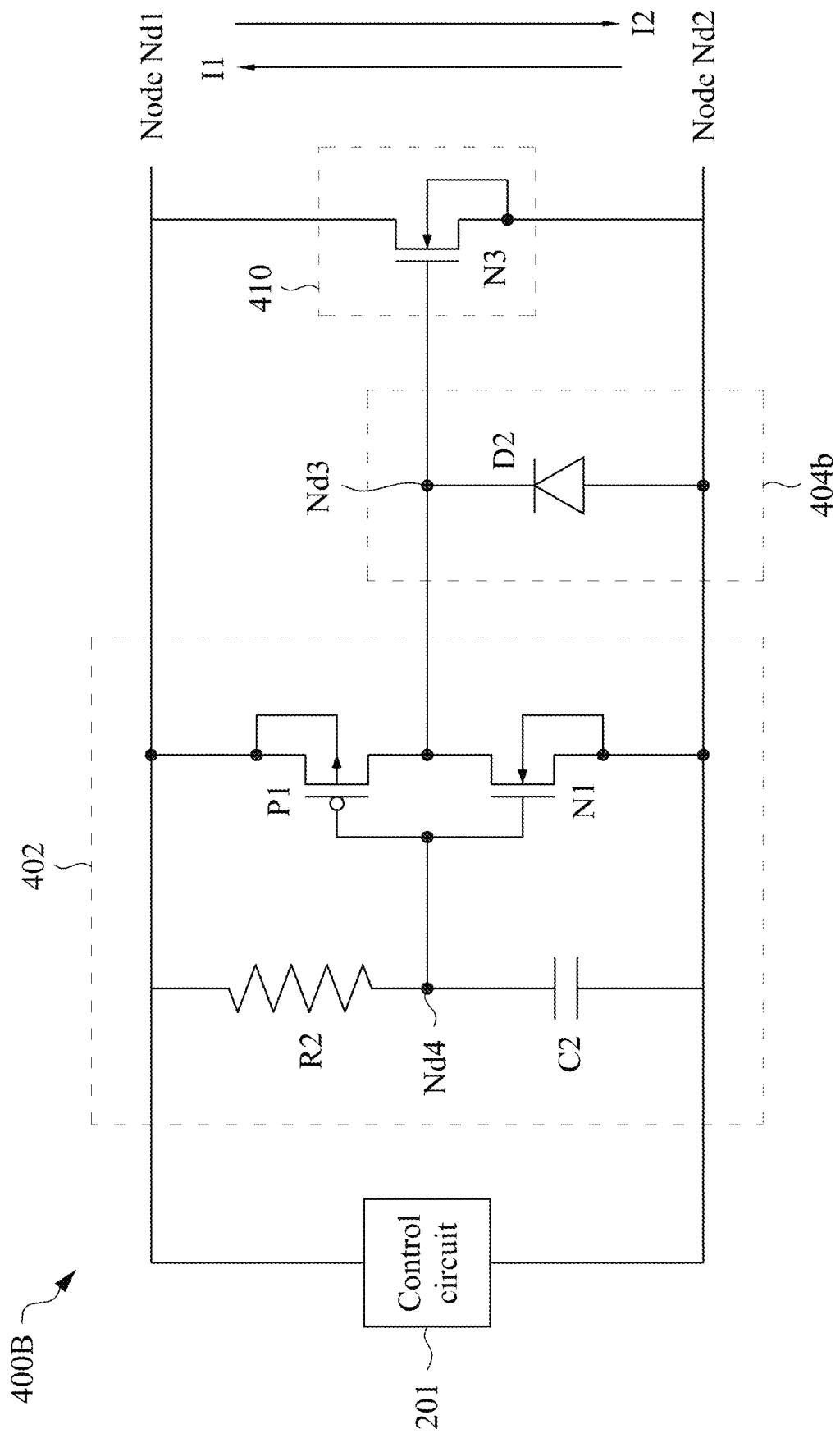

FIG. 4B is a circuit diagram of an integrated circuit 400B, in accordance with some embodiments.

Integrated circuit 400B is an embodiment of at least ESD clamp 120, and similar detailed description is therefore omitted.

Integrated circuit 400B is a variation of integrated circuit 400A of FIG. 4A, and similar detailed description is therefore omitted. In comparison with integrated circuit 400A, ESD assist circuit 404b of integrated circuit 400B replaces ESD assist circuit 404a of integrated circuit 400A, and similar detailed description is therefore omitted.

Integrated circuit 400B includes control circuit 201, ESD detection circuit 402, ESD assist circuit 404b and discharging circuit 410.

ESD assist circuit 404b is a variation of ESD assist circuit 404a of FIG. 4A, and similar detailed description is therefore omitted. In comparison with ESD assist circuit 404a, a diode D2 of ESD assist circuit 404b replaces NMOS transistor N4 of ESD assist circuit 404a, and similar detailed description is therefore omitted.

ESD assist circuit 404b includes diode D2. Diode D2 includes an anode and a cathode (not labelled).

In comparison with ESD assist circuit 404a of FIG. 4A, each of the cathode of diode D2, node Nd3, the drain of NMOS transistor N1, the drain of PMOS transistor P1, and the gate of NMOS transistor N3 are coupled together.

In comparison with ESD assist circuit 404a of FIG. 4A, each of the anode of diode D2, the first end of capacitor C2, node Nd2, the source of NMOS transistor N1, the body of NMOS transistor N1, the source of NMOS transistor N3, and the body of NMOS transistor N3 are coupled together.

The description for when an ESD event occurs at node Nd2 (e.g., ESD current I1 in the forward ESD direction) with ESD assist circuit 404b for FIG. 4B is similar to the description of when an ESD event occurs at node Nd2 for ESD assist circuit 404a of FIG. 4A, and similar detailed description is therefore omitted for brevity. In some embodiments, in response to an ESD event at node Nd2 (e.g., an ESD current I1 in the forward ESD direction), diode D2 is configured to be forward-biased and thereby clamps the voltage at node Nd3 to be equal to a voltage of node Nd2 (e.g., VSS) thereby causing the NMOS transistor N3 to turn-on. In response to being turned on, NMOS transistor N3 couples node Nd2 to node Nd1 and NMOS transistor N3 discharges the ESD current I1 in the forward ESD direction from node Nd2 to Nd1.

In some embodiments, by including ESD assist circuit 404b in integrated circuit 400B, integrated circuit 400B achieves one or more of the benefits discussed above in at least FIG. 1 or FIG. 4A.

Other types of circuits, configurations and arrangements of at least ESD detection circuit 402, ESD assist circuit 404b or discharging circuit 410 are within the scope of the present disclosure.

Other configurations or quantities of circuits in integrated circuit 400B are within the scope of the present disclosure.

Figure 4C:
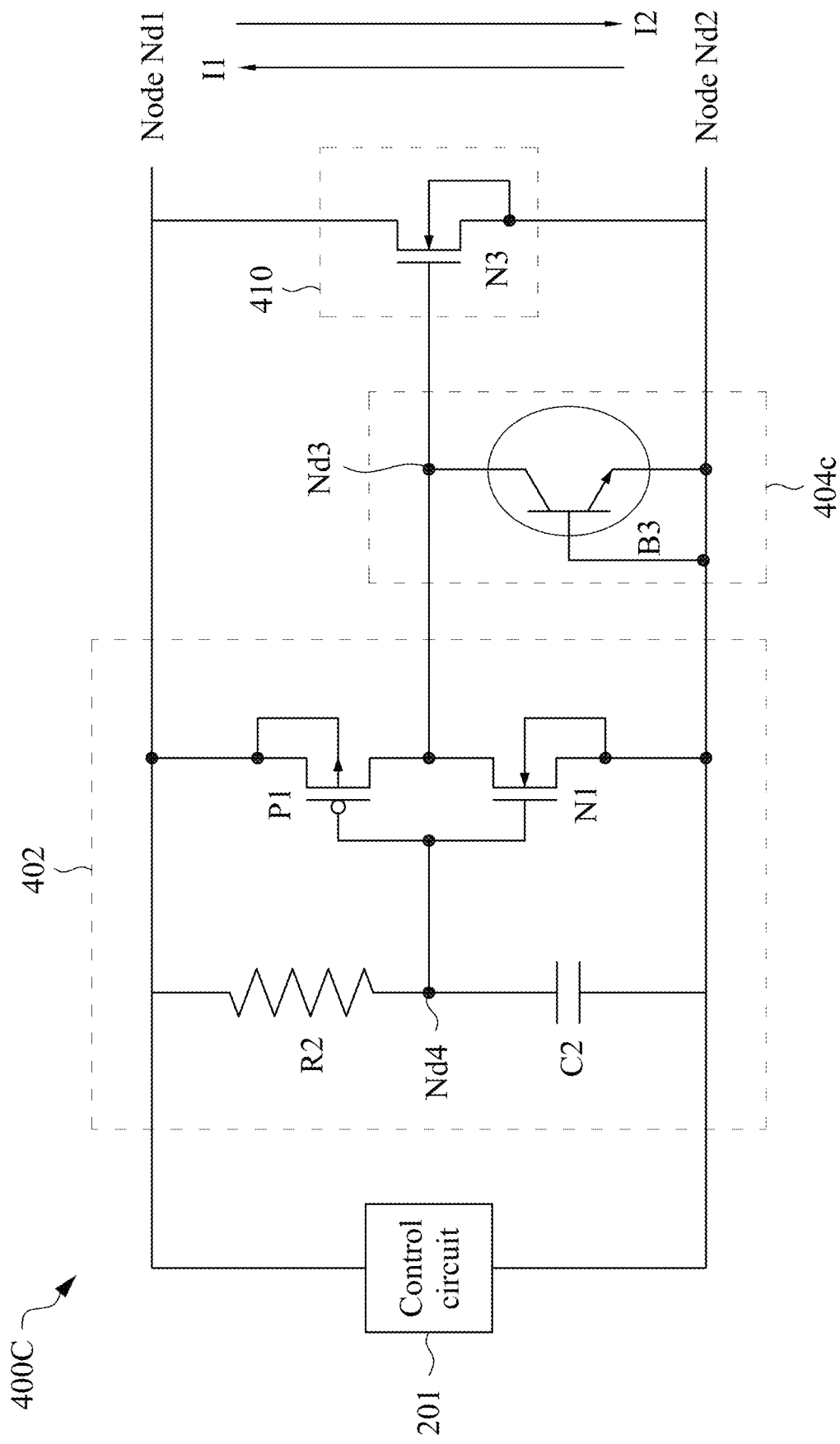

FIG. 4C is a circuit diagram of an integrated circuit 400C, in accordance with some embodiments.

Integrated circuit 400C is an embodiment of at least ESD clamp 120, and similar detailed description is therefore omitted.

Integrated circuit 400C is a variation of integrated circuit 400A of FIG. 4A, and similar detailed description is therefore omitted. In comparison with integrated circuit 400A, ESD assist circuit 404c of integrated circuit 400C replaces ESD assist circuit 404a of integrated circuit 400A, and similar detailed description is therefore omitted.

Integrated circuit 400C includes control circuit 201, ESD detection circuit 402, ESD assist circuit 404c and discharging circuit 410.

ESD assist circuit 404c is a variation of ESD assist circuit 404a of FIG. 4A, and similar detailed description is therefore omitted. In comparison with ESD assist circuit 404a, a transistor B3 of ESD assist circuit 404c replaces NMOS transistor N4 of ESD assist circuit 404a, and similar detailed description is therefore omitted. Transistor B3 is an NPN BJT.

ESD assist circuit 404c includes transistor B3. Transistor B3 includes a base, a collector and an emitter (not labelled).

In comparison with ESD assist circuit 404a of FIG. 4A, each of the collector of transistor B3, node Nd3, the drain of NMOS transistor N1, the drain of PMOS transistor P1, and the gate of NMOS transistor N3 are coupled together.

In comparison with ESD assist circuit 404a of FIG. 4A, each of the emitter of transistor B3, the base of transistor B3, the first end of capacitor C2, node Nd2, the source of NMOS transistor N1, the body of NMOS transistor N1, the source of NMOS transistor N3, and the body of NMOS transistor N3 are coupled together.

The description for when an ESD event occurs at node Nd2 (e.g., ESD current I1 in the forward ESD direction) with ESD assist circuit 404c for FIG. 4C is similar to the description of when an ESD event occurs at node Nd2 for ESD assist circuit 404a of FIG. 4A, and similar detailed description is therefore omitted for brevity. In some embodiments, in response to an ESD event at node Nd2 (e.g., an ESD current I1 in the forward ESD direction), transistor B3 turns on, and is configured to clamp the voltage at node Nd3 to be equal to a voltage of node Nd2 (e.g., VSS) thereby causing the NMOS transistor N3 to turn-on. In response to being turned on, NMOS transistor N3 couples node Nd2 to node Nd1 and NMOS transistor N3 discharges the ESD current I1 in the forward ESD direction from node Nd2 to Nd1.

In some embodiments, in response to an ESD event at node Nd2 (e.g., an ESD current I1 in the forward ESD direction), a body diode of transistor B3 is configured to provide ESD protection of integrated circuit 400C by clamping the voltage of node Nd3. In some embodiments, a body diode of NMOS transistor N3 is configured to provide ESD protection of integrated circuit 400B by passing the ESD current I1 in the forward ESD direction from node Nd2 to node Nd1.

In some embodiments, by including ESD assist circuit 404c in integrated circuit 400C, integrated circuit 400C achieves one or more of the benefits discussed above in at least FIG. 1 or FIG. 4A.

Other types of circuits, configurations and arrangements of at least ESD detection circuit 402, ESD assist circuit 404c or discharging circuit 410 are within the scope of the present disclosure.

Other configurations or quantities of circuits in integrated circuit 400C are within the scope of the present disclosure.

Figure 4D:
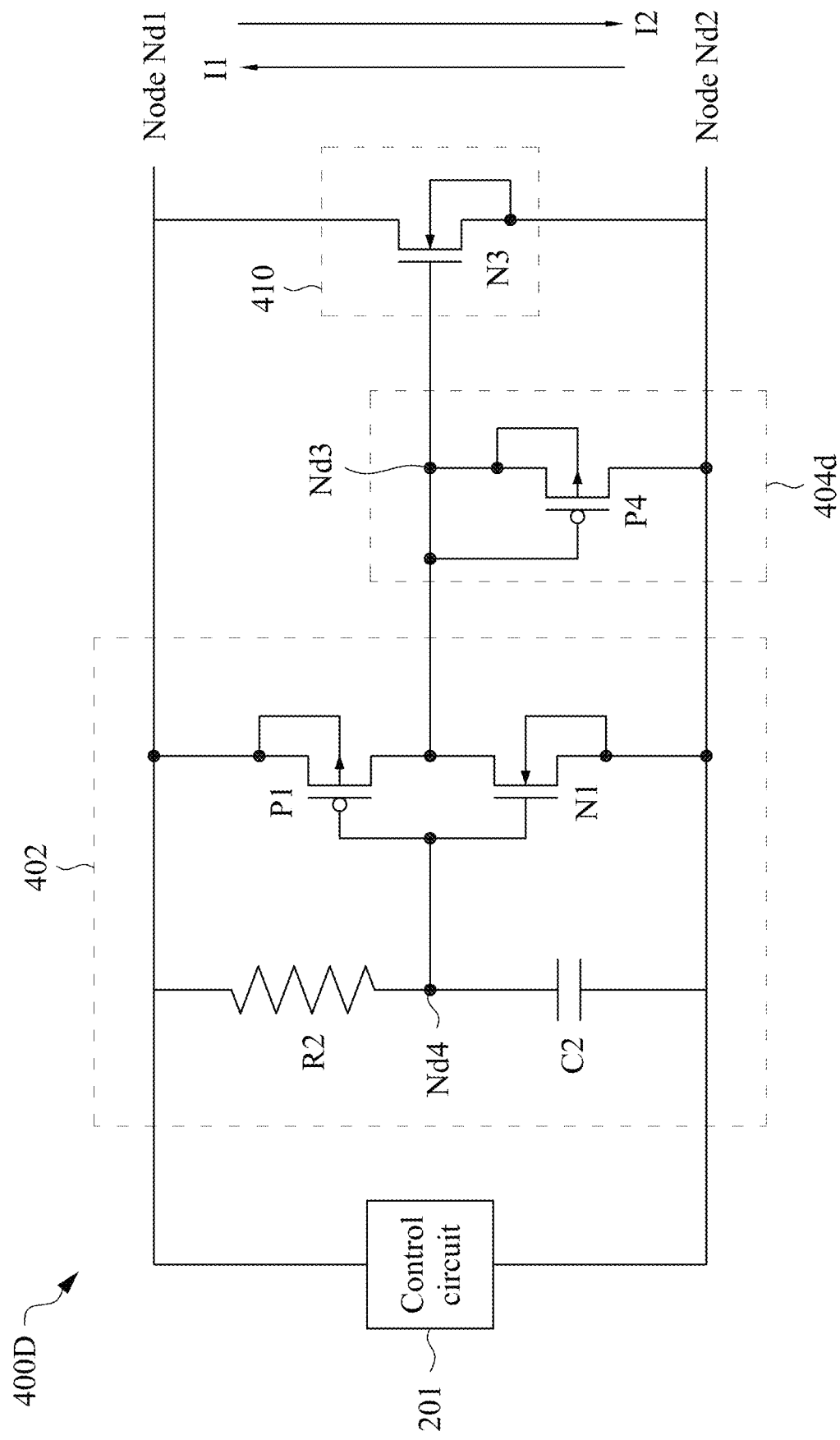

FIG. 4D is a circuit diagram of an integrated circuit 400D, in accordance with some embodiments.

Integrated circuit 400D is an embodiment of at least ESD clamp 120, and similar detailed description is therefore omitted.

Integrated circuit 400D is a variation of integrated circuit 400A of FIG. 4A, and similar detailed description is therefore omitted. In comparison with integrated circuit 400A, ESD assist circuit 404d of integrated circuit 400D replaces ESD assist circuit 404a of integrated circuit 400A, and similar detailed description is therefore omitted.

Integrated circuit 400D includes control circuit 201, ESD detection circuit 402, ESD assist circuit 404d and discharging circuit 410.

ESD assist circuit 404d is a variation of ESD assist circuit 404a of FIG. 4A, and similar detailed description is therefore omitted. In comparison with ESD assist circuit 404a, a PMOS transistor P4 of ESD assist circuit 404d replaces NMOS transistor N4 of ESD assist circuit 404a, and similar detailed description is therefore omitted.

ESD assist circuit 404d includes PMOS transistor P4. PMOS transistor P4 includes a gate, a drain, a source and a body (not labelled).

In comparison with ESD assist circuit 404a of FIG. 4A, each of the gate of PMOS transistor P4, the source of PMOS transistor P4, the body of PMOS transistor P4, node Nd3, the drain of NMOS transistor N1, the drain of PMOS transistor P1, and the gate of NMOS transistor N3 are coupled together.

In comparison with ESD assist circuit 404a of FIG. 4A, each of the drain of PMOS transistor P4, the first end of capacitor C2, node Nd2, the source of NMOS transistor N1, the body of NMOS transistor N1, the source of NMOS transistor N3, and the body of NMOS transistor N3 are coupled together.

The description for when an ESD event occurs at node Nd2 (e.g., ESD current I1 in the forward ESD direction) with ESD assist circuit 404d for FIG. 4D is similar to the description of when an ESD event occurs at node Nd2 for ESD assist circuit 404a of FIG. 4A, and similar detailed description is therefore omitted for brevity. In some embodiments, in response to an ESD event at node Nd2 (e.g., an ESD current I1 in the forward ESD direction), PMOS transistor P4 turns on, and is configured to clamp the voltage at node Nd3 to be equal to a voltage of node Nd2 (e.g., VSS) thereby causing the NMOS transistor N3 to turn-on. In response to being turned on, NMOS transistor N3 couples node Nd2 to node Nd1 and NMOS transistor N3 discharges the ESD current I1 in the forward ESD direction from node Nd2 to Nd1.

In some embodiments, in response to an ESD event at node Nd2 (e.g., an ESD current I1 in the forward ESD direction), a body diode of PMOS transistor P4 is configured to provide ESD protection of integrated circuit 400D by clamping the voltage of node Nd3. In some embodiments, a body diode of NMOS transistor N3 is configured to provide ESD protection of integrated circuit 400D by passing the ESD current I1 in the forward ESD direction from node Nd2 to node Nd1.

In some embodiments, by including ESD assist circuit 404d in integrated circuit 400D, integrated circuit 400D achieves one or more of the benefits discussed above in at least FIG. 1 or FIG. 4A.

Other types of circuits, configurations and arrangements of at least ESD detection circuit 402, ESD assist circuit 404d or discharging circuit 410 are within the scope of the present disclosure.

Other configurations or quantities of circuits in integrated circuit 400D are within the scope of the present disclosure.

Figure 4E:
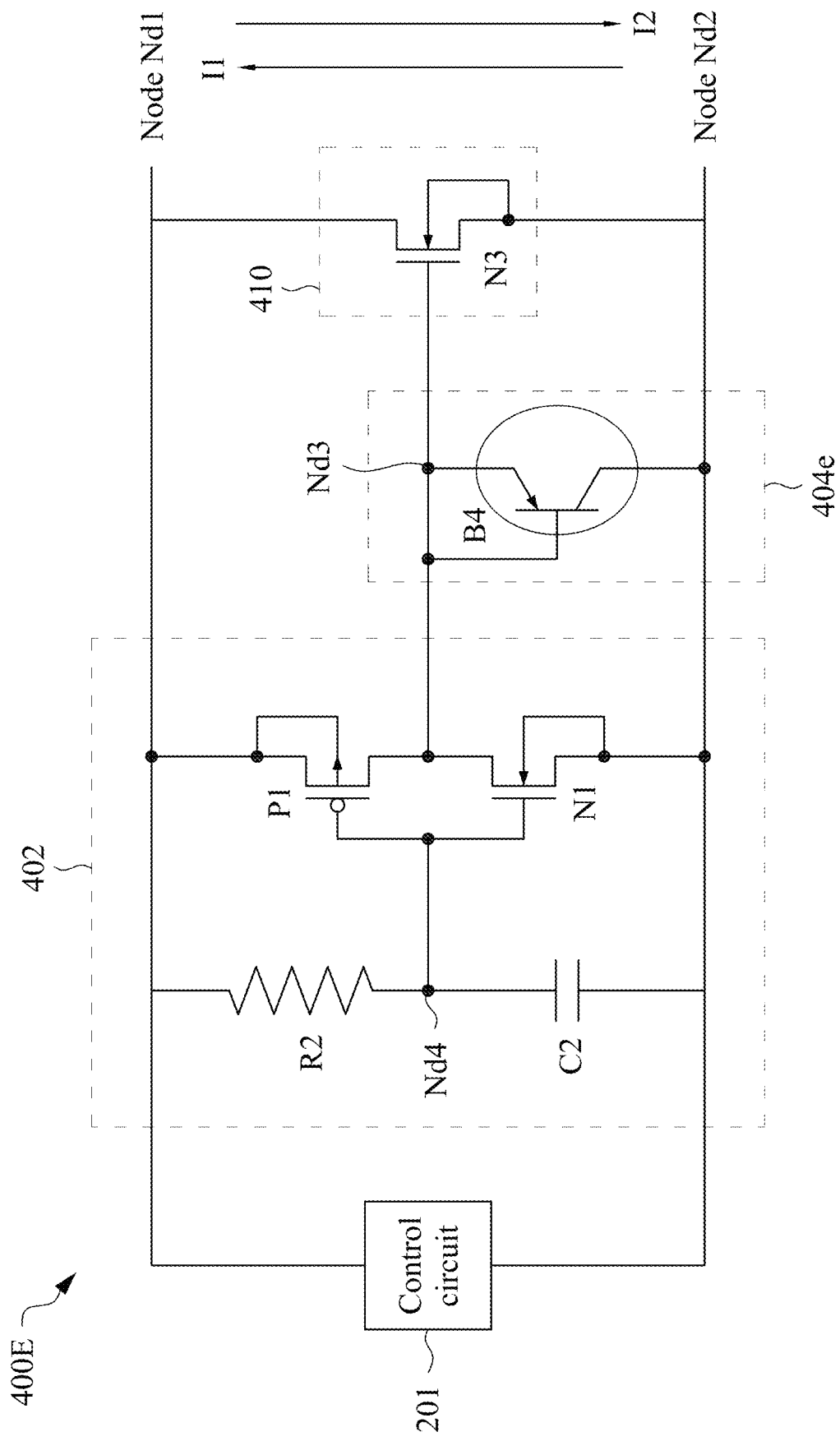

FIG. 4E is a circuit diagram of an integrated circuit 400E, in accordance with some embodiments.

Integrated circuit 400E is an embodiment of at least ESD clamp 120, and similar detailed description is therefore omitted.

Integrated circuit 400E is a variation of integrated circuit 400A of FIG. 4A, and similar detailed description is therefore omitted. In comparison with integrated circuit 400A, ESD assist circuit 404e of integrated circuit 400E replaces ESD assist circuit 404a of integrated circuit 400A, and similar detailed description is therefore omitted.

Integrated circuit 400E includes control circuit 201, ESD detection circuit 402, ESD assist circuit 404e and discharging circuit 410.

ESD assist circuit 404e is a variation of ESD assist circuit 404a of FIG. 4A, and similar detailed description is therefore omitted. In comparison with ESD assist circuit 404a, a transistor B4 of ESD assist circuit 404e replaces NMOS transistor N4 of ESD assist circuit 404a, and similar detailed description is therefore omitted. Transistor B4 is a PNP BJT.

ESD assist circuit 404e includes transistor B4. Transistor B4 includes a base, a collector and an emitter (not labelled).

In comparison with ESD assist circuit 404a of FIG. 4A, each of the emitter of transistor B4, the base of transistor B4, node Nd3, the drain of NMOS transistor N1, the drain of PMOS transistor P1, and the gate of NMOS transistor N3 are coupled together.

In comparison with ESD assist circuit 404a of FIG. 4A, each of the collector of transistor B4, the first end of capacitor C2, node Nd2, the source of NMOS transistor N1, the body of NMOS transistor N1, the source of NMOS transistor N3, and the body of NMOS transistor N3 are coupled together.

The description for when an ESD event occurs at node Nd2 (e.g., ESD current I1 in the forward ESD direction) with ESD assist circuit 404e for FIG. 4E is similar to the description of when an ESD event occurs at node Nd2 for ESD assist circuit 404a of FIG. 4A, and similar detailed description is therefore omitted for brevity. In some embodiments, in response to an ESD event at node Nd2 (e.g., an ESD current I1 in the forward ESD direction), transistor B4 turns on, and is configured to clamp the voltage at node Nd3 to be equal to a voltage of node Nd2 (e.g., VSS) thereby causing the NMOS transistor N3 to turn-on. In response to being turned on, NMOS transistor N3 couples node Nd2 to node Nd1 and NMOS transistor N3 discharges the ESD current I1 in the forward ESD direction from node Nd2 to Nd1.

In some embodiments, in response to an ESD event at node Nd2 (e.g., an ESD current I1 in the forward ESD direction), a body diode of transistor B4 is configured to provide ESD protection of integrated circuit 400E by clamping the voltage of node Nd3. In some embodiments, a body diode of NMOS transistor N3 is configured to provide ESD protection of integrated circuit 400E by passing the ESD current I1 in the forward ESD direction from node Nd2 to node Nd1.

In some embodiments, by including ESD assist circuit 404e in integrated circuit 400E, integrated circuit 400E achieves one or more of the benefits discussed above in at least FIG. 1 or FIG. 4A.

Other types of circuits, configurations and arrangements of at least ESD detection circuit 402, ESD assist circuit 404e or discharging circuit 410 are within the scope of the present disclosure.

Other configurations or quantities of circuits in integrated circuit 400E are within the scope of the present disclosure.

Figure 5A:
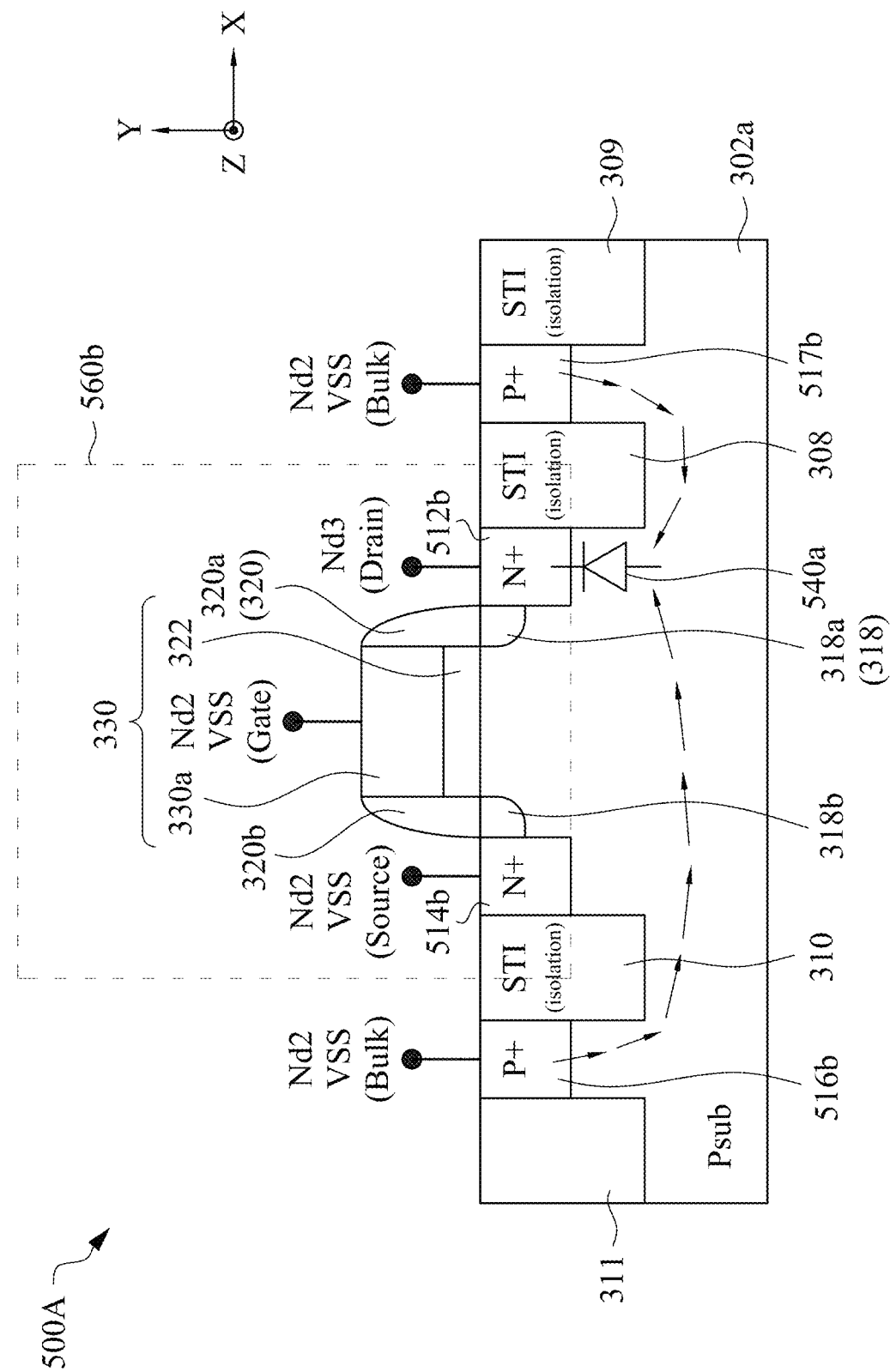
FIGS. 5A-5E are corresponding cross-sectional views of corresponding integrated circuits, in accordance with some embodiments.

FIG. 5A is a cross-sectional view of an integrated circuit 500A, in accordance with some embodiments.

Integrated circuit 500A is an embodiment of NMOS transistor N4 of ESD assist circuit 404a of FIG. 4A, and similar detailed description is therefore omitted. Integrated circuit 500A is a variation of integrated circuit 300D of FIG. 3D, and similar detailed description is therefore omitted.

In comparison with integrated circuit 300D of FIG. 3D, a drain region 512b replaces drain region 312b of FIG. 3D, a source region 514b replaces source region 314b of FIG. 3D, tap regions 516b and 517b replace corresponding tap regions 316b and 317b of FIG. 3D, transistor 560b replaces transistor 360b, and similar detailed description is therefore omitted.

Integrated circuit 500A includes substrate 302a, gate structure 330, drain region 512b, source region 514b, LDD regions 318, sidewalls 320, tap regions 516b and 517b, STI regions 308, 309, 310 and 311, and body diode 540a.

In FIG. 5A, substrate 302a is a p-type substrate having P-type dopants.

In some embodiments, drain region 512b, source region 514b, LDD regions 318, sidewalls 320 and gate structure 330 together form transistor 560b. Transistor 560b is an NMOS transistor.

Drain region 512b corresponds to the drain of NMOS transistor N4 of FIG. 4A, source region 514b corresponds to the source of NMOS transistor N4 of FIG. 4A, gate structure 330 corresponds to the gate of NMOS transistor N4 of FIG. 4A, and tap regions 516b and 517b correspond to the body of NMOS transistor N4 of FIG. 4A, and similar detailed description is therefore omitted.

The drain region 512b is coupled to node Nd3. The gate structure 330, the source region 514b and the tap regions 516b and 517b are coupled to the reference supply voltage (e.g., voltage VSS) by node Nd2. In some embodiments, each of the gate structure 330, source region 514a and tap regions 516a and 516b are coupled together at node Nd2, and are further coupled to the reference supply voltage (e.g., voltage VSS).

Integrated circuit 500A further includes a body diode 540a. Body diode 540a is a parasitic element formed by the PN junction between at least tap region 516b or 517b and the drain region 512b. In some embodiments, the body diode 540a is formed by the PN junction between the source region 514b and the drain region 512b. In some embodiments, in response to ESD events at node Nd2 in the forward direction, body diode 540a of NMOS transistor N4 is configured to provide ESD protection of integrated circuit 500A by clamping the voltage of node Nd3, and integrated circuit 500A thereby achieves one or more of the benefits discussed above in at least FIG. 1 or FIG. 4A.

Figure 5B:
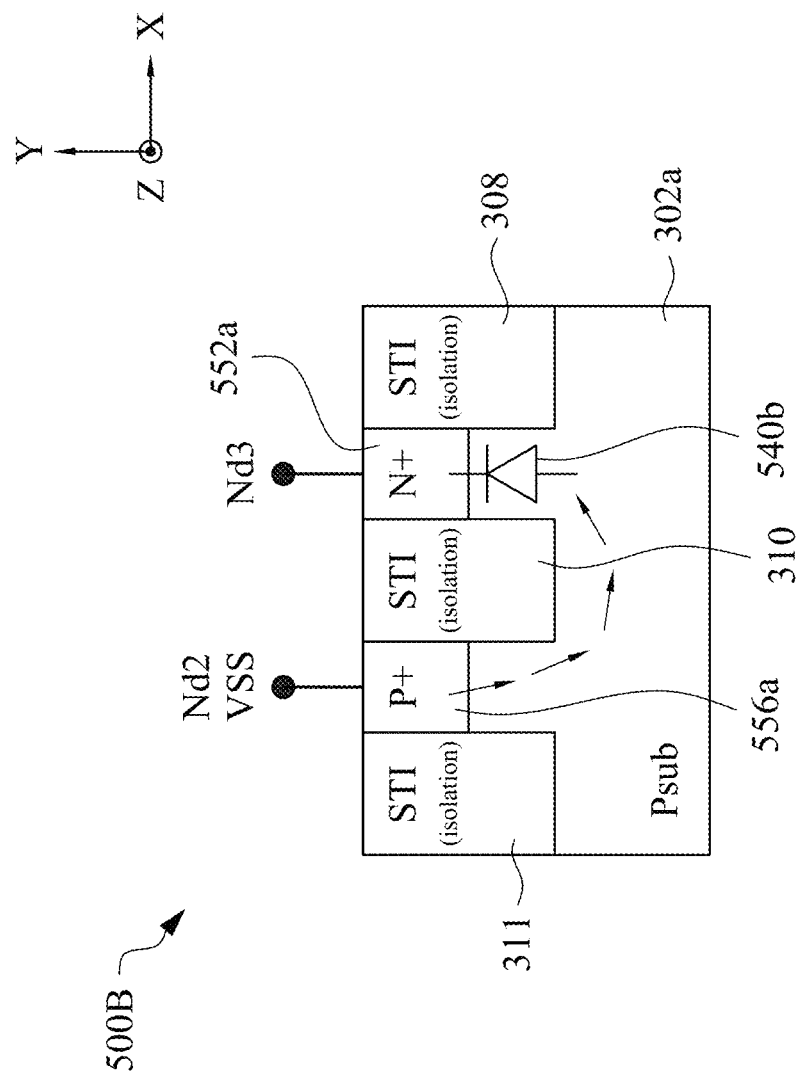

FIG. 5B is a cross-sectional view of an integrated circuit 500B, in accordance with some embodiments.

Integrated circuit 500B is an embodiment of diode D2 of ESD assist circuit 404b of FIG. 4B, and similar detailed description is therefore omitted. Integrated circuit 500B is a variation of integrated circuit 300B of FIG. 3B, and similar detailed description is therefore omitted.

Integrated circuit 500B includes substrate 302a, an N-type region 552a, a P-type region 556a, and STI regions 308, 310 and 311.

N-type region 552a is similar to the N-type region 356a in FIG. 3B, P-type region 556a is similar to the N-type region 352a in FIG. 3B, and similar detailed description is therefore omitted.

The N-type region 552a is an N+ active region having N-type dopants implanted in the well (not shown) or substrate 302a. The P-type region 556a is a P+ active region having P-type dopants implanted in the well (not shown) or substrate 302a.

N-type region 552a corresponds to the cathode of diode D2 of FIG. 4B, and P-type region 556a corresponds to the anode of diode D2 of FIG. 4B, and similar detailed description is therefore omitted.

The N-type region 552a is coupled to node Nd3 (shown in FIG. 2A). The P-type region 556a is coupled to the supply voltage (e.g., voltage VDD) by node Nd2.

Integrated circuit 500B further includes a body diode 540b. Body diode 540b is a parasitic element formed by the PN junction between the P-type region 556a and the N-type region 552a. In some embodiments, in response to ESD events at node Nd2 in the forward direction, body diode 540b is configured to provide ESD protection of integrated circuit 500B by clamping the voltage of node Nd3, and integrated circuit 500B thereby achieves one or more of the benefits discussed above in at least FIG. 1 or FIG. 4A.

Figure 5C:
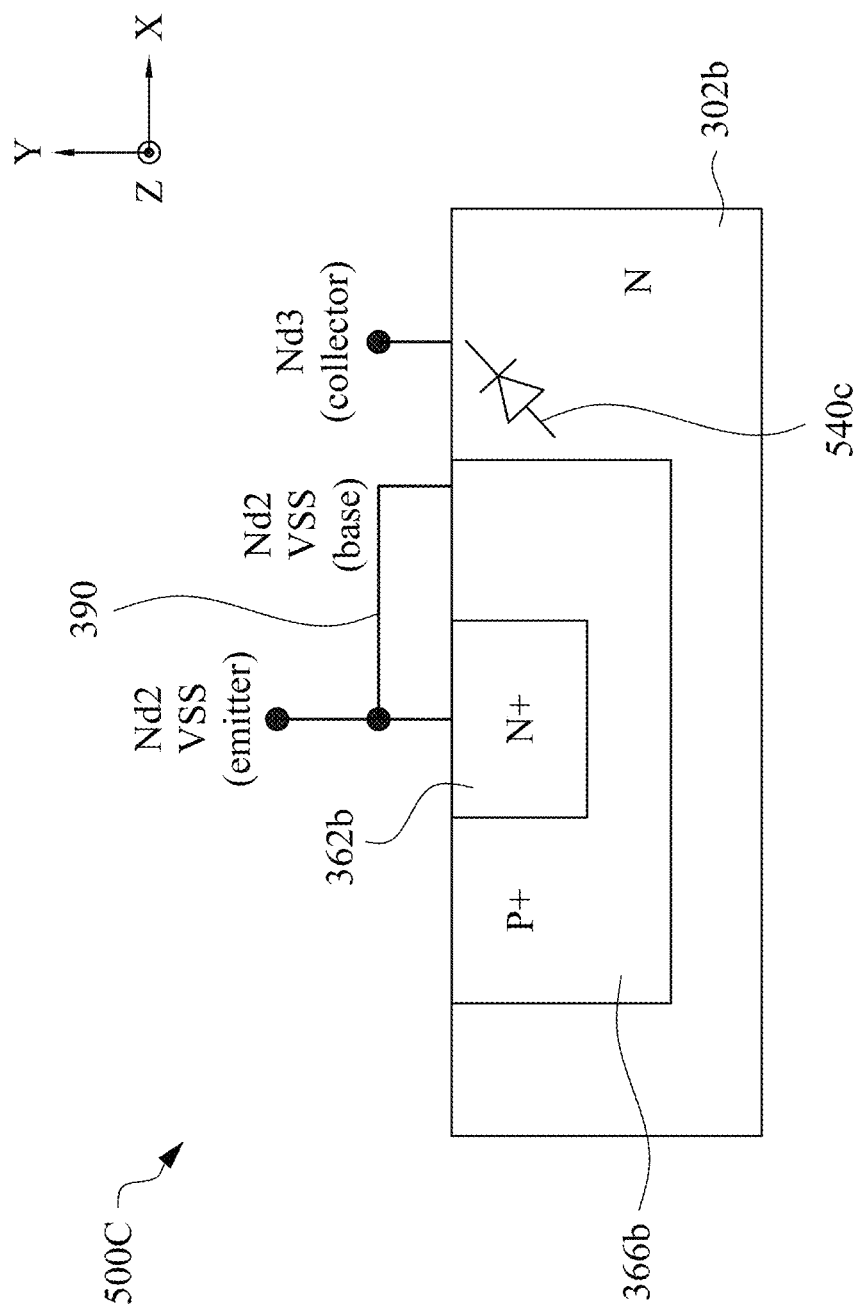

FIG. 5C is a cross-sectional view of an integrated circuit 500C, in accordance with some embodiments.

Integrated circuit 500C is an embodiment of transistor B3 of ESD assist circuit 404c of FIG. 4C, and similar detailed description is therefore omitted. Integrated circuit 500C is a variation of integrated circuit 300E of FIG. 3E, and similar detailed description is therefore omitted.

Integrated circuit 500C includes substrate 302b, N-type region 362b, and P-type region 366b.

N-type region 362b corresponds to the emitter of transistor B3 of FIG. 4C, P-type region 366b corresponds to the base of transistor B3 of FIG. 4C, substrate 302b corresponds to the collector of transistor B3 of FIG. 4C, and similar detailed description is therefore omitted.

Each of the N-type region 362b and the P-type region 366b are coupled together, and further coupled to the reference supply voltage (e.g., voltage VSS) by node Nd2. The substrate 302b is coupled to node Nd3.

Integrated circuit 500C further includes a body diode 540c. Body diode 540c is a parasitic element formed by the PN junction between the P-type region 366b and the substrate 302b. In some embodiments, in response to ESD events at node Nd2 in the forward direction, body diode 540c is configured to provide ESD protection of integrated circuit 500C by clamping the voltage of node Nd3, and integrated circuit 500C thereby achieves one or more of the benefits discussed above in at least FIG. 1 or FIG. 4A.

Figure 5D:
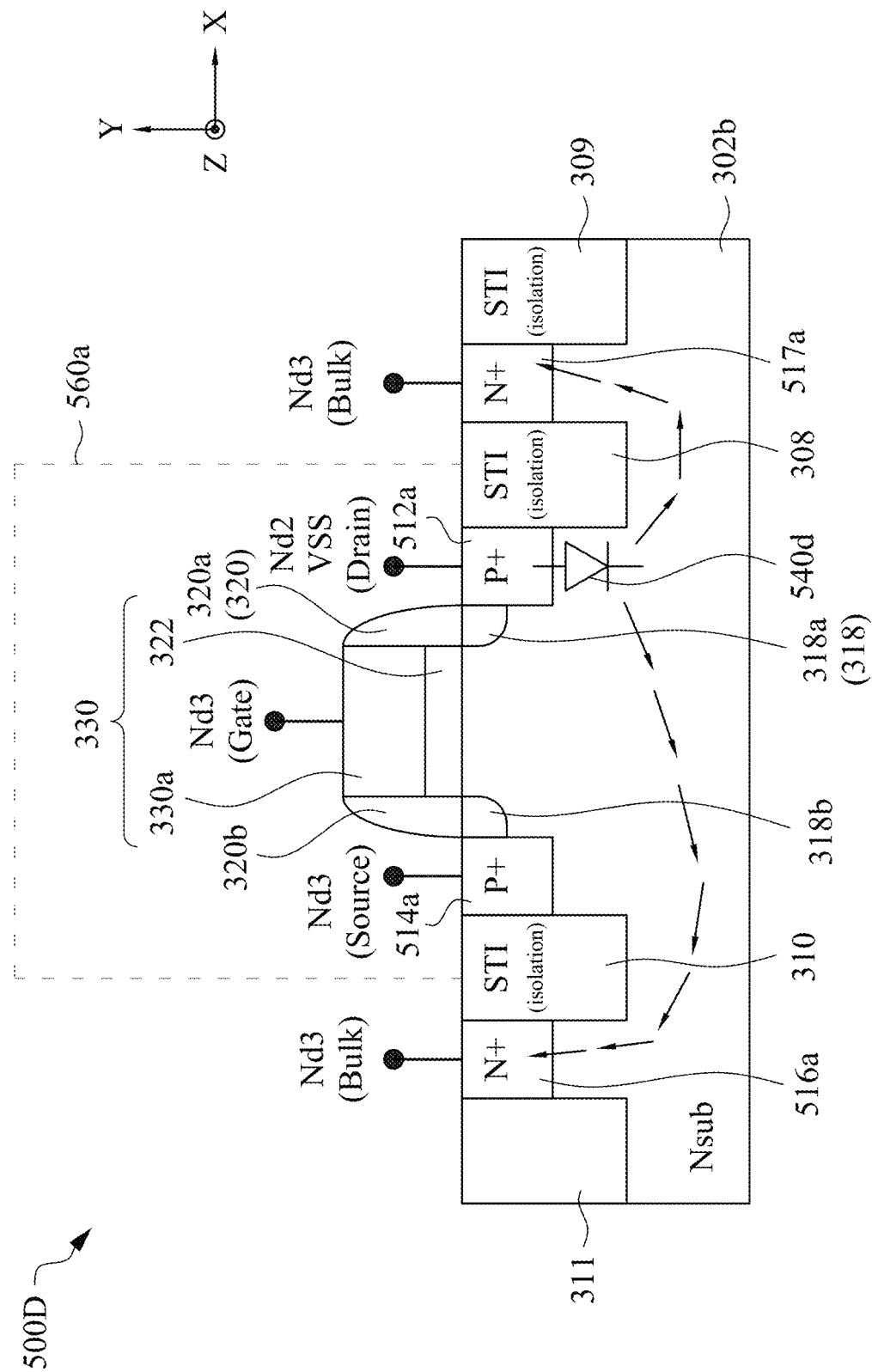

FIG. 5D is a cross-sectional view of an integrated circuit 500D, in accordance with some embodiments.

Integrated circuit 500D is an embodiment of PMOS transistor P4 of ESD assist circuit 404d of FIG. 4D, and similar detailed description is therefore omitted. Integrated circuit 500D is a variation of integrated circuit 300A of FIG. 3A, and similar detailed description is therefore omitted.

In comparison with integrated circuit 300A of FIG. 3A, a drain region 512a replaces drain region 312a of FIG. 3D, a source region 514a replaces source region 314a of FIG. 3D, tap regions 516a and 517a replace corresponding tap regions 316a and 317a of FIG. 3D, transistor 560a replaces transistor 360a, and similar detailed description is therefore omitted.

Integrated circuit 500D includes substrate 302b, gate structure 330, drain region 512a, source region 514a, LDD regions 318, sidewalls 320, tap regions 516a and 517a, STI regions 308, 309, 310 and 311, and body diode 540d.

In FIG. 5D, substrate 302b is an n-type substrate having N-type dopants.

In some embodiments, drain region 512a, source region 514a, LDD regions 318, sidewalls 320 and gate structure 330 together form transistor 560a. Transistor 560a is a PMOS transistor.

Drain region 512a corresponds to the drain of PMOS transistor P4 of FIG. 4A, source region 514a corresponds to the source of PMOS transistor P4 of FIG. 4A, gate structure 330 corresponds to the gate of PMOS transistor P4 of FIG. 4A, and tap regions 516a and 517a correspond to the body of PMOS transistor P4 of FIG. 4A, and similar detailed description is therefore omitted.

The drain region 512a is coupled to the reference supply voltage (e.g., voltage VSS) by node Nd2. The gate structure 330, the source region 514a and the tap regions 516a and 517a are coupled to node Nd3.

Integrated circuit 500D further includes a body diode 540d. Body diode 540d is a parasitic element formed by the PN junction between drain region 512a and at least tap region 516a or 517a. In some embodiments, the body diode 540d is formed by the PN junction between the drain region 512a and the source region 514a. In some embodiments, in response to ESD events at node Nd2 in the forward direction, body diode 540d of PMOS transistor P4 is configured to provide ESD protection of integrated circuit 500D by clamping the voltage of node Nd3, and integrated circuit 500D thereby achieves one or more of the benefits discussed above in at least FIG. 1 or FIG. 4A.

Figure 5E:
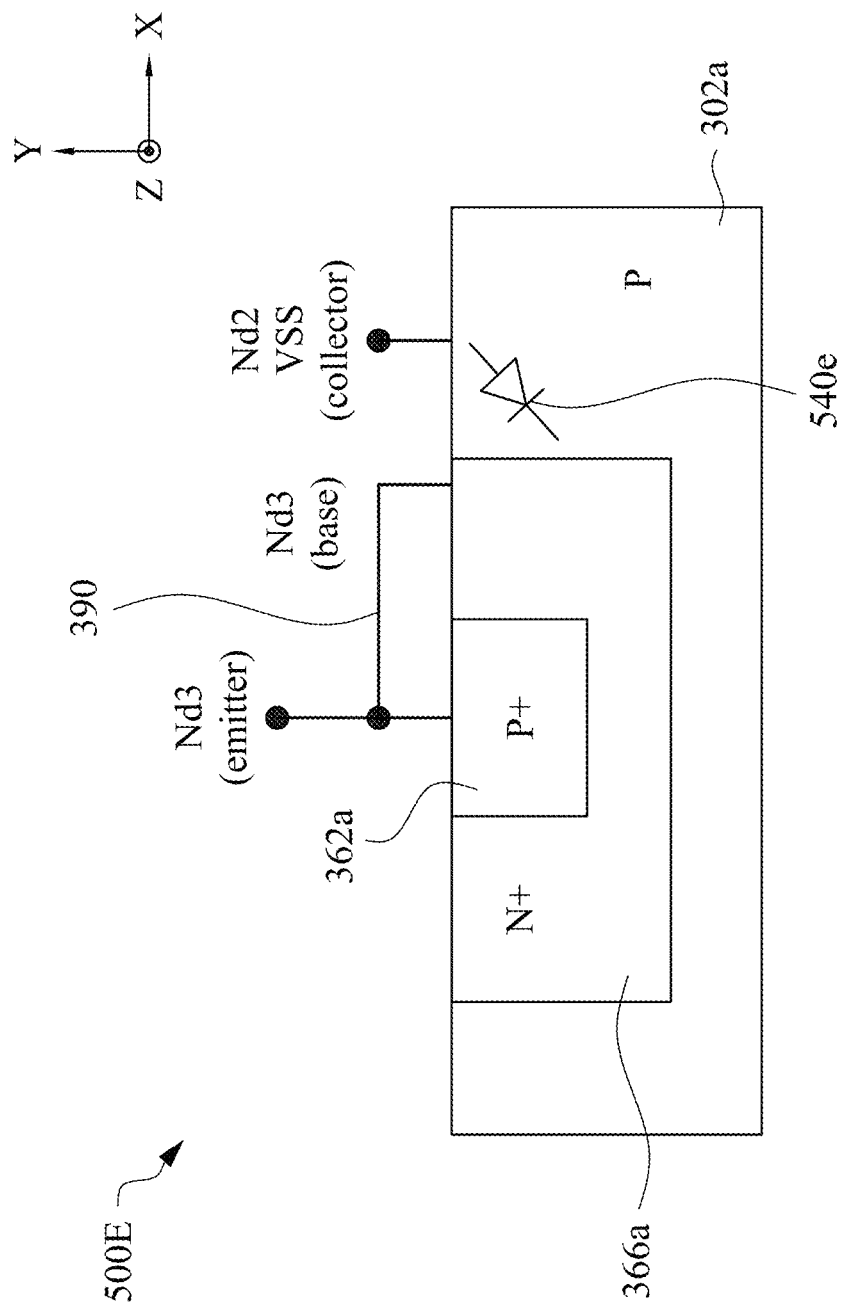

FIG. 5E is a cross-sectional view of an integrated circuit 500E, in accordance with some embodiments.

Integrated circuit 500E is an embodiment of transistor B4 of ESD assist circuit 404e of FIG. 4E, and similar detailed description is therefore omitted. Integrated circuit 500E is a variation of integrated circuit 300C of FIG. 3C, and similar detailed description is therefore omitted.

Integrated circuit 500E includes substrate 302a, P-type region 362a, and N-type region 366a.

In FIG. 5E, substrate 302a is a p-type substrate having P-type dopants.

P-type region 362a corresponds to the emitter of transistor B4 of FIG. 4E, N-type region 366a corresponds to the base of transistor B4 of FIG. 4E, substrate 302a corresponds to the collector of transistor B4 of FIG. 4E, and similar detailed description is therefore omitted.

Each of the P-type region 362a and the N-type region 366a are coupled together, and are further coupled to node Nd3. The substrate 302a is coupled to the reference supply voltage (e.g., voltage VSS) by node Nd2.

Integrated circuit 500E further includes a body diode 540e. Body diode 540e is a parasitic element formed by the PN junction between the substrate 302a and the N-type region 366a. In some embodiments, in response to ESD events at node Nd2 in the forward direction, body diode 540e is configured to provide ESD protection of integrated circuit 500E by clamping the voltage of node Nd3, and integrated circuit 500E thereby achieves one or more of the benefits discussed above in at least FIG. 1 or FIG. 4A.

Figure 6A:
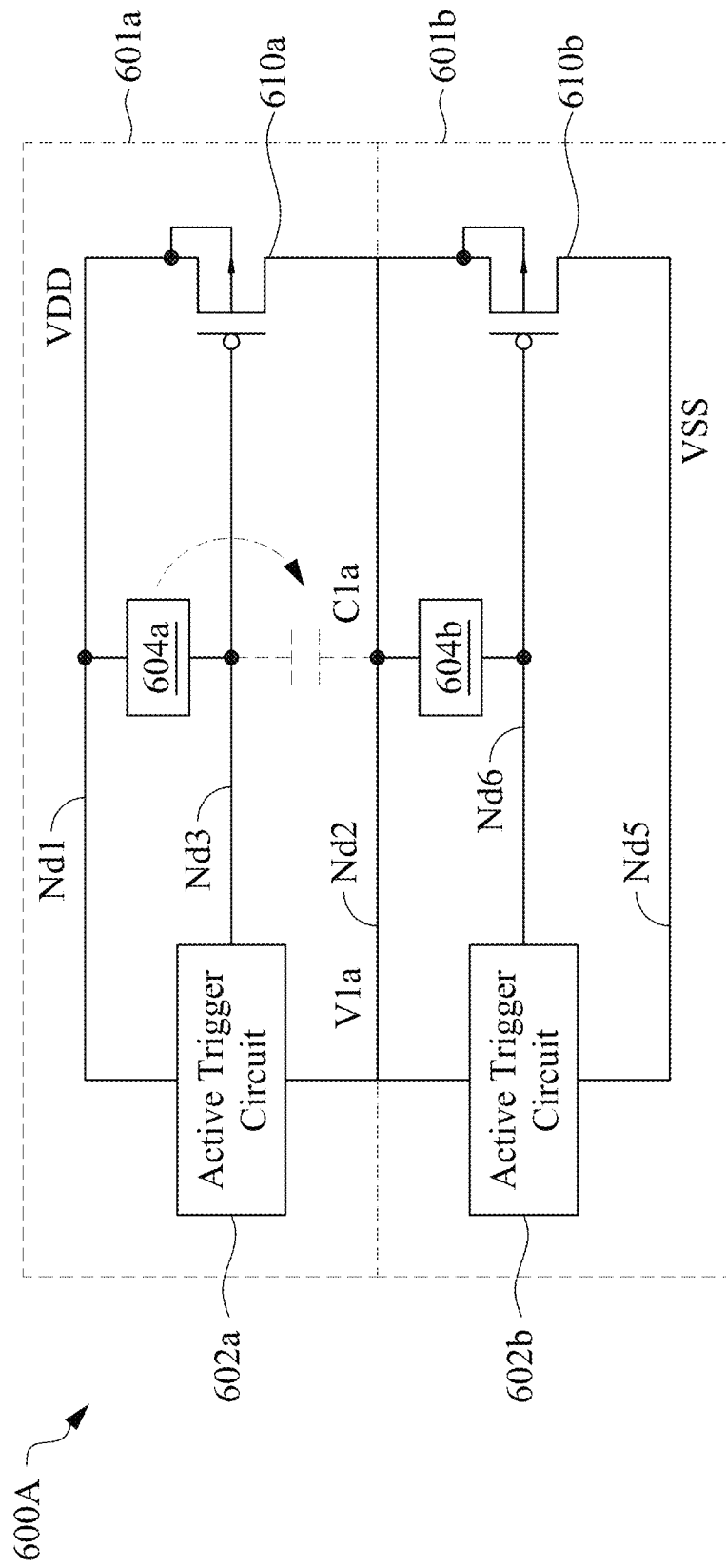
FIGS. 6A-6B are corresponding circuit diagrams of corresponding integrated circuits, in accordance with some embodiments.

FIG. 6A is a circuit diagram of an integrated circuit 600A, in accordance with some embodiments.

Integrated circuit 600A is an embodiment of at least ESD clamp 120, and similar detailed description is therefore omitted. In some embodiments, integrated circuit 600A is a 2-stacked P-type power clamp circuit.

Integrated circuit 600A includes circuits 601a and 601b arranged in a stacked configuration. In some embodiments, each of circuit 601a and circuit 601b corresponds to integrated circuit 200A, 200B, 200C, 200D or 200E arranged in a stacked configuration, and similar detailed description is therefore omitted. In some embodiments, a voltage of an ESD event is larger than a withstanding voltage of a single ESD clamp circuit, so one or more ESD clamp circuits are arranged in a stacked configuration to withstand ESD events with a voltage greater than the withstanding voltage of a single ESD clamp circuit, but less than the total withstanding voltage of a plurality of ESD clamp circuits thereby preventing failure during the ESD event.

Circuit 601a is coupled to circuit 601b at node Nd2.

Circuit 601a includes ESD detection circuit 602a, ESD assist circuit 604a and discharging circuit 610a.

Circuit 601b includes ESD detection circuit 602b, ESD assist circuit 604b and discharging circuit 610b.

Each of ESD detection circuit 601a and 601b corresponds to ESD detection circuit 202 of FIGS. 2A-2E, each of ESD assist circuit 604a and 604b corresponds to at least ESD assist circuit 204a of FIG. 2A, 204b of FIG. 2B, 204c of FIG. 2C, 204d of FIG. 2D or 204e of FIG. 2E, each of ESD discharge circuit 610a and 610b corresponds to ESD discharge circuit 210 of FIGS. 2A-2E, and similar detailed description is therefore omitted.

Circuit 601a is coupled between nodes Nd1 and Nd2.

Circuit 601b is coupled between nodes Nd2 and Nd5.

ESD detection circuit 602a is coupled between nodes Nd1 and Nd2. ESD detection circuit 602b is coupled between nodes Nd2 and Nd5. In comparison with FIGS. 2A-2E, node Nd1 has the supply voltage VDD, and node Nd5 has the reference voltage VSS.

ESD discharge circuits 610a and 610b are coupled in series across node Nd1 and node Nd5. ESD discharge circuit 610a is coupled between nodes Nd1 and Nd2. ESD discharge circuit 610b is coupled between nodes Nd2 and Nd5.

Figure 6B:
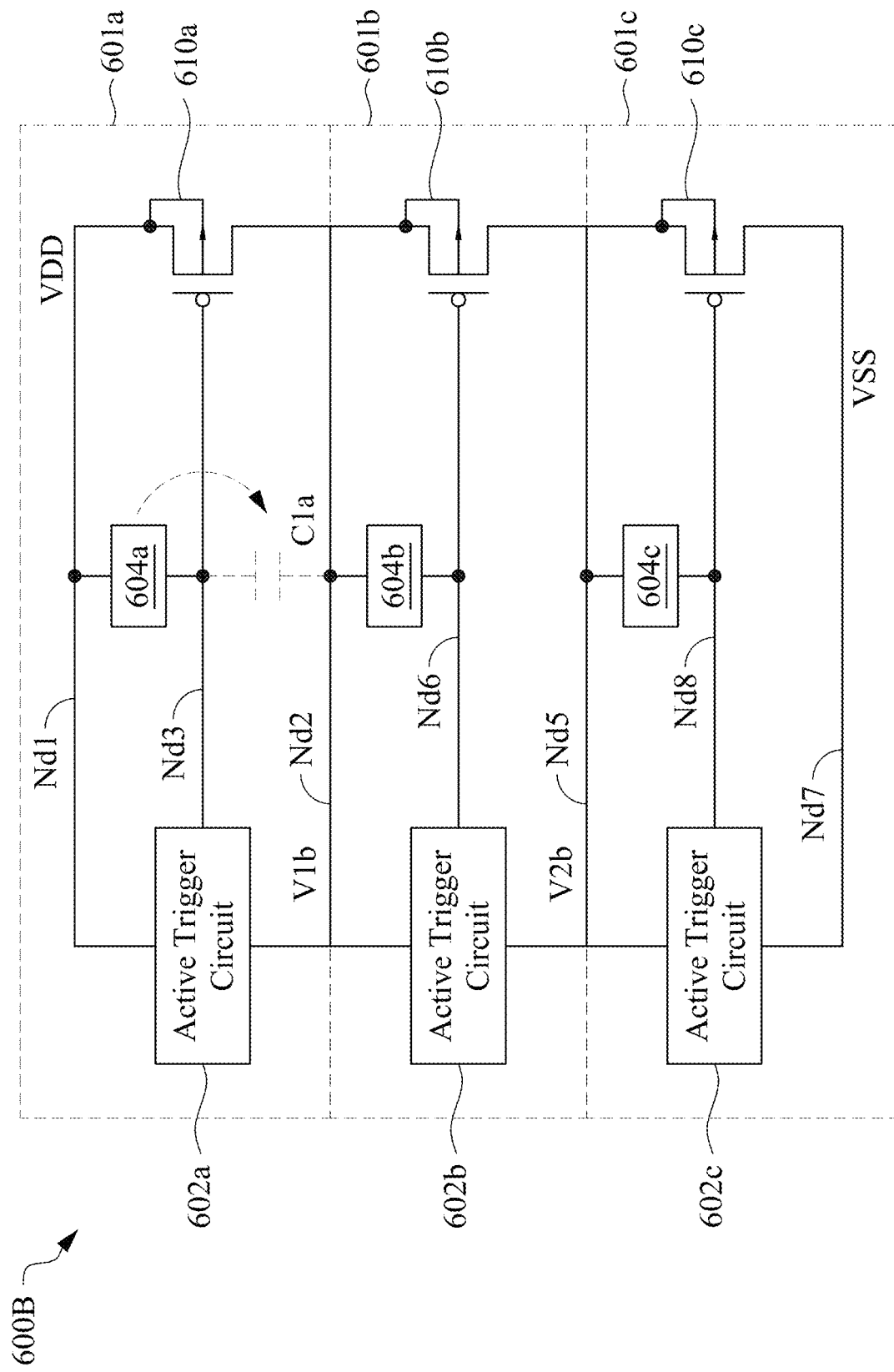

ESD assist circuit 604a is coupled between nodes Nd1 and Nd3. ESD assist circuit 604b is coupled between nodes Nd2 and Nd6. Nodes Nd6 and Nd5 in FIGS. 6A-6B are similar to corresponding nodes Nd3 and Nd2 in FIGS. 2A-2E, and similar detailed description is therefore omitted. In comparison with FIGS. 2A-2E, a voltage of node Nd5 in FIGS. 6A & 7A (described below) corresponds to reference supply voltage VSS, and a voltage of node Nd2 in FIGS. 6A & 7A corresponds to intermediate voltage V1a. In some embodiments, intermediate voltage V1a is equal to (VDD-VSS)/2.

Capacitive coupling effects between node Nd2 and Nd3 are shown by equivalent capacitor C1a. In some embodiments, by including ESD assist circuits 604a and 604b in integrated circuit 600A, capacitive coupling effects (shown by equivalent capacitor C1a) between node Nd2 and Nd3 are reduced thereby effectively lowering the turn-on resistance of ESD discharge circuits 610a and 610b, and thus causing the ESD discharge circuits 610a and 610b to turn-on faster and stronger than other approaches resulting in improved ESD performance and improved ESD robustness compared to other approaches.

Other types of circuits, configurations and arrangements of at least ESD detection circuits 602a and 602b, ESD assist circuits 604a and 604b or discharging circuits 610a and 610b are within the scope of the present disclosure.

Other configurations or quantities of circuits in integrated circuit 600A are within the scope of the present disclosure.

FIG. 6B is a circuit diagram of an integrated circuit 600B, in accordance with some embodiments.

Integrated circuit 600B is an embodiment of at least ESD clamp 120, and similar detailed description is therefore omitted. In some embodiments, integrated circuit 600B is a 3-stacked P-type power clamp circuit.

Integrated circuit 600B is a variation of integrated circuit 600A of FIG. 6A, and similar detailed description is therefore omitted. In comparison with integrated circuit 600A, integrated circuit 600B further includes circuit 601c, and similar detailed description is therefore omitted.

Circuit 601c is coupled to circuit 601b at node Nd2.

Circuit 601c includes ESD detection circuit 602c, ESD assist circuit 604c and discharging circuit 610c.

ESD detection circuit 601c corresponds to ESD detection circuit 202 of FIGS. 2A-2E, ESD assist circuit 604c corresponds to at least ESD assist circuit 204a of FIG. 2A, 204b of FIG. 2B, 204c of FIG. 2C, 204d of FIG. 2D or 204e of FIG. 2E, ESD discharge circuit 610c corresponds to ESD discharge circuit 210 of FIGS. 2A-2E, and similar detailed description is therefore omitted.

Circuit 601c is coupled between nodes Nd5 and Nd7.

ESD detection circuit 602c is coupled between nodes Nd5 and Nd7. In comparison with FIG. 6A, a voltage of node Nd7 corresponds to reference supply voltage VSS, a voltage of node Nd2 in FIGS. 6B & 7B (described below) corresponds to intermediate voltage V1b, and a voltage of node Nd5 in FIGS. 6B & 7B corresponds to intermediate voltage V2b. In some embodiments, intermediate voltage V2b is equal to (VDD-VSS)/3. In some embodiments, intermediate voltage V1b is equal to 2*(VDD-VSS)/3.

ESD discharge circuits 610a, 610b and 610c are coupled in series across node Nd1 and node Nd7. ESD discharge circuit 610c is coupled between nodes Nd5 and Nd7.

ESD assist circuit 604c is coupled between nodes Nd5 and Nd8. Nodes Nd5 and Nd8 in FIGS. 6B & 7B are similar to corresponding nodes Nd3 and Nd2 in FIGS. 2A-2E, and similar detailed description is therefore omitted.

In some embodiments, by including ESD assist circuits 604a, 604b and 604c in integrated circuit 600B, capacitive coupling effects (shown by equivalent capacitor C1a) between node Nd2 and Nd3 are reduced thereby effectively lowering the turn-on resistance of ESD discharge circuits 610a, 610b and 610c, and thus causing the ESD discharge circuits 610a, 610b and 610c to turn-on faster and stronger than other approaches resulting in improved ESD performance and improved ESD robustness compared to other approaches.

Other types of circuits, configurations and arrangements of at least ESD detection circuits 602a, 602b and 602c, ESD assist circuits 604a, 604b and 604c discharging circuits 610a, 610b and 610c are within the scope of the present disclosure.

Other configurations or quantities of circuits in integrated circuit 600B are within the scope of the present disclosure. For example, in some embodiments, integrated circuit 600B includes other numbers of circuit 601a, 601b or 601c (e.g., 3-stacked P-type power clamp circuit) than 3.

Figure 7A:
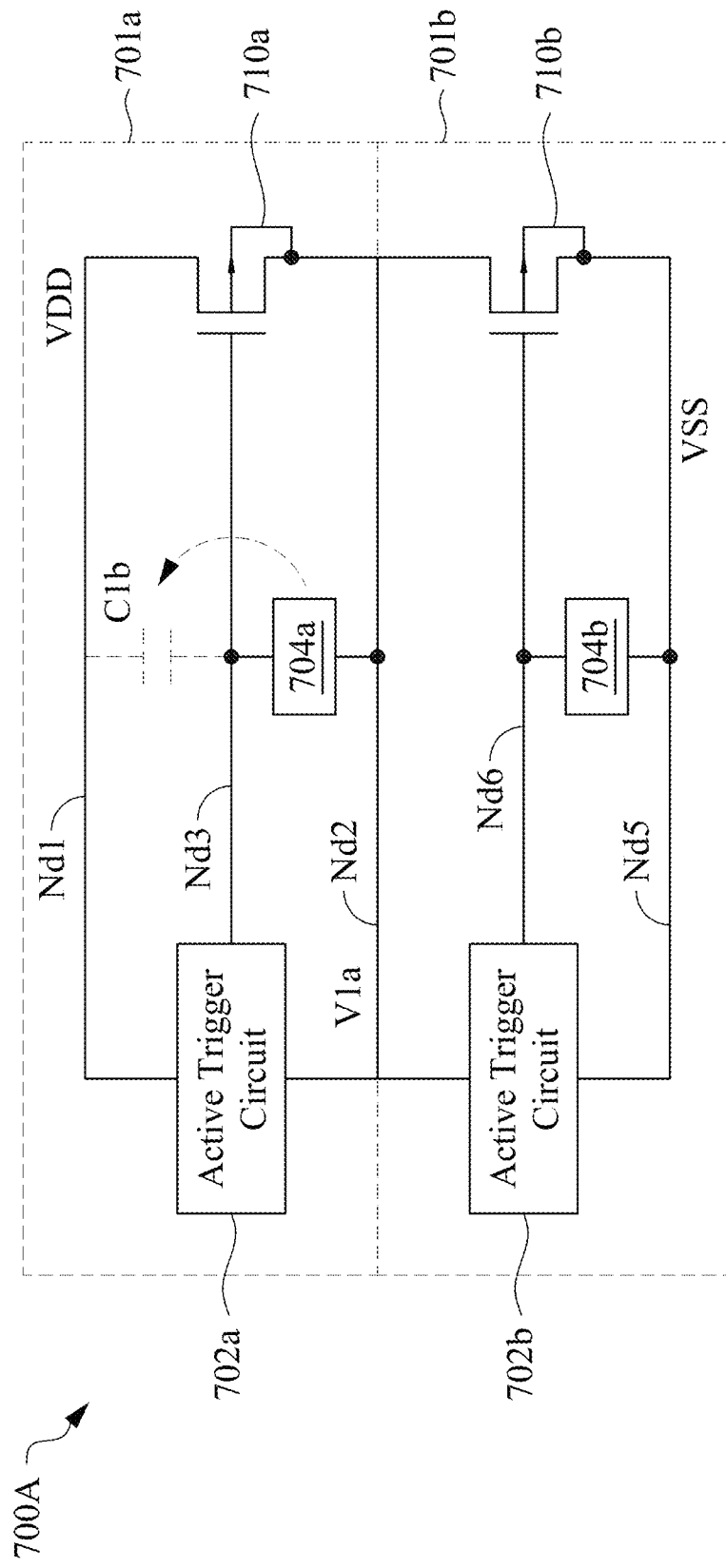
FIGS. 7A-7B are corresponding circuit diagrams of corresponding integrated circuits, in accordance with some embodiments.
Figure 7B:
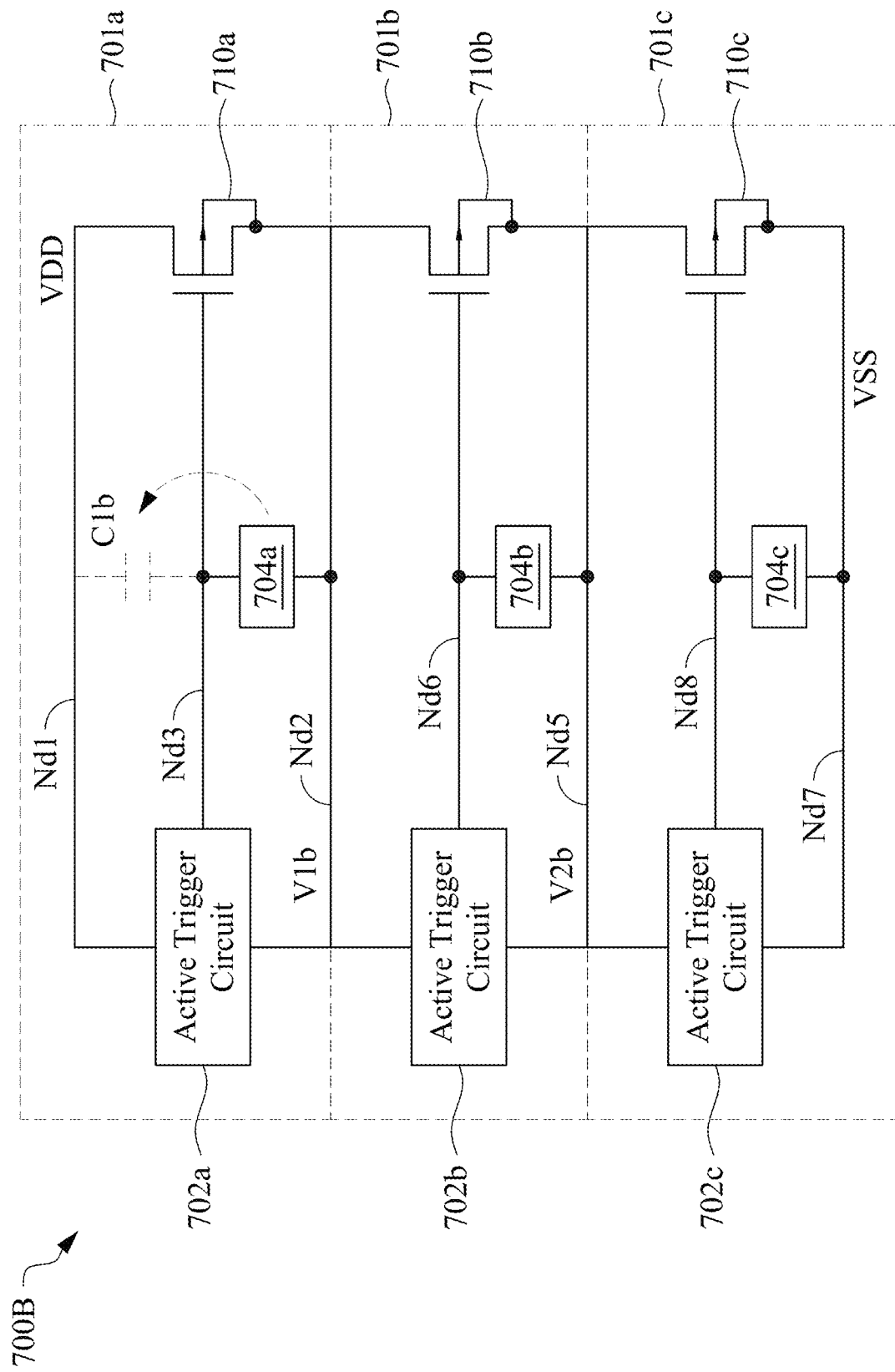

FIG. 7A is a circuit diagram of an integrated circuit 700A, in accordance with some embodiments.

Integrated circuit 700A is an embodiment of at least ESD clamp 120, and similar detailed description is therefore omitted. In some embodiments, integrated circuit 700A is a 2-stacked N-type power clamp circuit.

Integrated circuit 700A is a variation of integrated circuit 600A of FIG. 6A, and similar detailed description is therefore omitted. In comparison with integrated circuit 600A, integrated circuit 700A includes features of integrated circuit 400A-400E of FIGS. 4A-4E rather than integrated circuit 200A-200E of FIGS. 2A-2E, and similar detailed description is therefore omitted.

Integrated circuit 700A includes circuits 701a and 701b arranged in a stacked configuration. In some embodiments, each of circuit 701a and circuit 701b corresponds to integrated circuit 400A, 400B, 400C, 400D or 400E arranged in a stacked configuration, and similar detailed description is therefore omitted.

Circuit 701a is coupled to circuit 701b at node Nd2.

Circuit 701a includes ESD detection circuit 702a, ESD assist circuit 704a and discharging circuit 710a.

Circuit 701b includes ESD detection circuit 702b, ESD assist circuit 704b and discharging circuit 710b.

Each of ESD detection circuit 701a and 701b corresponds to ESD detection circuit 402 of FIGS. 4A-4E, each of ESD assist circuit 704a and 704b corresponds to at least ESD assist circuit 404a of FIG. 4A, 404b of FIG. 4B, 404c of FIG. 4C, 404d of FIG. 4D or 404e of FIG. 4E, each of ESD discharge circuit 710a and 710b corresponds to ESD discharge circuit 410 of FIGS. 4A-4E, and similar detailed description is therefore omitted.

Circuit 701a is coupled between nodes Nd1 and Nd2.

Circuit 701b is coupled between nodes Nd2 and Nd5.

ESD detection circuit 702a is coupled between nodes Nd1 and Nd2. ESD detection circuit 702b is coupled between nodes Nd2 and Nd5. In comparison with FIGS. 4A-4E, node Nd1 has the supply voltage VDD, and node Nd5 has the reference voltage VSS.

ESD discharge circuits 710a and 710b are coupled in series across node Nd1 and node Nd5. ESD discharge circuit 710a is coupled between nodes Nd1 and Nd2. ESD discharge circuit 710b is coupled between nodes Nd2 and Nd5.

ESD assist circuit 704a is coupled between nodes Nd2 and Nd3. ESD assist circuit 704b is coupled between nodes Nd5 and Nd6.

Capacitive coupling effects between node Nd1 and Nd3 are shown by equivalent capacitor C1b. In some embodiments, by including ESD assist circuits 704a and 704b in integrated circuit 700A, capacitive coupling effects (shown by equivalent capacitor C1b) between node Nd1 and Nd3 are reduced thereby effectively lowering the turn-on resistance of ESD discharge circuits 710a and 710b, and thus causing the ESD discharge circuits 710a and 710b to turn-on faster and stronger than other approaches resulting in improved ESD performance and improved ESD robustness compared to other approaches.

Other types of circuits, configurations and arrangements of at least ESD detection circuits 702a and 702b, ESD assist circuits 704a and 704b or discharging circuits 710a and 710b are within the scope of the present disclosure.

Other configurations or quantities of circuits in integrated circuit 700A are within the scope of the present disclosure.

FIG. 7B is a circuit diagram of an integrated circuit 700B, in accordance with some embodiments.

Integrated circuit 700B is an embodiment of at least ESD clamp 120, and similar detailed description is therefore omitted. In some embodiments, integrated circuit 700B is a 3-stacked N-type power clamp circuit.

Integrated circuit 700B is a variation of integrated circuit 600B of FIG. 6B and integrated circuit 700A of FIG. 7A, and similar detailed description is therefore omitted. In comparison with integrated circuit 600B, integrated circuit 700B includes features of integrated circuit 400A-400E of FIGS. 4A-4E rather than integrated circuit 200A-200E of FIGS. 2A-2E, and similar detailed description is therefore omitted. In comparison with integrated circuit 700A, integrated circuit 700B further includes circuit 701c, and similar detailed description is therefore omitted.

Circuit 701c is coupled to circuit 701b at node Nd2.

Circuit 701c includes ESD detection circuit 702c, ESD assist circuit 704c and discharging circuit 710c.

ESD detection circuit 701c corresponds to ESD detection circuit 402 of FIGS. 4A-4E, ESD assist circuit 704c corresponds to at least ESD assist circuit 404a of FIG. 4A, 404b of FIG. 4B, 404c of FIG. 4C, 404d of FIG. 4D or 404e of FIG. 4E, ESD discharge circuit 710c corresponds to ESD discharge circuit 410 of FIGS. 4A-4E, and similar detailed description is therefore omitted.

Circuit 701c is coupled between nodes Nd5 and Nd7.

ESD detection circuit 702c is coupled between nodes Nd5 and Nd7. In comparison with FIG. 7A, the voltage of node Nd7 corresponds to reference supply voltage VSS.

ESD discharge circuits 710a, 710b and 710c are coupled in series across node Nd1 and node Nd7. ESD discharge circuit 710c is coupled between nodes Nd5 and Nd7.

ESD assist circuit 704c is coupled between nodes Nd7 and Nd8. Nodes Nd7 and Nd8 in FIGS. 6B & 7B are similar to corresponding nodes Nd2 and Nd3 in FIGS. 4A-4E, and similar detailed description is therefore omitted.

In some embodiments, by including ESD assist circuits 704a, 704b and 704c in integrated circuit 700B, capacitive coupling effects (shown by equivalent capacitor C1b) between node Nd1 and Nd3 are reduced thereby effectively lowering the turn-on resistance of ESD discharge circuits 710a, 710b and 710c, and thus causing the ESD discharge circuits 710a, 710b and 710c to turn-on faster and stronger than other approaches resulting in improved ESD performance and improved ESD robustness compared to other approaches.

Other types of circuits, configurations and arrangements of at least ESD detection circuits 702a, 702b and 702c, ESD assist circuits 704a, 704b and 704c discharging circuits 710a, 710b and 710c are within the scope of the present disclosure.

Other configurations or quantities of circuits in integrated circuit 700B are within the scope of the present disclosure. For example, in some embodiments, integrated circuit 700B includes other numbers of circuit 701a, 701b or 701c (e.g., 3-stacked N-type power clamp circuit) than 3.

Figure 8A:
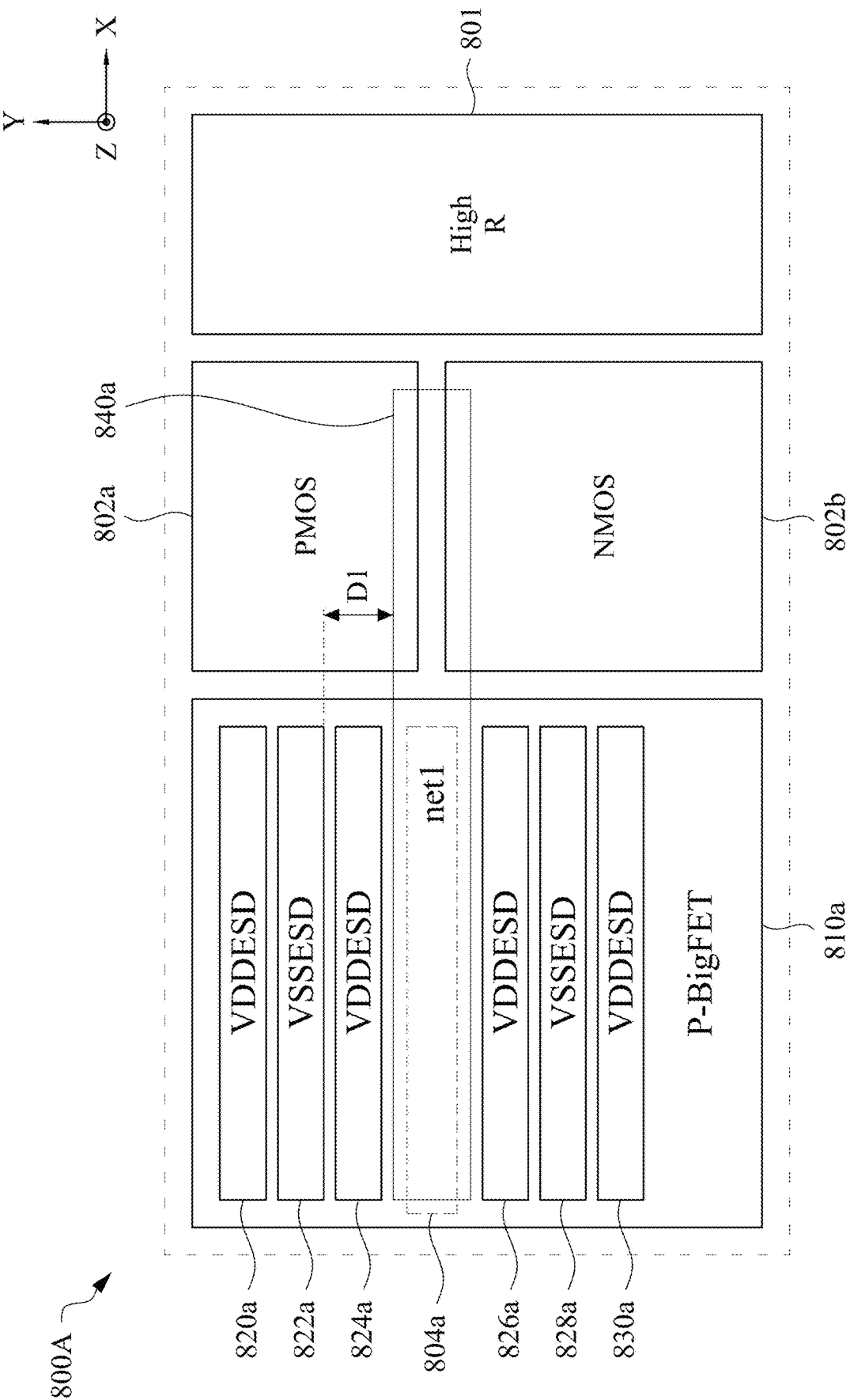
FIGS. 8A-8B are top-views of corresponding integrated circuits, in accordance with some embodiments.
Figure 8B:
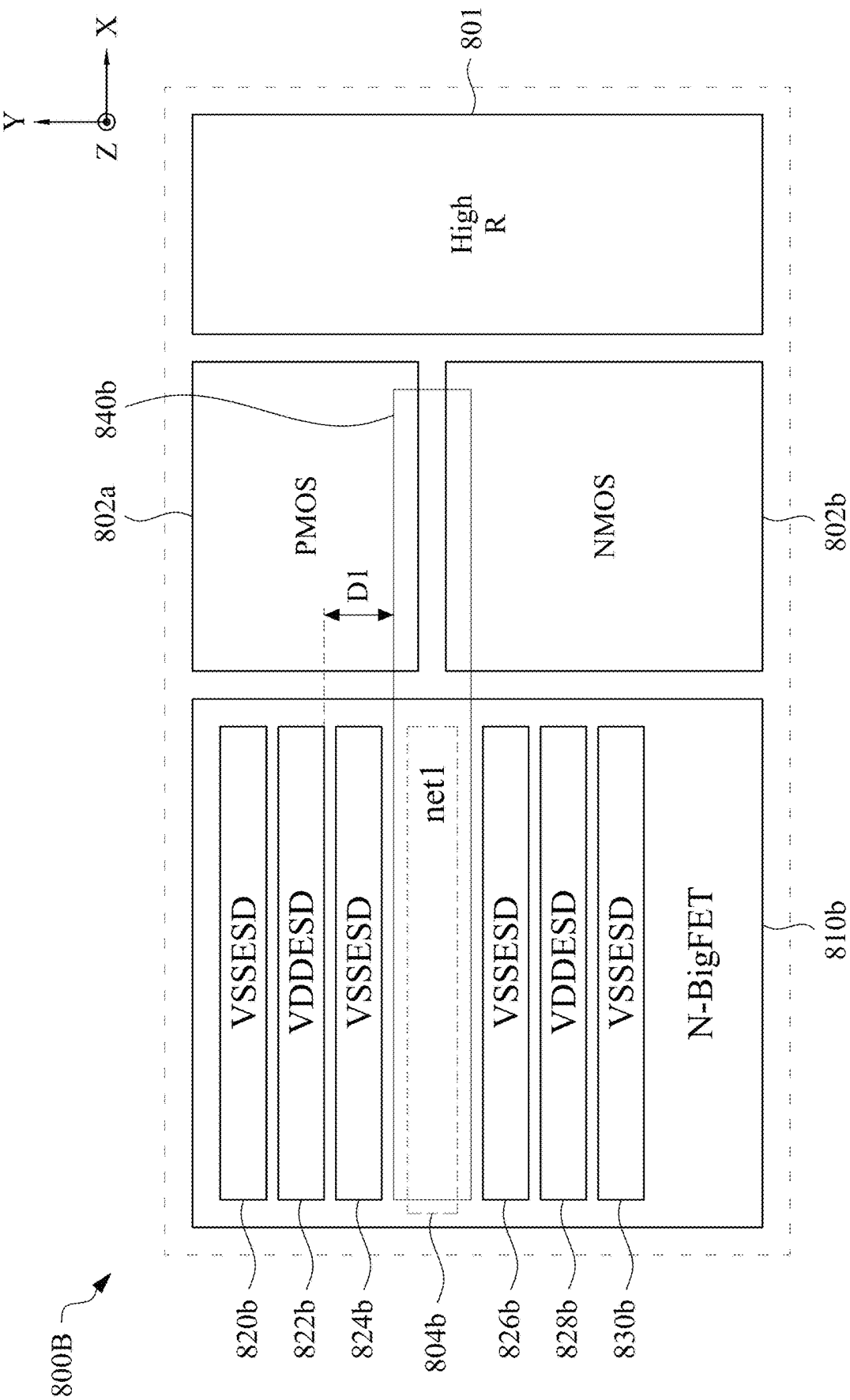

FIGS. 8A-8B are top-views of corresponding integrated circuits 800A-800B, in accordance with some embodiments.

Integrated circuits 800A-800B are embodiments of at least ESD clamp 120, and similar detailed description is therefore omitted.

Integrated circuit 800A is a top-level view of at least integrated circuit 200A, 200B, 200C, 200D or 200E, in accordance with some embodiments.

Integrated circuit 800B is a top-level view of at least integrated circuit 400A, 400B, 400C, 400D or 400E, in accordance with some embodiments.

Integrated circuit 800A or 800B is manufactured by a corresponding layout design similar to corresponding integrated circuit 800A or 800B. For brevity FIGS. 8A-8B are described as integrated circuits 800A-800B, but in some embodiments, FIGS. 8A-8B also correspond to layout designs, and structural elements of integrated circuits 800A-800B also correspond to layout patterns, and structural relationships including alignment, lengths and widths, as well as configurations and layers of a corresponding layout design of integrated circuits 800A-800B are similar to the structural relationships and configurations and layers of integrated circuits 800A-800B, and similar detailed description will not be described for brevity.

Integrated circuit 800A includes regions 801, 802a, 802b, 804a and 810a, conductive structures 820a, 822a, 824a, 826a, 828a, 830a and 840a.

Region 801 corresponds to control circuit 201 of FIGS. 2A-2E & 4A-4E, region 802a corresponds to PMOS transistor P1 of ESD detection circuit 202, region 802b corresponds to NMOS transistor N1 of ESD detection circuit 202, region 804a corresponds to at least ESD assist circuit 204a of FIG. 2A, 204b of FIG. 2B, 204c of FIG. 2C, 204d of FIG. 2D or 204e of FIG. 2E, region 810a corresponds to ESD discharge circuit 210 of FIGS. 2A-2E, and similar detailed description is therefore omitted.

Conductive structure 822a or conductive structure 828a corresponds to node Nd2 of at least ESD assist circuit 204a of FIG. 2A, 204b of FIG. 2B, 204c of FIG. 2C, 204d of FIG. 2D or 204e of FIG. 2E, and similar detailed description is therefore omitted.

Conductive structure 824a or conductive structure 826a corresponds to node Nd1 of at least ESD assist circuit 204a of FIG. 2A, 204b of FIG. 2B, 204c of FIG. 2C, 204d of FIG. 2D or 204e of FIG. 2E, and similar detailed description is therefore omitted.

Conductive structure 840a corresponds to node Nd3 of at least ESD assist circuit 204a of FIG. 2A, 204b of FIG. 2B, 204c of FIG. 2C, 204d of FIG. 2D or 204e of FIG. 2E, and similar detailed description is therefore omitted.

At least conductive structure 820a, 824a, 826a or 830a is configured to supply a supply voltage VDD. In some embodiments, at least conductive structure 820a, 824a, 826a or 830a is a power rail.

At least conductive structure 822a or 828a is configured to supply a reference supply voltage VSS. In some embodiments, at least conductive structure 822a or 828a is a reference power rail.

Each of conductive structures 820a, 822a, 824a, 826a, 828a, 830a and 840a extend in a first direction X, and are separated from each other in a second direction Y different from the first direction X. In some embodiments, each of conductive structures 820a, 822a, 824a, 826a, 828a, 830a and 840a are on a same level of integrated circuit 800A. In some embodiments, at least one of conductive structure 820a, 822a, 824a, 826a, 828a, 830a or 840a is on a different level of integrated circuit 800A from another of at least one of conductive structure 820a, 822a, 824a, 826a, 828a, 830a or 840a.

In some embodiments, at least one conductive structure of conductive structures 820a, 822a, 824a, 826a, 828a, 830a and 840a includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

Conductive structure 824a is positioned between conductive structure 804a and conductive structure 822a. Conductive structures 804a and 822a are separated from each other by a distance D1 in the second direction Y.

Conductive structure 826a is positioned between conductive structure 804a and conductive structure 828a. Conductive structures 804a and 828a are separated from each other by distance D1 in the second direction Y.

In some embodiments, conductive structure 824a is positioned between conductive structure 804a and conductive structure 822a, which causes conductive structure 804a and conductive structure 822a to be separated from each other in the second direction Y by distance D1 that is greater than other approaches, thereby results in less coupled capacitance between conductive structure 804a and conductive structure 822a than other approaches.

In some embodiments, conductive structure 826a is positioned between conductive structure 804a and conductive structure 828a, which causes conductive structure 804a and conductive structure 828a to be separated from each other in the second direction Y by distance D1 that is greater than other approaches, thereby results in less coupled capacitance between conductive structure 804a and conductive structure 828a than other approaches.

Other configurations or quantities of circuits in integrated circuit 800A are within the scope of the present disclosure.

Integrated circuit 800B is a top-level view of at least integrated circuit 400A, 400B, 400C, 400D or 400E, in accordance with some embodiments.

Integrated circuit 800B is a variation of integrated circuit 800A of FIG. 8A, and similar detailed description is therefore omitted. In comparison with integrated circuit 800A, region 804b of FIG. 8B replaces region 804a, region 810b of FIG. 8B replaces region 810a, conductive structures 820b, 822b, 824b, 826b, 828b, 830b and 840b replace corresponding conductive structures 820a, 822a, 824a, 826a, 828a, 830a and 840a, and similar detailed description is therefore omitted.

Integrated circuit 800B includes regions 801, 802a, 802b, 804b and 810b, conductive structures 820b, 822b, 824b, 826b, 828b, 830b and 840b.

Region 804b corresponds to at least ESD assist circuit 404a, 404b, 404c, 404d or 404e of corresponding FIGS. 4A-4E, region 810b corresponds to ESD discharge circuit 410 of FIGS. 4A-4E, and similar detailed description is therefore omitted.

Conductive structure 822b or conductive structure 828b corresponds to node Nd1 of at least ESD assist circuit 404a, 404b, 404c, 404d or 404e of corresponding FIGS. 4A-4E, and similar detailed description is therefore omitted.

Conductive structure 824b or conductive structure 826b corresponds to node Nd2 of at least ESD assist circuit 404a, 404b, 404c, 404d or 404e of corresponding FIGS. 4A-4E, and similar detailed description is therefore omitted.

Conductive structure 840b corresponds to node Nd3 of at least ESD assist circuit 404a, 404b, 404c, 404d or 404e of corresponding FIGS. 4A-4E, and similar detailed description is therefore omitted.

At least conductive structure 820b, 824b, 826b or 830b is configured to supply the reference supply voltage VSS. In some embodiments, at least conductive structure 820b, 824b, 826b or 830b is a reference power rail.

At least conductive structure 822b or 828b is configured to supply the supply voltage VDD. In some embodiments, at least conductive structure 822b or 828b is a power rail.

In some embodiments, each of conductive structures 820b, 822b, 824b, 826b, 828b, 830b and 840b are on a same level of integrated circuit 800B. In some embodiments, at least one of conductive structure 820b, 822b, 824b, 826b, 828b, 830b or 840b is on a different level of integrated circuit 800B from another of at least one of conductive structure 820b, 822b, 824b, 826b, 828b, 830b or 840b.

Conductive structure 824b is positioned between conductive structure 804b and conductive structure 822b. Conductive structures 804b and 822b are separated from each other by distance D1 in the second direction Y.

Conductive structure 826b is positioned between conductive structure 804b and conductive structure 828b. Conductive structures 804b and 828b are separated from each other by distance D1 in the second direction Y.

In some embodiments, conductive structure 824b is positioned between conductive structure 804b and conductive structure 822b, which causes conductive structure 804b and conductive structure 822b to be separated from each other in the second direction Y by distance D1 that is greater than other approaches, thereby results in less coupled capacitance between conductive structure 804b and conductive structure 822b than other approaches.

In some embodiments, conductive structure 826b is positioned between conductive structure 804b and conductive structure 828b, which causes conductive structure 804b and conductive structure 828b to be separated from each other in the second direction Y by distance D1 that is greater than other approaches, thereby results in less coupled capacitance between conductive structure 804b and conductive structure 828b than other approaches.

Other configurations or quantities of circuits in integrated circuit 800B are within the scope of the present disclosure.

Figure 9:
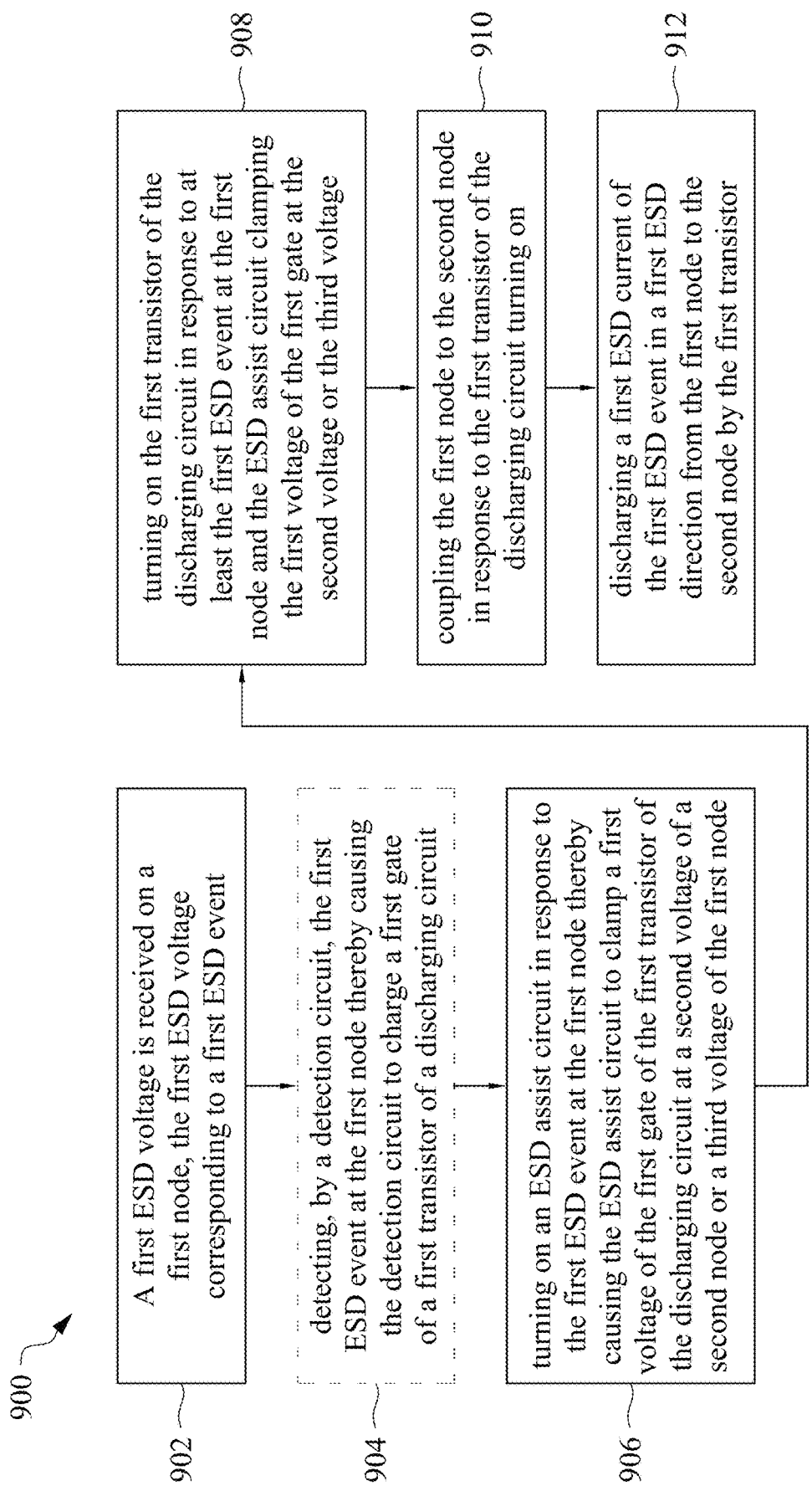
FIG. 9 is a flowchart of a method of operating an ESD circuit, in accordance with some embodiments.

FIG. 9 is a flowchart of a method 900 of operating an ESD circuit, in accordance with some embodiments.

In some embodiments, the ESD circuit of method 900 includes at least integrated circuit 100, 200A-200E, 300A-

300E, 400A-400E, 500A-500E, 600A-600B, 700A-700B and 800A-800B (FIGS. 1, 2A-2E, 3A-3E, 4A-4E, 5A-5E, 6A-6B, 7A-7B and 8A-8B). It is understood that additional operations may be performed before, during, and/or after the method 900 depicted in FIG. 9, and that some other processes may only be briefly described herein. It is understood that method 900 utilizes features of one or more of integrated circuit 100, 200A-200E, 300A-300E, 400A-400E, 500A-500E, 600A-600B, 700A-700B and 800A-800B. Other order of operations of method 900 with respect to at least integrated circuit 100, 200A-200E, 300A-300E, 400A-400E, 500A-500E, 600A-600B, 700A-700B or 800A-800B is within the scope of the present disclosure.

At operation 902 of method 900, a first ESD voltage is received on a first node. In some embodiments, the first node of method 900 includes node Nd2. In some embodiments, the first ESD voltage is greater than a reference supply voltage VSS of node Nd2. In some embodiments, the first ESD voltage corresponds to a first ESD event.

At operation 904, a detection circuit detects the first ESD event at the first node thereby causing the detection circuit to charge a first gate of a first transistor of a discharging circuit.

In some embodiments, the detection circuit of method 900 includes at least detection circuit 202 or 402. In some embodiments, the discharging circuit of method 900 includes at least discharging circuit 210 or 410. In some embodiments, the first transistor of the discharging circuit of method 900 includes at least PMOS transistor P2 or NMOS transistor N3.

In some embodiments, the discharging circuit is coupled between the first node and a second node. In some embodiments, the detection circuit is coupled to the first node, the second node and a third node.

In some embodiments, the second node of method 900 includes node Nd1. In some embodiments, the third node of method 900 includes node Nd3 or Nd4.

At operation 906, an ESD assist circuit is turned on in response to the first ESD event at the first node thereby causing the ESD assist circuit to clamp a first voltage of the first gate of the first transistor of the discharging circuit at a second voltage of a second node or a third voltage of the first node.

In some embodiments, the ESD assist circuit of method 900 includes at least ESD assist circuit 204a, 204b, 204c, 204d, 204e, 404a, 404b, 404c, 404d or 404e. In some embodiments, the ESD assist circuit of method 900 includes at least integrated circuit 300A, 300B, 300C, 300D, 300E, 500A, 500B, 500C, 500D or 500E.

In some embodiments, the first voltage of method 900 is the voltage of node Nd3. In some embodiments, the second voltage of the second node of method 900 is the voltage (e.g., VDD) of node Nd1. In some embodiments, the third voltage of the first node of method 900 is the voltage (e.g., VSS) of node Nd2.

In some embodiments, the ESD assist circuit is coupled between at least the first node and the third node.

In some embodiments, the ESD assist circuit includes a body diode. In some embodiments, the body diode of method 900 includes at least body diode 340a, 340b, 340c, 340d, 340e, 540a, 540b, 540c, 540d or 540e.

At operation 908, the first transistor of the discharging circuit is turned on in response to at least the first ESD event at the first node and the ESD assist circuit clamping the first voltage of the first gate at the second voltage or the third voltage. In some embodiments, operation 908 further includes the first transistor of the discharging circuit being turned on in response to the first gate of the first transistor being charged.

At operation 910, the first node is coupled to the second node in response to the first transistor of the discharging circuit turning on.

At operation 912 a first ESD current of the first ESD event at the first node is discharged in a first ESD direction from the first node to the second node by the first transistor. In some embodiments, operation 912 further includes the first ESD current of the first ESD event at the first node being discharged in the first ESD direction from the first node to the second node by at least a channel of the first transistor or a body diode of the first transistor.

In some embodiments, the first ESD current corresponds to the forward ESD direction. In some embodiments, the first ESD current includes the ESD current I1 in the forward ESD direction from node Nd2 to node Nd1.

In some embodiments, one or more of the operations of method 900 is not performed. In some embodiments, one or more of the operations of method 900 is repeated. In some embodiments, method 900 is repeated.

In some embodiments, method 900 and 1000 (discussed below) thereby achieves one or more of the benefits discussed above in at least FIG. 1, 2A-2E, 3A-3E, 4A-4E, 5A-5E, 6A-6B, 7A-7B or 8A-8B.

Figure 10:
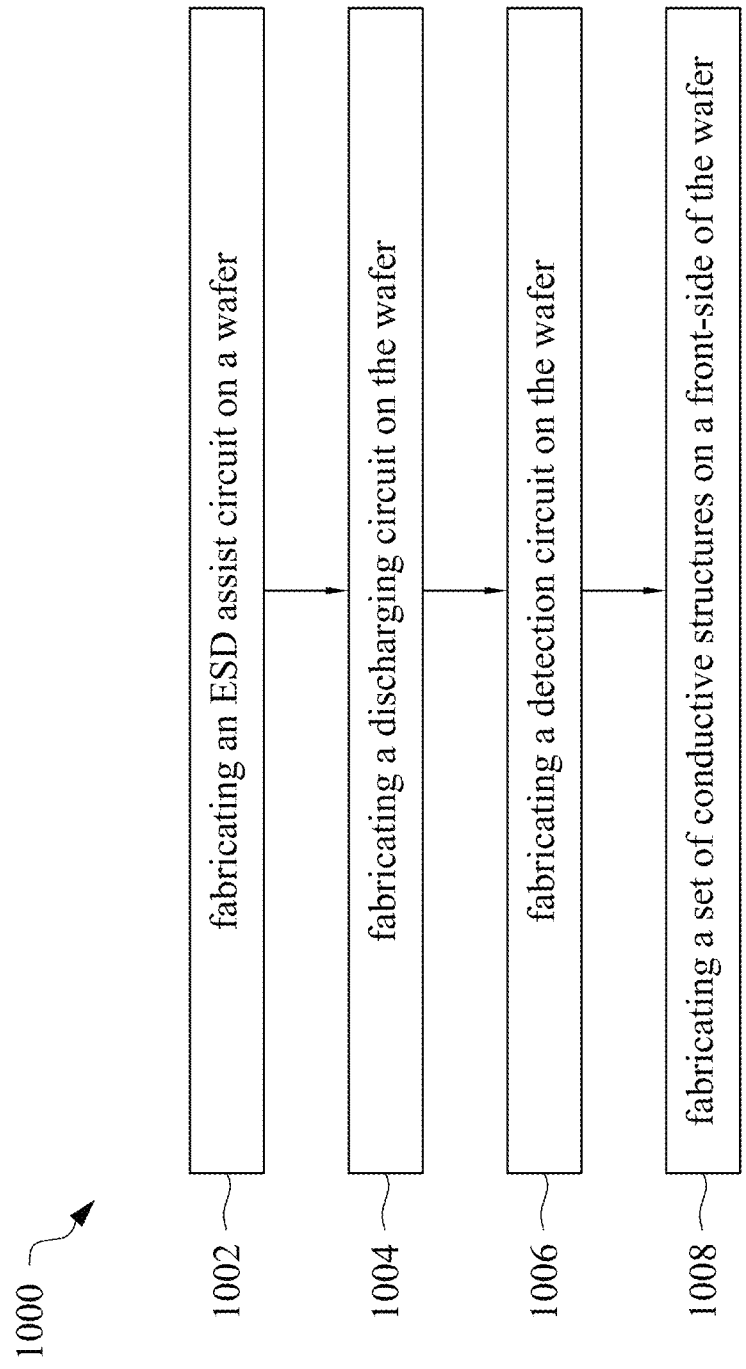
FIG. 10 is a flow chart of a method of manufacturing an integrated circuit, in accordance with some embodiments.

FIG. 10 is a flow chart of a method 1000 of manufacturing an integrated circuit, in accordance with some embodiments.

In some embodiments, the method 1000 is usable to manufacture or fabricate at least integrated circuit 100, 200A-200E, 300A-300E, 400A-400E, 500A-500E, 600A-600B, 700A-700B and 800A-800B (FIGS. 1, 2A-2E, 3A-3E, 4A-4E, 5A-5E, 6A-6B, 7A-7B and 8A-8B).

It is understood that additional operations may be performed before, during, and/or after the method 1000 depicted in FIG. 10, and that some other processes may only be briefly described herein. It is understood that method 1000 utilizes features of one or more of integrated circuit 100, 200A-200E, 300A-300E, 400A-400E, 500A-500E, 600A-600B, 700A-700B and 800A-800B.

Other order of operations of method 1000 with respect to at least integrated circuit 100, 200A-200E, 300A-300E, 400A-400E, 500A-500E, 600A-600B, 700A-700B or 800A-800B is within the scope of the present disclosure.

Method 1000 is applicable to at least integrated circuit 500A, 500B or 500C. Method 1000 is described with respect to integrated circuit 500A, 500B or 500C. However, method 1000 is also applicable to integrated circuit 100-100B, 200A-200B, 300A-300B or 400A-400C. Other order of operations of method 1000 with respect to integrated circuit 500A, 500B or 500C is within the scope of the present disclosure.

In operation 1002 of method 1000, an ESD assist circuit is fabricated on a wafer. In some embodiments, the ESD assist circuit of method 1000 includes at least ESD assist circuit 204a, 204b, 204c, 204d, 204e, 404a, 404b, 404c, 404d or 404e. In some embodiments, the ESD assist circuit of method 1000 includes at least ESD assist circuit 300A, 300B, 300C, 300D, 300E, 500A, 500B, 500C, 500D or 500E. In some embodiments, the wafer of method 1000 includes substrate 302a or 302b.

In some embodiments, operation 1002 includes fabricating at least integrated circuit 300A, 300B, 300C, 300D, 300E, 500A, 500B, 500C, 500D or 500E.

In some embodiments, operation 1002 includes fabricating at least integrated circuit 300A or 500D where a first well is fabricated in a substrate, a drain region and a source region of a transistor is fabricated in the first well, and a first gate structure is fabricated. In these embodiments, the substrate is substrate 302a which includes p-type dopants, the first well (not shown) includes n-type dopants, the drain region is drain region 312a or 512a which includes p-type dopants, and the source region is source region 314a or 514a which includes p-type dopants, and the first gate structure is gate 330. In some embodiments, the p-dopants include boron, aluminum or other suitable p-type dopants.

In some embodiments, the first well comprises n-type dopants. In some embodiments, the n-dopants include phosphorus, arsenic or other suitable n-type dopants. In some embodiments, the first well comprises an epi-layer grown over substrate 302a or 302b. In some embodiments, the epi-layer is doped by adding dopants during the epitaxial process. In some embodiments, the epi-layer is doped by ion implantation after the epi-layer is formed. In some embodiments, the first well is formed by doping substrate 302a or 302b. In some embodiments, the doping is performed by ion implantation. In some embodiments, the first well has a dopant concentration ranging from $1 \times 10^{12}$ atoms/cm$^3$ to $1 \times 10^{14}$ atoms/cm$^3$. Other values or ranges of dopant concentrations for the first well are within the scope of the present disclosure.

In some embodiments, the drain region of transistor 360a or 560a is fabricated in the first well. In these embodiments, the drain region extends in the second direction Y, and has the p-type dopants. In some embodiments, the source region of transistor 360a or 560a is fabricated in the first well. In these embodiments, the source region extends in the second direction Y, and has the p-type dopants.

In some embodiments, operation 1002 includes fabricating at least integrated circuit 300D or 500A where a drain region and a source region of a transistor are fabricated in the substrate, and a first gate structure is fabricated. In these embodiments, the substrate is substrate 302a which includes p-type dopants, the drain region is drain region 312b or 512b which includes n-type dopants, and the source region is source region 314b or 514b which includes n-type dopants, and the first gate structure is gate 330.

In some embodiments, the formation of the source/drain features of at least transistor 360b or 560b in the substrate includes, removing a portion of the substrate to form recesses at an edge of each spacer 320a, 320b, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as STI region 308, 309, 310 or 311. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate.

In some embodiments, a portion of the substrate is removed by an isotropic or an anisotropic etch process. The etch process selectively etches the substrate without etching gate structure 230 and spacers 220. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate 302a or 302b. In some embodiments, the source/drain features include epitaxially grown silicon (epi Si), silicon carbide, or silicon germanium. Source/drain features of the IC device associated with gate structure 330 are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, at least fabricating the gate regions of operation 1002, 1004 or 1006 (described below) includes at least fabricating gate structure 330. In some embodiments, at least fabricating the gate regions of operation 1002, 1004 or 1006 (described below) includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof. Other materials for the gate regions are within the scope of the present disclosure.

In some embodiments, operation 1002 includes fabricating integrated circuit 300B where P-type region 352a and N-type region 356a are formed in substrate 302a, and the formation of P-type region 352a and N-type region 356a are similar to the formation of source/drain regions of at least integrated circuit 300A, 300D, 500A or 500D, and similar detailed description is therefore omitted.

In some embodiments, operation 1002 includes fabricating integrated circuit 500B where N-type region 552a and P-type region 556a are formed in substrate 302a, and the formation of N-type region 552a and P-type region 556a are similar to the formation of source/drain regions of at least integrated circuit 300A, 300D, 500A or 500D, and similar detailed description is therefore omitted.

In some embodiments, operation 1002 includes fabricating integrated circuit 300C or 500E where N-type region 366a is formed in substrate 302a, P-type region 362a is formed in N-type region 366a, and the formation of P-type region 362a and N-type region 366a are similar to the formation of source/drain regions of at least integrated circuit 300A, 300D, 500A or 500D, and similar detailed description is therefore omitted.

In some embodiments, operation 1002 includes fabricating integrated circuit 300E or 500C where P-type region 366b is formed in substrate 302b, N-type region 362b is formed in P-type region 366b, and the formation of N-type region 362b and P-type region 366b are similar to the formation of source/drain regions of at least integrated circuit 300A, 300D, 500A or 500D, and similar detailed description is therefore omitted.

In some embodiments, the regions with p-type dopants of sources/drains, tap regions, p-type region have a dopant concentration ranging from $1\times10^{12}$ atoms/cm$^3$ to $1\times10^{14}$ atoms/cm$^3$. Other values or ranges of dopant concentrations for p-type dopants are within the scope of the present disclosure. In some embodiments, the regions with n-type dopants of sources/drains, tap regions, n-type region have a dopant concentration ranging from $1\times10^{12}$ atoms/cm$^3$ to $1\times10^{14}$ atoms/cm$^3$. Other values or ranges of dopant concentrations for n-type dopants are within the scope of the present disclosure.

In some embodiments, at least operation 1002, 1004 or 1006 further includes fabricating a signal tap region on the front-side of the wafer. In some embodiments, the signal tap region of method 1000 includes at least tap region 316a, 316b, 317a, 317b, 516a, 516b, 517a or 517b.

In some embodiments, at least tap region 316a, 316b, 317a, 317b, 516a, 516b, 517a or 517b is a heavily doped p-region. In some embodiments, at least tap region 316a, 316b, 317a, 317b, 516a, 516b, 517a or 517b is a heavily doped n-region.

In some embodiments, at least tap region 316a, 316b, 317a, 317b, 516a, 516b, 517a or 517b is formed by ion implantation. The power of the ion implantation ranges from about 1500 k electron volts (eV) to about 8000 k eV. Other values or ranges of power for ion implantation are within the scope of the present disclosure.

In some embodiments, tap region 316a, 316b, 317a, 317b, 516a, 516b, 517a or 517b is epitaxially grown. In some embodiments, tap region 316a, 316b, 317a, 317b, 516a, 516b, 517a or 517b comprises an epi-layer grown over substrate 302a or 302b. In some embodiments, the epi-layer is doped by adding dopants during the epitaxial process. In some embodiments, the epi-layer is doped by ion implantation after the epi-layer is formed. In some embodiments, tap region 316a, 316b, 317a, 317b, 516a, 516b, 517a or 517b is formed by doping substrate 302a or 302b. In some embodiments, the doping is performed by ion implantation. In some embodiments, tap region 316a, 316b, 317a, 317b, 516a, 516b, 517a or 517b has a dopant concentration ranging from $1\times10^{12}$ atoms/cm$^3$ to $1\times10^{14}$ atoms/cm$^3$. Other values or ranges of dopant concentrations for tap region 316a, 316b, 317a, 317b, 516a, 516b, 517a or 517b are within the scope of the present disclosure.

In operation 1004 of method 1000, a discharging circuit is fabricated on the wafer. In some embodiments, the discharging circuit of method 1000 includes at least discharging circuit 210 or 410. In some embodiments, the discharging circuit of method 1000 includes at least NMOS transistor N3 or PMOS transistor P2.

In some embodiments, operation 1004 includes fabricating a second well in a substrate, fabricating a second source region in the second well, fabricating a second drain region in the second well, and fabricating a second gate structure. In some embodiments, operation 1004 includes fabricating the second source region in the substrate, fabricating the second drain region in the substrate, and fabricating the second gate structure.

In some embodiments, at least fabricating the second source/drain regions or the second gate structure of operation 1004 is similar to the formation of first source/drain regions or the first gate structure of operation 1002 (described above), and similar detailed description is omitted.

In operation 1006 of method 1000, a detection circuit is fabricated on the wafer. In some embodiments, the detection circuit of method 1000 includes at least detection circuit 202 or 402. In some embodiments, the detection circuit of method 1000 includes at least capacitor C1 or C2, resistor R1 or R2, NMOS transistor N1 or PMOS transistor P1.

In some embodiments, operation 1006 includes fabricating a third well in a substrate, fabricating a third source region in the third well, fabricating a third drain region in the third well, and fabricating a third gate structure. In some embodiments, operation 1006 includes fabricating the third source region in the substrate, fabricating the third drain region in the substrate, and fabricating the third gate structure.

In some embodiments, at least fabricating the third source/drain regions or the third gate structure of operation 1006 is similar to the formation of first source/drain regions or the first gate structure of operation 1002 (described above), and similar detailed description is omitted.

In some embodiments, capacitor C1 or C2 of method 1000 is a transistor-coupled capacitor, and fabricating the transistor-coupled capacitor is similar to fabricating the NMOS transistor N1 or PMOS transistor P1, but the drain, source and body are coupled together, and similar detailed description is omitted. In some embodiments, operation 1006 is repeated to form NMOS transistor N1, PMOS transistor P1 and at least capacitor C1 or C2.

In operation 1008 of method 1000, a set of conductive structures is fabricated on a front-side of the wafer. In some embodiments, operation 1008 includes depositing the set of conductive structures on the front-side of the wafer. In some embodiments, the set of conductive structures of method 1000 includes at least conductive structure 390. In some embodiments, the set of conductive structures of method 1000 includes conductive structures (not shown) configured to connect one or more of the gate, the drain, the source, the body, node Nd1, node Nd2 or node Nd3 of FIG. 3A-3B, 3D, 5A-5B or 5D, are similar to conductive structure 390, and similar detailed description is omitted.

In some embodiments, the set of conductive structures of method 1000 are formed using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

In some embodiments, one or more of the operations of method 1000 is not performed. In some embodiments, one or more of the operations of method 1000 is repeated. In some embodiments, method 1000 is repeated.

Other diode types or numbers of diodes, or transistor types or other numbers of transistors in at least integrated circuit 100, 200A-200E, 300A-300E, 400A-400E, 500A-500E, 600A-600B, 700A-700B and 800A-800B of corresponding FIGS. 1, 2A-2E, 3A-3E, 4A-4E, 5A-5E, 6A-6B, 7A-7B and 8A-8B are within the scope of the present disclosure.

Furthermore, various NMOS or PMOS transistors shown in FIGS. 2A-2E and 4A-4E are of a particular dopant type (e.g., N-type or P-type) and are for illustration purposes. Embodiments of the disclosure are not limited to a particular transistor type, and one or more of the PMOS or NMOS transistors shown in FIGS. 2A-2E and 4A-4E can be substituted with a corresponding transistor of a different transistor/dopant type. Similarly, the low or high logical value of various signals used in the above description is also used for illustration. Embodiments of the disclosure are not limited to a particular logical value when a signal is activated and/or deactivated. Selecting different logical values is within the scope of various embodiments. Selecting different numbers of NMOS/PMOS transistors in 2A-2E and 4A-4E is within the scope of various embodiments.

One aspect of this description relates to an electrostatic discharge (ESD) circuit. In some embodiments, the ESD circuit includes an ESD detection circuit, a clamp circuit and an ESD assist circuit. In some embodiments, the ESD detection circuit is coupled between a first node and a second node. In some embodiments, the first node has a first voltage, and the second node has a second voltage. In some embodiments, the clamp circuit includes a first transistor of a first type. In some embodiments, the first transistor has a first gate, a first drain, a first source and a first body terminal. In some embodiments, the first gate is coupled to at least the ESD detection circuit by a third node. In some embodiments, the first drain is coupled to the second node, and the first source and the first body terminal are coupled together at the first node. In some embodiments, the ESD assist circuit is coupled between the first node and the third node, and is configured to clamp a third voltage of the third node at the first voltage during an ESD event at the first node or the second node.

Another aspect of this description relates to an ESD circuit. The ESD circuit includes a first diode, a second diode, an internal circuit and an ESD clamp circuit. In some embodiments, the first diode is coupled between a first node and an input output (IO) pad. In some embodiments, the second diode is coupled between the IO pad and a second node. In some embodiments, the internal circuit is coupled to the first diode, the second diode and the IO pad. In some embodiments, the ESD clamp circuit is between the first node and the second node. In some embodiments, the ESD clamp circuit includes a first ESD detection circuit, a first clamp circuit and a first ESD assist circuit. In some embodiments, the first ESD detection circuit is coupled between the first node and the second node. In some embodiments, the first node has a first voltage and the second node has a second voltage. In some embodiments, the first clamp circuit includes a first transistor of a first type. In some embodiments, the first transistor has a first gate, a first drain, a first source and a first body terminal. In some embodiments, the first gate is coupled to at least the first ESD detection circuit by a third node, the first drain is coupled to the second node, and the first source and the first body terminal are coupled together at the first node. In some embodiments, the first ESD assist circuit is coupled between the first node and the third node, and configured to clamp a third voltage of the third node at the first voltage during an ESD event at the second node.

Yet another aspect of this description relates to a method of operating an ESD circuit. The method includes receiving a first ESD voltage on a first node, the first ESD voltage being greater than a reference supply voltage of a reference voltage supply, the first ESD voltage corresponding to a first ESD event. In some embodiments, the method further includes turning on an ESD assist circuit in response to the first ESD event at the first node thereby causing the ESD assist circuit to clamp a first voltage of a first gate of a first transistor of a discharging circuit at a second voltage of a second node, the discharging circuit being coupled between the first node and the second node, and the ESD assist circuit being coupled between at least the first node and a third node, and the ESD assist circuit including a body diode. In some embodiments, the method further includes turning on the discharging circuit in response to the first ESD event and the ESD assist circuit clamping the first voltage of the first gate at the second voltage. In some embodiments, the method further includes discharging a first ESD current of the first ESD event in a first ESD direction from the first node to the second node by the first transistor.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, or the like) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrostatic discharge (ESD) circuit comprising:
    a first ESD detection circuit coupled between a first node and a second node, the first node having a first voltage and the second node having a second voltage;
    a first clamp circuit comprising a first transistor of a first type, the first transistor having a first gate, a first drain, a first source and a first body terminal, the first gate is coupled to at least the first ESD detection circuit by a third node, the first drain is coupled to the second node, and the first source and the first body terminal are coupled together at the first node;
    a first ESD assist circuit coupled between the first node and the third node, and configured to clamp a third voltage of the third node at the first voltage during an ESD event at the first node or the second node;
    a second ESD detection circuit coupled between the second node and a fourth node, the fourth node having a fourth voltage;
    a second clamp circuit comprising a second transistor of the first type, the second transistor having a second gate, a second drain, a second source, and a second body terminal, the second gate coupled to at least the second ESD detection circuit by a fifth node, the second drain coupled to the fourth node, and the second source and the second body terminal coupled together at the second node; and
    a second ESD assist circuit coupled between the second node and the fifth node, and configured to clamp a fifth voltage of the fifth node at the second voltage during an ESD event at the fourth node.

2. The ESD circuit of claim 1, wherein the first ESD assist circuit comprises:
    a diode coupled between the first node and the third node, the diode having an anode coupled to the third node, the first gate and the first ESD detection circuit, and a cathode coupled to the first node, the first source and the first body terminal.

3. The ESD circuit of claim 1, wherein the first ESD assist circuit comprises:
    a third transistor of the first type, and having a third gate, a third drain, a third source, and a third body terminal, the third drain being coupled to the third node, the first gate and the first ESD detection circuit, and each of the first node, the first source, the first body terminal, the third gate, the third source and the third body terminal being coupled together.

4. The ESD circuit of claim 3, wherein the third transistor comprises:
    a first active region in a substrate, the first active region corresponding to the third drain of the third transistor;
    a second active region in the substrate, the second active region corresponding to the third source of the third transistor; and
    a third active region in the substrate, the third active region corresponding to the third body terminal of the third transistor,
    wherein the second active region and the third active region are coupled together, and the first active region and the third active region are configured as a body diode of the third transistor.

5. The ESD circuit of claim 1, wherein the first ESD assist circuit comprises:
    a first bipolar junction transistor having a first base, a first collector and a first emitter, the first collector being coupled to the third node, the first gate and the first ESD detection circuit, and each of the first node, the first base, the first emitter, the first source, and the first body terminal being coupled together.

6. The ESD circuit of claim 1, wherein the first ESD assist circuit comprises:
    a third transistor of a second type different from the first type, and having a third gate, a third drain, a third source, and a third body terminal, the third drain being coupled to the first node, the third source and the third body terminal, and each of the third gate, the third source, the third body terminal, the third node, the first gate and the first ESD detection circuit being coupled together.

7. The ESD circuit of claim 6, wherein the third transistor comprises:
    a first active region in a substrate, the first active region corresponding to the third drain of the third transistor;
    a second active region in the substrate, the second active region corresponding to the third source of the third transistor; and
    a third active region in the substrate, the third active region corresponding to the third body terminal of the third transistor,
    wherein the second active region and the third active region are coupled together, and the first active region and the third active region are configured as a body diode of the third transistor.

8. The ESD circuit of claim 1, wherein the first ESD assist circuit comprises:
    a first bipolar junction transistor having a first base, a first collector and a first emitter, the first collector being coupled to the first node, the first source and the first body terminal, and each of the first emitter, the first base, the third node, the first gate and the first ESD detection circuit being coupled together.

9. The ESD circuit of claim 1, wherein the first ESD assist circuit comprises:
    a diode coupled between the first node and the third node, the diode having a cathode coupled to the third node, the first gate and the first ESD detection circuit, and an anode coupled to the first node, the first source and the first body terminal.

10. The ESD circuit of claim 1, further comprising:
    a first conductive line extending in a first direction, and configured to supply the first voltage;
    a second conductive line extending in the first direction, and configured to supply the second voltage;
    a third conductive line extending in the first direction, and the third conductive line including the third node;
    a fourth conductive line extending in the first direction, and configured to supply the first voltage;
    a fifth conductive line extending in the first direction, and configured to supply the second voltage;
    wherein the first node is part of the first conductive line or the fourth conductive line;
    the second node is part of the second conductive line or the fifth conductive line;
    each of the first conductive line, the second conductive line, the third conductive line, the fourth conductive line and the fifth conductive line are separated from each other in a second direction different from the first direction;
    the third conductive line is between the first conductive line and the fourth conductive line;

the first conductive line is between the third conductive line and the second conductive line; and the fourth conductive line is between the third conductive line and the fifth conductive line.

11. An electrostatic discharge (ESD) circuit comprising:
a first diode coupled between a first node and an input output (IO) pad;
a second diode coupled between the IO pad and a second node;
an internal circuit coupled to the first diode, the second diode and the IO pad; and
an ESD clamp circuit between the first node and the second node, the ESD clamp circuit comprising:
  a first ESD detection circuit coupled between the first node and the second node, the first node having a first voltage and the second node having a second voltage;
  a first clamp circuit comprising a first transistor of a first type, the first transistor having a first gate, a first drain, a first source and a first body terminal, the first gate being coupled to at least the first ESD detection circuit by a third node, the first drain being coupled to the second node, and the first source and the first body terminal coupled together at the first node;
  a first ESD assist circuit coupled between the first node and the third node, and configured to clamp a third voltage of the third node at the first voltage during an ESD event at the second node;
  a second ESD detection circuit coupled between the second node and a fourth node, the fourth node having a fourth voltage;
  a second clamp circuit comprising a second transistor of the first type, the second transistor having a second gate, a second drain, a second source, and a second body terminal, the second gate coupled to at least the second ESD detection circuit by a fifth node, the second drain coupled to the fourth node, and the second source and the second body terminal coupled together at the second node; and
  a second ESD assist circuit coupled between the second node and the fifth node, and configured to clamp a fifth voltage of the fifth node at the second voltage during an ESD event at the fourth node.

12. The ESD circuit of claim 11, wherein the ESD clamp circuit further comprises:
a third ESD detection circuit coupled between the fourth node and a sixth node, the sixth node having a sixth voltage;
a third clamp circuit comprising a third transistor of the first type, the third transistor having a third gate, a third drain, a third source, and a third body terminal, the third gate coupled to at least the third ESD detection circuit by a seventh node, the third drain coupled to the sixth node, and the third source and the third body terminal coupled together at the fourth node; and
a third ESD assist circuit coupled between the fourth node and the seventh node, and configured to clamp a seventh voltage of the seventh node at the fourth voltage during an ESD event at the sixth node.

13. The ESD circuit of claim 11, wherein the first ESD detection circuit comprises:
a resistor coupled between the second node and an input node;
a capacitor coupled between the input node and the first node; and
an inverter coupled to the first node, the second node, the third node, the input node, the first gate and the first ESD assist circuit.

14. The ESD circuit of claim 13, wherein the inverter comprises:
a third transistor of the first type, the third transistor having a third gate, a third drain, a third source, and a third body terminal; and
a fourth transistor of a second type different from the first type, the fourth transistor having a fourth gate, a fourth drain, a fourth source, and a fourth body terminal,
wherein each of the third gate, the fourth gate, and the input node are coupled together;
each of the third source, the third body terminal, the first node, the first source and the first body terminal are coupled together;
each of the fourth source, the fourth body terminal, the second node, and the first drain are coupled together; and
each of the third drain, the fourth drain, the first gate and the third node are coupled together.

15. The ESD circuit of claim 11, wherein the first ESD assist circuit comprises:
a third transistor of the first type, and having a third gate, a third drain, a third source, and a third body terminal, the third drain being coupled to the third node, the first gate and the first ESD detection circuit, and each of the first node, the first source, the first body terminal, the third gate, the third source and the third body terminal being coupled together.

16. The ESD circuit of claim 15, wherein the third transistor comprises:
a first active region in a substrate, the first active region corresponding to the third drain of the third transistor;
a second active region in the substrate, the second active region corresponding to the third source of the third transistor; and
a third active region in the substrate, the third active region corresponding to the third body terminal of the third transistor,
wherein the second active region and the third active region are coupled together, and the first active region and the third active region are configured as a body diode of the third transistor.

17. The ESD circuit of claim 11, wherein the first ESD assist circuit comprises:
a first bipolar junction transistor having a first base, a first collector and a first emitter, the first collector being coupled to the third node, the first gate and the first ESD detection circuit, and each of the first node, the first base, the first emitter, the first source, and the first body terminal being coupled together.

18. The ESD circuit of claim 11, wherein the first ESD assist circuit comprises:
a diode coupled between the first node and the third node, the diode having an anode coupled to the third node, the first gate and the first ESD detection circuit, and a cathode coupled to the first node, the first source and the first body terminal.

19. The ESD circuit of claim 11, wherein the second ESD detection circuit comprises:
a resistor coupled between the fourth node and an input node;
a capacitor coupled between the input node and the second node; and an inverter coupled to the second node, the fourth node, the fifth node, the input node, the second gate and the second ESD assist circuit.

20. A method of operating an electrostatic discharge (ESD) circuit, the method comprising:
   receiving a first ESD voltage on a first node, the first ESD voltage being greater than a reference supply voltage of a reference voltage supply, the first ESD voltage corresponding to a first ESD event;
   turning on a first ESD assist circuit in response to the first ESD event at the first node thereby causing the first ESD assist circuit to clamp a first voltage of a first gate of a first transistor of a first discharging circuit at a second voltage of a second node, the first discharging circuit being coupled between the first node and the second node, and the first ESD assist circuit being coupled between at least the first node and a third node, and the first ESD assist circuit including a first body diode;
   turning on the first discharging circuit in response to the first ESD event and the first ESD assist circuit clamping the first voltage of the first gate at the second voltage;
   discharging a first ESD current of the first ESD event in a first ESD direction from the first node to the second node by the first transistor;
   turning on a second ESD assist circuit in response to the first ESD current of the first ESD event at the second node thereby causing the second ESD assist circuit to clamp a third voltage of a second gate of a second transistor of a second discharging circuit at a fourth voltage of a fourth node, the second discharging circuit being coupled between the second node and the fourth node, and the second ESD assist circuit being coupled between at least the fourth node and a fifth node, and the second ESD assist circuit including a second body diode;
   turning on the second discharging circuit in response to the first ESD current at the second node and the second ESD assist circuit clamping the third voltage of the second gate at the fourth voltage; and
   discharging the first ESD current of the first ESD event in the first ESD direction from the second node to the fourth node by the second transistor.

* * * * *